United States Patent
Barnhart et al.

(10) Patent No.: US 9,447,994 B2
(45) Date of Patent: Sep. 20, 2016

(54) TEMPERATURE CONTROL SYSTEMS WITH THERMOELECTRIC DEVICES

(71) Applicant: Gentherm Incorporated, Northville, MI (US)

(72) Inventors: Todd Robert Barnhart, Bloomfield Hills, MI (US); Marco Ranalli, Augsburg (DE); Martin Adldinger, Holzheim (DE)

(73) Assignee: Gentherm Incorporated, Northville, MI (US)

( * ) Notice: Subject to any disclaimer, the term of this patent is extended or adjusted under 35 U.S.C. 154(b) by 0 days.

(21) Appl. No.: 13/802,050

(22) Filed: Mar. 13, 2013

(65) Prior Publication Data

US 2013/0192271 A1 Aug. 1, 2013

Related U.S. Application Data

(60) Provisional application No. 61/620,350, filed on Apr. 4, 2012.

(51) Int. Cl.
*F25B 21/02* (2006.01)
*F25B 21/04* (2006.01)
(Continued)

(52) U.S. Cl.
CPC ........... *F25B 21/04* (2013.01); *B60H 1/00478* (2013.01); *B60H 1/00885* (2013.01); *B60H 1/034* (2013.01); *B60H 1/03* (2013.01); *F24F 5/0042* (2013.01); *H01L 35/30* (2013.01)

(58) Field of Classification Search
CPC .. B60H 1/4478; B60H 1/03; B60H 1/00885; B60H 1/00478; B60H 1/034; H01L 35/30; F25B 21/04; F24F 5/0042

USPC .............................. 62/3.1–3.3, 3.6, 3.61, 6.7
See application file for complete search history.

(56) References Cited

U.S. PATENT DOCUMENTS

| | | |
|---|---|---|
| 413,136 A | 10/1889 | Dewey |
| 2,362,259 A | 11/1944 | Findley |

(Continued)

FOREIGN PATENT DOCUMENTS

| | | |
|---|---|---|
| CN | 1195090 | 10/1998 |
| CN | 1236429 A | 11/1999 |

(Continued)

OTHER PUBLICATIONS

Heckenberger, Thomas, "Li-on Battery Cooling," BEHR Power Point Presentation, Technical Press Day, Stuttgart, May 20, 2009, 13 pages.

(Continued)

*Primary Examiner* — Orlando Aviles Bosques
(74) *Attorney, Agent, or Firm* — Knobbe, Martens, Olson & Bear, LLP

(57) ABSTRACT

Temperature control systems and methods can be designed for controlling the interior climate of a vehicle or other the climate of another desired region. The temperature control system for a vehicle can have a thermoelectric system providing heating and/or cooling, including supplemental heating and/or cooling. The thermoelectric system can transfer thermal energy between a working fluid, such as liquid coolant, and comfort air upon application of electric current of a selected polarity. The thermoelectric system can supplement or replace the heat provided from an internal combustion engine or other primary heat source. The thermoelectric system can also supplement or replace cold energy provided from a compressor-based refrigeration system or other primary cold energy source.

28 Claims, 25 Drawing Sheets

(51) Int. Cl.
  *B60H 1/00* (2006.01)
  *H01L 35/30* (2006.01)
  *B60H 1/03* (2006.01)
  *F24F 5/00* (2006.01)

(56) References Cited

U.S. PATENT DOCUMENTS

| | | |
|---|---|---|
| 2,363,168 A | 11/1944 | Findley |
| 2,499,901 A | 3/1950 | Brown, Jr. |
| 2,944,404 A | 7/1960 | Fritts |
| 2,949,014 A | 8/1960 | Belton, Jr. et al. |
| 2,984,077 A | 5/1961 | Gaskill |
| 2,997,514 A | 8/1961 | Roeder, Jr. |
| 3,085,405 A | 4/1963 | Frantti |
| 3,125,860 A | 3/1964 | Reich |
| 3,136,577 A | 6/1964 | Richard |
| 3,137,142 A | 6/1964 | Venema |
| 3,138,934 A | 6/1964 | Roane |
| 3,196,620 A | 7/1965 | Elfving et al. |
| 3,212,275 A | 10/1965 | Tillman, Jr. |
| 3,213,630 A | 10/1965 | Mole |
| 3,236,056 A | 2/1966 | Phillips et al. |
| 3,252,504 A | 5/1966 | Newton |
| 3,391,727 A | 7/1968 | Armenag |
| 3,527,621 A | 9/1970 | Newton |
| 3,599,437 A | 8/1971 | Panas |
| 3,635,037 A | 1/1972 | Hubert |
| 3,681,929 A | 8/1972 | Schering |
| 3,779,307 A | 12/1973 | Weiss et al. |
| 3,817,043 A | 6/1974 | Zoleta |
| 3,885,126 A | 5/1975 | Sugiyama et al. |
| 4,038,831 A | 8/1977 | Gaudel et al. |
| 4,051,691 A | 10/1977 | Dawkins |
| 4,065,936 A | 1/1978 | Fenton et al. |
| 4,193,271 A * | 3/1980 | Honigsbaum ............... 62/180 |
| 4,280,330 A | 7/1981 | Harris et al. |
| 4,448,157 A | 5/1984 | Eckstein et al. |
| 4,494,380 A | 1/1985 | Cross |
| 4,531,379 A | 7/1985 | Diefenthaler, Jr. |
| 4,658,599 A * | 4/1987 | Kajiwara ..................... 62/239 |
| 4,665,707 A | 5/1987 | Hamilton |
| 4,665,971 A | 5/1987 | Sakurai |
| 4,707,995 A | 11/1987 | Assaf |
| 4,753,682 A | 6/1988 | Cantoni |
| 4,823,554 A | 4/1989 | Trachtenberg et al. |
| 4,848,090 A | 7/1989 | Peters |
| 4,858,069 A | 8/1989 | Hughes |
| 4,905,475 A | 3/1990 | Tuomi |
| 4,907,060 A | 3/1990 | Nelson et al. |
| 4,922,721 A | 5/1990 | Robertson et al. |
| 4,922,998 A | 5/1990 | Carr |
| 4,947,735 A | 8/1990 | Guillemin |
| 4,988,847 A | 1/1991 | Argos et al. |
| 5,029,446 A | 7/1991 | Suzuki |
| 5,038,569 A | 8/1991 | Shirota et al. |
| 5,042,566 A | 8/1991 | Hildebrand |
| 5,092,129 A | 3/1992 | Bayes et al. |
| 5,097,829 A | 3/1992 | Quisenberry |
| 5,111,664 A | 5/1992 | Yang |
| 5,119,640 A | 6/1992 | Conrad |
| 5,167,129 A | 12/1992 | Akasaka |
| 5,193,347 A | 3/1993 | Apisdorf |
| 5,198,930 A | 3/1993 | Muratomi |
| 5,232,516 A | 8/1993 | Hed |
| 5,269,146 A | 12/1993 | Kerner |
| 5,291,960 A | 3/1994 | Brandenburg et al. |
| 5,300,197 A | 4/1994 | Mitani et al. |
| 5,303,771 A | 4/1994 | Des Champs |
| 5,316,078 A | 5/1994 | Cesaroni |
| 5,385,020 A | 1/1995 | Gwilliam et al. |
| 5,386,823 A | 2/1995 | Chen |
| 5,407,130 A | 4/1995 | Uyeki et al. |
| 5,431,021 A | 7/1995 | Gwilliam et al. |
| 5,448,891 A | 9/1995 | Nakagiri et al. |
| 5,450,894 A | 9/1995 | Inoue et al. |
| 5,483,807 A | 1/1996 | Abersfelder et al. |
| 5,497,625 A | 3/1996 | Manz et al. |
| 5,499,504 A | 3/1996 | Mill et al. |
| 5,549,153 A | 8/1996 | Baruschke et al. |
| 5,576,512 A | 11/1996 | Doke |
| 5,592,363 A | 1/1997 | Atarashi et al. |
| 5,605,047 A | 2/1997 | Park et al. |
| 5,626,021 A | 5/1997 | Karunasiri et al. |
| 5,653,111 A | 8/1997 | Attey et al. |
| 5,673,964 A | 10/1997 | Roan et al. |
| 5,694,770 A | 12/1997 | Bruck et al. |
| 5,722,249 A | 3/1998 | Miller, Jr. |
| 5,725,048 A | 3/1998 | Burk et al. |
| 5,802,856 A | 9/1998 | Schaper et al. |
| 5,816,236 A | 10/1998 | Moroi et al. |
| 5,878,950 A | 3/1999 | Faccone et al. |
| 5,890,371 A | 4/1999 | Rajasubramanian et al. |
| 5,899,086 A | 5/1999 | Noda et al. |
| 5,901,572 A | 5/1999 | Peiffer et al. |
| RE36,242 E | 6/1999 | Apisdorf |
| 5,918,930 A | 7/1999 | Kawai et al. |
| 5,921,088 A | 7/1999 | Imaizumi et al. |
| 5,955,772 A | 9/1999 | Shakouri et al. |
| 5,964,092 A | 10/1999 | Tozuka et al. |
| 5,966,941 A | 10/1999 | Ghoshal |
| 5,975,856 A | 11/1999 | Welle |
| 5,977,785 A | 11/1999 | Burward-Hoy |
| 5,987,890 A | 11/1999 | Chiu et al. |
| 6,002,105 A | 12/1999 | Tamada |
| 6,050,326 A | 4/2000 | Evans |
| 6,059,198 A | 5/2000 | Moroi et al. |
| 6,082,445 A | 7/2000 | Dugan |
| 6,084,172 A | 7/2000 | Kishi et al. |
| 6,105,659 A | 8/2000 | Pocol et al. |
| 6,119,463 A | 9/2000 | Bell |
| 6,138,749 A | 10/2000 | Kawai et al. |
| 6,158,225 A | 12/2000 | Muto et al. |
| 6,205,802 B1 | 3/2001 | Drucker et al. |
| 6,205,805 B1 | 3/2001 | Takahashi et al. |
| 6,213,198 B1 | 4/2001 | Shikata et al. |
| 6,223,539 B1 | 5/2001 | Bell |
| 6,270,015 B1 | 8/2001 | Hirota |
| 6,282,907 B1 | 9/2001 | Ghoshal |
| 6,293,107 B1 | 9/2001 | Kitagawa |
| 6,324,860 B1 | 12/2001 | Maeda et al. |
| 6,334,311 B1 | 1/2002 | Kim et al. |
| 6,346,668 B1 | 2/2002 | McGrew |
| 6,347,521 B1 | 2/2002 | Kadotani et al. |
| 6,366,832 B2 | 4/2002 | Lomonaco et al. |
| 6,393,842 B2 | 5/2002 | Kim |
| 6,401,462 B1 | 6/2002 | Bielinski |
| 6,412,287 B1 | 7/2002 | Hughes et al. |
| 6,431,257 B1 | 8/2002 | Sano et al. |
| 6,438,964 B1 | 8/2002 | Giblin |
| 6,453,993 B1 | 9/2002 | Bujak, Jr. |
| 6,457,324 B2 | 10/2002 | Zeigler et al. |
| 6,464,027 B1 | 10/2002 | Dage et al. |
| 6,474,073 B1 | 11/2002 | Uetsuji et al. |
| 6,474,081 B1 | 11/2002 | Feuerecker |
| 6,481,213 B2 | 11/2002 | Carr et al. |
| 6,510,696 B2 | 1/2003 | Guttman et al. |
| 6,530,231 B1 | 3/2003 | Nagy et al. |
| 6,530,842 B1 | 3/2003 | Wells et al. |
| 6,530,920 B1 | 3/2003 | Whitcroft et al. |
| 6,539,725 B2 | 4/2003 | Bell |
| 6,539,729 B2 | 4/2003 | Tupis et al. |
| 6,560,968 B2 | 5/2003 | Ko |
| 6,569,550 B2 | 5/2003 | Khelifa |
| RE38,128 E | 6/2003 | Gallup et al. |
| 6,598,403 B1 | 7/2003 | Ghoshal |
| 6,606,877 B2 | 8/2003 | Tomita et al. |
| 6,607,142 B1 | 8/2003 | Boggs et al. |
| 6,640,889 B1 | 11/2003 | Harte et al. |
| 6,653,002 B1 | 11/2003 | Parise |
| 6,682,844 B2 | 1/2004 | Gene |
| 6,700,052 B2 | 3/2004 | Bell |
| 6,722,139 B2 | 4/2004 | Moon et al. |
| 6,732,534 B2 | 5/2004 | Spry |
| 6,779,348 B2 | 8/2004 | Taban |

(56) References Cited

U.S. PATENT DOCUMENTS

| | | | |
|---|---|---|---|
| 6,807,811 B2 | 10/2004 | Lee | |
| 6,862,892 B1 | 3/2005 | Meyer et al. | |
| 6,883,602 B2 | 4/2005 | Drucker | |
| 6,886,356 B2 | 5/2005 | Kubo et al. | |
| 6,896,047 B2 | 5/2005 | Currle et al. | |
| 6,907,739 B2 | 6/2005 | Bell | |
| 6,910,345 B2 | 6/2005 | Horstmann et al. | |
| 6,915,641 B2 | 7/2005 | Harvie | |
| 6,959,555 B2 | 11/2005 | Bell | |
| 6,962,195 B2 | 11/2005 | Smith et al. | |
| 6,973,799 B2 | 12/2005 | Kuehl et al. | |
| 6,986,247 B1 | 1/2006 | Parise | |
| 7,007,491 B2 | 3/2006 | Grimm et al. | |
| 7,074,122 B2 | 7/2006 | Haupt et al. | |
| 7,089,756 B2 | 8/2006 | Hu | |
| 7,134,288 B2 | 11/2006 | Crippen et al. | |
| 7,171,955 B2 | 2/2007 | Perkins | |
| 7,246,496 B2 | 7/2007 | Goenka et al. | |
| 7,272,936 B2 | 9/2007 | Feher | |
| 7,310,953 B2 | 12/2007 | Pham et al. | |
| 7,363,766 B2 | 4/2008 | Eisenhour | |
| 7,380,586 B2 | 6/2008 | Gawthrop | |
| 7,416,138 B2 | 8/2008 | Ellison et al. | |
| 7,426,835 B2 | 9/2008 | Bell | |
| 7,650,757 B2 | 1/2010 | Bhatti | |
| 7,743,614 B2 | 6/2010 | Goenka et al. | |
| 7,779,639 B2 | 8/2010 | Goenka | |
| 7,784,289 B2 | 8/2010 | Scherer et al. | |
| 7,788,933 B2 | 9/2010 | Goenka | |
| 7,870,892 B2 | 1/2011 | Gawthrop | |
| 7,905,278 B2 | 3/2011 | Sato et al. | |
| 7,926,293 B2 | 4/2011 | Bell | |
| 8,039,726 B2 | 10/2011 | Zhang et al. | |
| 8,069,674 B2 | 12/2011 | Bell | |
| 8,104,294 B2 | 1/2012 | Reeve | |
| 8,261,868 B2 | 9/2012 | Goenka et al. | |
| 8,359,871 B2 | 1/2013 | Woods et al. | |
| 8,408,012 B2 | 4/2013 | Goenka et al. | |
| 8,490,412 B2 | 7/2013 | Bell et al. | |
| 8,495,884 B2 | 7/2013 | Bell et al. | |
| 8,613,200 B2 | 12/2013 | LaGrandeur et al. | |
| 8,631,659 B2 | 1/2014 | Goenka | |
| 8,640,466 B2 | 2/2014 | Bell et al. | |
| 8,915,091 B2 | 12/2014 | Goenka | |
| 8,974,942 B2 | 3/2015 | Bell et al. | |
| 2002/0095943 A1 | 7/2002 | Hatakeyama et al. | |
| 2002/0173264 A1 | 11/2002 | Ottman et al. | |
| 2003/0140636 A1 | 7/2003 | Van Winkle | |
| 2003/0145605 A1 | 8/2003 | Moon et al. | |
| 2004/0025516 A1 | 2/2004 | Van Winkle | |
| 2004/0050076 A1 | 3/2004 | Palfy et al. | |
| 2004/0093889 A1 | 5/2004 | Bureau et al. | |
| 2004/0098991 A1 | 5/2004 | Heyes | |
| 2004/0237541 A1 | 12/2004 | Murphy | |
| 2005/0000473 A1 | 1/2005 | Ap et al. | |
| 2005/0011199 A1 | 1/2005 | Grisham et al. | |
| 2005/0061497 A1 | 3/2005 | Amaral | |
| 2005/0067862 A1 | 3/2005 | Iqbal et al. | |
| 2005/0139692 A1 | 6/2005 | Yamamoto | |
| 2005/0178128 A1 | 8/2005 | Harwood et al. | |
| 2005/0247446 A1* | 11/2005 | Gawthrop | 165/202 |
| 2005/0257531 A1 | 11/2005 | Kadle et al. | |
| 2005/0257545 A1 | 11/2005 | Ziehr et al. | |
| 2005/0268621 A1 | 12/2005 | Kadle et al. | |
| 2005/0278863 A1 | 12/2005 | Bahash et al. | |
| 2006/0005548 A1 | 1/2006 | Ruckstuhl | |
| 2006/0011152 A1 | 1/2006 | Hayes | |
| 2006/0059933 A1 | 3/2006 | Axakov et al. | |
| 2006/0075758 A1 | 4/2006 | Rice et al. | |
| 2006/0102335 A1 | 5/2006 | Fujiki et al. | |
| 2006/0124165 A1 | 6/2006 | Bierschenk et al. | |
| 2006/0130490 A1 | 6/2006 | Petrovski | |
| 2006/0137358 A1 | 6/2006 | Feher | |
| 2006/0150657 A1 | 7/2006 | Spurgeon et al. | |
| 2006/0174633 A1 | 8/2006 | Beckley | |
| 2006/0188418 A1 | 8/2006 | Park et al. | |
| 2006/0225441 A1* | 10/2006 | Goenka | B60H 1/00478 62/115 |
| 2006/0254284 A1 | 11/2006 | Ito et al. | |
| 2006/0254285 A1 | 11/2006 | Lin | |
| 2007/0000255 A1 | 1/2007 | Elliot et al. | |
| 2007/0017666 A1 | 1/2007 | Goenka et al. | |
| 2007/0056295 A1 | 3/2007 | De Vilbiss | |
| 2007/0214799 A1 | 9/2007 | Goenka | |
| 2007/0272290 A1 | 11/2007 | Sims et al. | |
| 2008/0017362 A1 | 1/2008 | Kwon et al. | |
| 2008/0028768 A1* | 2/2008 | Goenka | 62/3.2 |
| 2008/0307796 A1 | 12/2008 | Bell et al. | |
| 2009/0000310 A1 | 1/2009 | Bell et al. | |
| 2009/0118869 A1* | 5/2009 | Cauchy et al. | 62/3.2 |
| 2010/0052374 A1 | 3/2010 | Bell et al. | |
| 2010/0101238 A1 | 4/2010 | LaGrandeur et al. | |
| 2010/0101239 A1 | 4/2010 | LaGrandeur et al. | |
| 2010/0112419 A1 | 5/2010 | Jang et al. | |
| 2010/0155018 A1 | 6/2010 | Goenka et al. | |
| 2010/0287952 A1 | 11/2010 | Goenka | |
| 2010/0291414 A1 | 11/2010 | Bell et al. | |
| 2010/0313576 A1 | 12/2010 | Goenka | |
| 2011/0079023 A1 | 4/2011 | Goenka et al. | |
| 2011/0107773 A1 | 5/2011 | Gawthrop | |
| 2011/0236731 A1 | 9/2011 | Bell et al. | |
| 2012/0266608 A1 | 10/2012 | Kadle et al. | |
| 2013/0059190 A1 | 3/2013 | Kossakovski et al. | |
| 2013/0174579 A1 | 7/2013 | Goenka et al. | |
| 2013/0192253 A1 | 8/2013 | Ranalli et al. | |
| 2013/0317728 A1* | 11/2013 | Hall et al. | 701/113 |
| 2013/0327063 A1 | 12/2013 | Gawthrop | |
| 2014/0060086 A1 | 3/2014 | Ranalli et al. | |
| 2014/0325997 A1 | 11/2014 | Bell et al. | |
| 2015/0298524 A1 | 10/2015 | Goenka | |

FOREIGN PATENT DOCUMENTS

| | | |
|---|---|---|
| CN | 101508236 A | 8/2009 |
| DE | 13 01 454 | 8/1969 |
| DE | 2319155 | 10/1974 |
| DE | 43 29 816 | 3/1994 |
| DE | 42 38 364 | 5/1994 |
| DE | 197 30 678 | 1/1999 |
| DE | 198 29 440 A1 | 1/2000 |
| DE | 199 51 224 | 5/2001 |
| DE | 20 105 487 | 10/2001 |
| DE | 10 2009 003 737 | 10/2010 |
| EP | 0 389 407 | 9/1990 |
| EP | 0 545 021 | 6/1993 |
| EP | 0 791 497 | 8/1997 |
| EP | 0 834 421 | 4/1998 |
| EP | 1 038 701 | 9/2000 |
| EP | 1641067 A1 | 3/2006 |
| EP | 1 932 695 A1 | 6/2008 |
| FR | 2806666 | 9/2001 |
| GB | 231 192 A | 5/1926 |
| GB | 1 040 485 | 8/1966 |
| GB | 2 267 338 | 12/1993 |
| GB | 2 333 352 | 7/1999 |
| JP | 39-27735 | 12/1964 |
| JP | 56-18231 | 2/1981 |
| JP | 01 131830 A | 5/1989 |
| JP | 01 200122 | 8/1989 |
| JP | 01 281344 | 11/1989 |
| JP | 04 103925 | 4/1992 |
| JP | 4-165234 | 6/1992 |
| JP | 05-37521 | 5/1993 |
| JP | 05-037521 U | 5/1993 |
| JP | 05-037621 U | 5/1993 |
| JP | 6-024235 | 2/1994 |
| JP | 06-135218 | 5/1994 |
| JP | 07-089334 | 4/1995 |
| JP | 07-54189 | 6/1995 |
| JP | 07-253224 | 10/1995 |
| JP | 08-316388 | 11/1996 |
| JP | 09042801 | 2/1997 |
| JP | 09-092761 | 4/1997 |
| JP | 09-254630 | 9/1997 |

(56) References Cited

FOREIGN PATENT DOCUMENTS

| | | |
|---|---|---|
| JP | 9-276076 | 10/1997 |
| JP | 10035268 | 2/1998 |
| JP | 11-042933 | 2/1999 |
| JP | 11-301254 | 11/1999 |
| JP | 11-342731 | 12/1999 |
| JP | 2000 130883 A1 | 5/2000 |
| JP | 2000-161721 | 6/2000 |
| JP | 2000-185542 | 7/2000 |
| JP | 2000-274788 | 10/2000 |
| JP | 2000-274871 | 10/2000 |
| JP | 2000-274874 | 10/2000 |
| JP | 2000-318434 | 11/2000 |
| JP | 2000-335230 | 12/2000 |
| JP | 2002-13758 | 1/2002 |
| JP | 2002059736 A | 2/2002 |
| JP | 2003-237357 | 8/2003 |
| JP | 2004 050874 | 2/2004 |
| JP | 2005 212564 | 8/2005 |
| JP | 2005-302851 | 10/2005 |
| JP | 2006-001530 | 1/2006 |
| JP | 2006 015965 | 1/2006 |
| JP | 2006-015965 | 1/2006 |
| JP | 2007-161110 | 6/2007 |
| JP | 2008-094366 | 4/2008 |
| KR | 2001 111646 | 12/2001 |
| KR | 10-2002-0057600 | 6/2007 |
| KR | 2008-0008875 | 1/2008 |
| KR | 10-2011-0013876 | 2/2011 |
| LU | 66619 | 2/1973 |
| SE | 337 227 | 5/1971 |
| SU | 184886 A | 7/1966 |
| SU | 1196627 A | 12/1985 |
| WO | WO 94/20801 | 9/1994 |
| WO | WO 95/01500 | 1/1995 |
| WO | WO 95/14899 | 6/1995 |
| WO | WO 96/05475 | 2/1996 |
| WO | WO 97/47930 | 12/1997 |
| WO | WO 99/09360 | 2/1999 |
| WO | WO 99/10191 | 3/1999 |
| WO | WO 99/58907 | 11/1999 |
| WO | WO 02/00458 | 1/2002 |
| WO | WO 03/014634 | 2/2003 |
| WO | WO 2005/023571 | 3/2005 |
| WO | WO 2005/063567 | 7/2005 |
| WO | WO 2006/037178 | 4/2006 |
| WO | WO 2006/064432 | 6/2006 |
| WO | WO 2007/001289 | 1/2007 |
| WO | WO 2007/021273 | 2/2007 |
| WO | WO 2008/147305 | 4/2008 |
| WO | WO 2008/091293 | 7/2008 |
| WO | WO 2008/123663 | 10/2008 |
| WO | WO 2008/147305 | 12/2008 |
| WO | WO 2008/148042 | 12/2008 |
| WO | WO 2010/048575 | 4/2010 |
| WO | WO 2013/009759 | 1/2013 |

OTHER PUBLICATIONS

International Search Report and Written Opinion for application No. PCT/US2013/034690, mailed Jul. 2, 2013.
Lofy, John et al., "Thermoelectrics for Environmental Control in Automobiles," 21st International Conference on Thermoelectronics, 2002, p. 471-476.
Stockholm, John G.: "Large-Scale Cooling: Integrated Thermoelectric Element Technology," CRC Handbook of Thermoelectrics, Chapter 53, pp. 657-666. 0-8493-0146, Jul. 1995.
Japanese Office Action re JP Patent Application No. 2006-305938, dated Jul. 21, 2009.

* cited by examiner

| MODE | WORKING | | | | FLUID ELECTRIC POWER | | | | COMFORT AIR |
|---|---|---|---|---|---|---|---|---|---|
| | F1 | F2 | F3 | F4 | E1 | E2 | E3 | E4 | F5 |
| HEAT/DEMIST | AUX RAD | ← | PWR TRAIN COOL | ← | COOLING POLARITY | | HEATING POLARITY | | WARMING DRYING |
| HEATING | PWR TRAIN COOL | ← | ← | ← | BOTH CIRCUITS IN HEAT MODE POLARITY | | | | WARMING |
| COOLING | AUX RAD | ← | ← | ← | BOTH CIRCUITS IN COOLING MODE POLARITY | | | | COOLING |

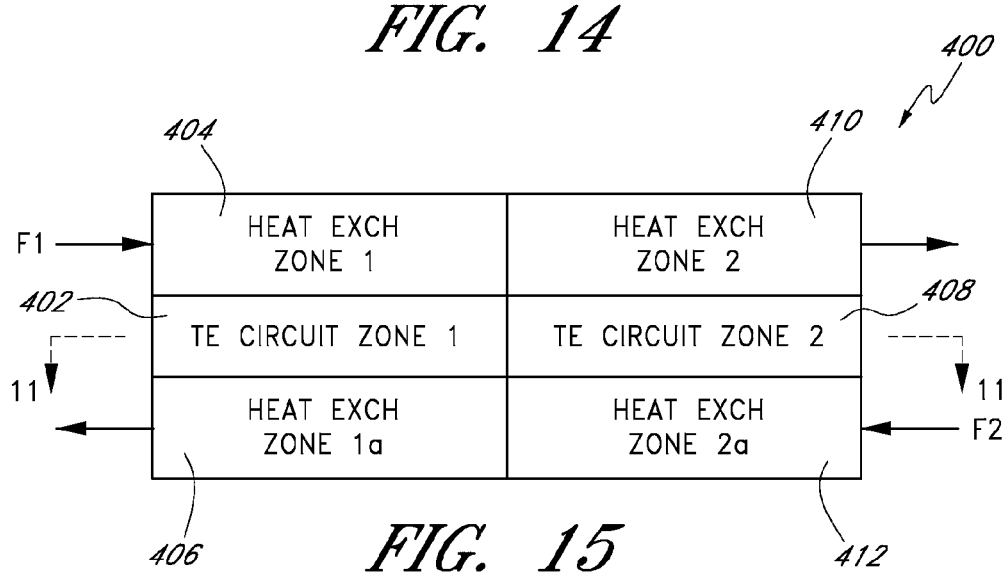
*FIG. 14*
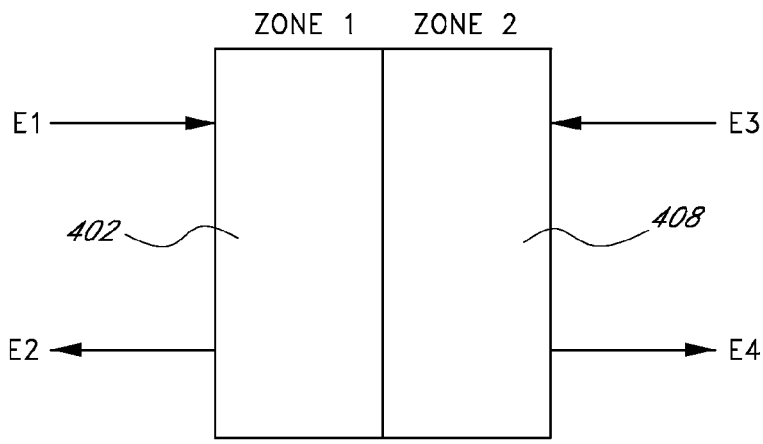
*FIG. 15*
*FIG. 16*

TEMPERATURE CONTROL SYSTEMS WITH THERMOELECTRIC DEVICES

INCORPORATION BY REFERENCE TO ANY PRIORITY APPLICATIONS

Any and all applications for which a foreign or domestic priority claim is identified in the Application Data Sheet as filed with the present application, are incorporated by reference and made a part of this specification.

BACKGROUND

1. Field

This disclosure relates to the field of temperature control and to temperature control systems and methods incorporating a thermoelectric device.

2. Description of Related Art

A passenger compartment of a vehicle is typically heated and cooled by a heating, ventilating, and air conditioning (HVAC) system. The HVAC system directs a flow of comfort air through a heat exchanger to heat or cool the comfort air prior to flowing into the passenger compartment. In the heat exchanger, energy is transferred between the comfort air and a coolant such as a water-glycol coolant, for example. The comfort air can be supplied from ambient air or a mixture of air re-circulated from the passenger compartment and ambient air. Energy for heating and cooling of the passenger compartment of the vehicle is typically supplied from a fuel-fed engine such as an internal combustion engine, for example.

Some automotive HVAC architectures include a positive thermal coefficient of resistance (PTC) heater device that provides supplemental heating of air flowing to the passenger compartment. Existing automotive PTC device HVAC architectures suffer from various drawbacks.

SUMMARY

Embodiments described herein have several features, no single one of which is solely responsible for their desirable attributes. Without limiting the scope of the inventions as expressed by the claims, some of the advantageous features will now be discussed briefly.

Certain disclosed embodiments include systems and methods for controlling the interior climate of a vehicle or other the climate of another desired region. Some embodiments provide a temperature control system for a vehicle in which a thermoelectric system provides supplemental heating and/or cooling. The thermoelectric system can transfer thermal energy between a working fluid, such as liquid coolant, and comfort air upon application of electric current of a selected polarity. In certain embodiments, the thermoelectric system supplements or replaces the heat provided from an internal combustion engine or other primary heat source. The thermoelectric system can also supplement or replace cold energy provided from a compressor-based refrigeration system or other primary cold energy source.

Certain disclosed embodiments include systems and methods for stopped engine or engine off cooling. The engine off cooling mode can be used to maintain a comfortable cabin for a limited amount of time during an idle engine shutdown. In this mode, the evaporator is non-operative as the engine has been shut down. The cooling provided by the thermal inertia in the coolant and the thermoelectric module can allow the engine to shut down and save fuel, while still allowing the passenger cabin to be cooled.

Certain disclosed embodiments include systems and methods for stopped engine or engine off heating. The engine off heating mode can be used to maintain a comfortable cabin temperature for a limited amount of time during an idle engine shutdown. The heat provided by the thermoelectric module, the thermal inertia in the coolant, and the thermal inertia in the engine block allows the system to heat the cabin of the vehicle while allowing the engine to shut down and save fuel.

Disclosed embodiments include systems for heating and cooling the interior climate of a vehicle. In some embodiments, a system for controlling temperature in a passenger compartment of a vehicle includes a main fluid channel and one or more thermoelectric devices operatively connected to the main fluid channel. The thermoelectric devices can include at least one thermoelectric element configured to heat a fluid flowing in the main fluid channel upon application of electrical energy in a first polarity and to cool the fluid upon application of electrical energy in a second polarity. The thermoelectric devices can be subdivided into a plurality of thermal zones. The plurality of thermal zones can include a first thermal zone connected to a first electric circuit switchable between the first polarity and the second polarity and a second thermal zone connected to a second electric circuit switchable between the first polarity and the second polarity independent of the polarity of the first electric circuit.

The system can include a first heat exchanger disposed in the main fluid channel and thermally connected to one or more thermoelectric devices. As an example, the main fluid channel can be connected to a single thermoelectric device in which a first main surface in the first thermal zone of the thermoelectric device and a second heat exchanger disposed in the main fluid channel and thermally connected to a second main surface in the second thermal zone of the thermoelectric device. The system can include a working fluid channel; a third heat exchanger disposed in the working fluid channel and thermally connected to a first waste surface in the first thermal zone of the thermoelectric device; and a fourth heat exchanger disposed in the working fluid channel and thermally connected to a second waste surface in the second thermal zone of the thermoelectric device. The thermoelectric device can be configured to transfer thermal energy between the first main surface and the first waste surface in the first thermal zone and to transfer thermal energy between the second main surface and the second waste surface in the second thermal zone.

The system can include a controller configured to operate the system in one of a plurality of available modes by controlling the polarity of the first electric circuit and the polarity of the second electric circuit. The plurality of available modes can include a demisting mode, a heating mode, and a cooling mode. The controller can be configured to operate the first electric circuit in the second polarity and the second electric circuit in the first polarity of one or more thermoelectric devices independently when at least one thermoelectric device is operating in the demisting mode.

The system can include a first working fluid circuit thermally connected to a first waste surface in the first thermal zone of one or more of the thermoelectric devices and a second working fluid circuit independent from the first working fluid circuit, the second working fluid circuit thermally connected to a second waste surface in the second thermal zone of one or more of the thermoelectric devices. Each of the first working fluid circuit and the second working fluid circuit can be selectively connected between either one or more thermoelectric devices and a heat sink or one or more thermoelectric devices and a heat source. The first working fluid circuit can be connected to a heat source when the first electric circuit is switched to the first polarity and can be connected to a heat sink when the first electric circuit is switched to the second polarity. The second working fluid circuit can be connected to the heat source when the second electric circuit is switched to the first polarity and can be connected to a heat sink when the second electric circuit is switched to the second polarity. The system can include a controller configured to operate the system in a demisting mode by switching the first electric circuit to the second polarity and switching the second electric circuit to the first polarity.

In certain embodiments, a method of delivering temperature controlled air to a passenger compartment of a vehicle using an HVAC system includes operating the system in one of a plurality of available modes to provide an airflow to the passenger compartment. The plurality of available modes can include a demisting mode, a heating mode, and a cooling mode separately operable in one or more zones within the vehicle. The method can include delivering air to at least a portion of the passenger compartment during the demisting mode of operation by directing an airflow into a main fluid channel; cooling the airflow in the main fluid channel by removing thermal energy from the airflow in a first thermal zone of a thermoelectric device; and subsequently heating the airflow by adding thermal energy to the airflow in a second thermal zone of the thermoelectric device. The method can include delivering a heated airflow to at least a portion of the passenger compartment during the heating mode of operation by directing an airflow into a main fluid channel; and heating the airflow in the main fluid channel by adding thermal energy to the airflow in the first thermal zone and in the second thermal zone of the thermoelectric device. The method can include delivering a cooled airflow to at least a portion of the passenger compartment during the cooling mode of operation by directing an airflow into a main fluid channel and cooling the airflow in the main fluid channel by removing thermal energy from the airflow in the first thermal zone and in the second thermal zone of the thermoelectric device.

Delivering air can include removing thermal energy from the first thermal zone of at least one of the thermoelectric devices by circulating a first working fluid between the first thermal zone and a heat sink and adding thermal energy to the second thermal zone of the thermoelectric device by circulating a second working fluid between the second thermal zone and a heat source. Each of the first working fluid and the second working fluid can comprise a liquid heat transfer fluid. For example, the first working fluid can comprise an aqueous solution, and the second working fluid can comprise the same aqueous solution but at a different temperature.

Delivering a heated airflow further can include providing electrical energy having a first polarity to the first thermal zone of a thermoelectric device and providing electrical energy having the same polarity to the second thermal zone of the thermoelectric device. The electrical energy provided to the thermoelectric device can cause thermal energy to be transferred from at least one working fluid to the airflow via the thermoelectric device.

In some embodiments, a method of manufacturing a system for conditioning passenger air in a vehicle includes providing an air flow channel; operatively connecting one or more a thermoelectric devices to the air flow channel; providing at least one working fluid channel in thermal communication with at least one waste surface of one or more thermoelectric devices; and connecting a first electric circuit to a first thermal zone of the thermoelectric devices. The first electric circuit can be configured to selectively supply electrical power to the first thermal zone in a first polarity or in a second polarity. The method can include connecting a second electric circuit to a second thermal zone of a thermoelectric device. The second electric circuit can be configured to selectively supply electrical power to the second thermal zone in the first polarity or in the second polarity.

The method can include providing a controller configured to control the system at least in part by selecting the polarity of the first electric circuit and the polarity of the second electric circuit in one or more thermoelectric devices.

The method can include configuring the at least one working fluid channel to selectively move thermal energy between at least one thermoelectric device and a heat source or a heat sink.

Operatively connecting a thermoelectric device to the air flow channel can include disposing a first heat exchanger in the air flow channel; disposing a second heat exchanger in the air flow channel; connecting the first thermal zone of the thermoelectric device to the first heat exchanger; and connecting the second thermal zone of the thermoelectric device to the second heat exchanger. Connecting the first thermal zone of the thermoelectric device to the first heat exchanger can include connecting a main surface in the first thermal zone to the first heat exchanger, the main surface being opposite a waste surface in the first thermal zone.

In certain embodiments, a system for controlling temperature in at least a portion of the passenger compartment of a vehicle includes a first fluid channel; a second fluid channel at least partially separated from the first fluid channel by a partition; a cooling apparatus operatively connected to cool air in the first fluid channel or operatively spanning both the first fluid channel and the second fluid channel; a heater core operatively connected to heat air in the second fluid channel; a thermoelectric device operatively connected to the second fluid channel downstream from the heater core or operatively connected to the first fluid channel downstream of the cooling apparatus; and a flow diversion channel disposed between the first fluid channel and the second fluid channel or flow control valves disposed in the first fluid channel and the second fluid channel. The flow diversion channel can be configured to selectively divert air that the cooling apparatus has cooled in the first fluid channel to the second fluid channel such that the air flows past at least one of the heater core and the thermoelectric device after passing through the flow diversion channel. A controller can be configured to operate at least one such system in at least a cooling mode, a heating mode, and a demisting mode. The controller can cause the flow diversion channel to divert air from the first fluid channel to the second fluid channel during the demisting mode.

The flow diversion channel can include a diversion blend door, a flow diversion element, and/or flow control valves configured to rotate between at least an open position and a closed position. Air can be diverted from the first fluid channel to the second fluid channel when the diversion blend door or the flow diversion element is in the open position. Air can be permitted to flow without diversion through the first fluid channel when the diversion blend door or the flow diversion element is in the closed position. Similar diversion of air can be achieved by selectively opening the flow control valves disposed in the first fluid channel and the second fluid channel.

The system can include an inlet channel selection apparatus configured to direct at least a portion of the air entering the system to at least one of the first fluid channel and the second fluid channel. The inlet channel selection apparatus can be configured to direct an airflow into the second fluid channel, and the thermoelectric device can be configured to transfer thermal energy to the airflow, during the heating mode of operation. The inlet channel selection apparatus can include an inlet blend door. The inlet blend door can be operable to move between a first position, a second position, and all positions in between the first and second positions. The position of the inlet blend door can be independent of the position of the diversion blend door.

At least one cooling apparatus can absorb thermal energy from an airflow, and the thermoelectric device can transfer thermal energy to the airflow during the demisting mode of operation. At least one cooling apparatus can be configured to absorb thermal energy from the airflow, and the thermoelectric device can be configured to absorb thermal energy from the airflow during the cooling mode of operation.

The flow diversion channel can include an aperture formed in the partition or a flow diversion element. The aperture or the flow diversion element can be configured to be selectively blocked.

One or more thermoelectric devices can be subdivided into a plurality of thermal zones, the plurality of thermal zones including a first thermal zone configured to heat a fluid flowing in the second fluid channel upon application of electrical energy in a first polarity and to cool the fluid upon application of electrical energy in a second polarity and a second thermal zone switchable between the first polarity and the second polarity independent of the polarity of the electrical energy applied to the first thermal zone.

One or more heater cores can be in thermal communication with power train coolant during at least the heating mode. In some embodiments, heater cores are not in thermal communication with power train coolant during at least the cooling mode.

At least one surface of one or more thermoelectric devices can be connected to a heat exchanger in thermal communication with the airflow. The cooling apparatus can also be connected to one or more heat exchangers in thermal communication with the airflow.

In certain embodiments, a method of delivering temperature controlled air to a passenger compartment of a vehicle using an HVAC system includes operating at least a portion of the system in one of a plurality of available modes to provide an airflow to at least a portion of the passenger compartment. The plurality of available modes can include demisting modes, heating modes, and cooling modes. The method can include delivering air to the passenger compartment during the demisting mode of operation by directing the airflow into at least a first fluid flow channel; cooling the airflow in the first fluid flow channel with a cooling apparatus; subsequently diverting the airflow from the first fluid flow channel to a second fluid flow channel; and subsequently heating the airflow in the second fluid flow channel with a heater core, with a thermoelectric device, or with both the heater core and the thermoelectric device. The method can include delivering a heated airflow to at least a portion of the passenger compartment during the heating mode of operation by directing the airflow into at least the second fluid flow channel; and heating the airflow in the second fluid flow channel with a heater core, with a thermoelectric device, or with both the heater core and the thermoelectric device. The method can include delivering a cooled airflow to at least a portion of the passenger compartment during the cooling mode of operation by directing the airflow into at least one of the first fluid flow channel and the second fluid flow channel and cooling the airflow by cooling the airflow in the first fluid flow channel with the cooling apparatus, cooling the airflow in the second fluid flow channel with the thermoelectric device, or cooling the airflow in the first fluid flow channel with the cooling apparatus while cooling the airflow in the second fluid flow channel with the thermoelectric device.

Delivering the air during the cooling mode can include determining whether a first amount of energy to be provided to the thermoelectric device to cool the airflow to a desired temperature using the thermoelectric device is less than a second amount of energy to be provided to the cooling apparatus to cool the airflow to the desired temperature using the cooling apparatus and cooling the airflow in the second fluid flow channel with the thermoelectric device when it is determined that the first amount of energy is less than the second amount of energy.

Delivering a heated airflow can include determining whether the heater core is able to heat the airflow to a desired temperature; heating the airflow in the second fluid flow channel with the heater core when it is determined that the heater core is able to heat the airflow to the desired temperature; and heating the airflow in the second fluid flow channel with a thermoelectric device when it is determined that the heater core is not able to heat the airflow to the desired temperature.

In some embodiments, a method of manufacturing an apparatus for conditioning passenger air in at least a portion of a vehicle includes providing an air flow channel divided at least partially into a first air conduit and a second air conduit; operatively connecting a cooling apparatus to the first air conduit or operatively connecting a cooling apparatus to both the first air conduit and the second air conduit; operatively connecting a heater core to the second air conduit; operatively connecting at least one thermoelectric device to the second air conduit such that the thermoelectric device is downstream from the heater core when air flows through the channel or operatively connecting at least one thermoelectric device to the first air conduit such that the thermoelectric device is downstream from the cooling apparatus when air flows through the channel; and providing a fluid diversion channel between the first air conduit and the second air conduit such that the fluid diversion channel is positioned downstream from the cooling apparatus and upstream from the heater core when air flows through the channel or such that the fluid diversion channel is positioned downstream from the cooling apparatus, the heater core, and thermoelectric device when air flows through the channel, or providing flow control valves in the first air conduit and the second air conduit downstream of the cooling apparatus when air flows through the channel. The fluid diversion channel can be configured to selectively divert air from the first air conduit to the second air conduit. Similar diversion of air can be achieved by selectively opening the flow control valves disposed in the first air conduit and the second air conduit.

Operatively connecting a cooling apparatus can include disposing a heat exchanger in the first fluid channel and connecting the heat exchanger to the cooling apparatus. Operatively connecting a heater core can include disposing a heat exchanger in the second fluid channel and connecting the heat exchanger to the heater core. Operatively connecting a thermoelectric device can include disposing a heat exchanger in the second fluid channel and connecting the heat exchanger to the thermoelectric device.

The method can include providing a channel selection apparatus, wherein the channel selection apparatus is disposed near the inlet of the first air conduit and the second air conduit.

Certain disclosed embodiments pertain to controlling temperature in a passenger compartment of a vehicle. For example, a temperature control system (TCS) can include an air channel configured to deliver airflow to the passenger compartment of the vehicle. The TCS can include a one thermal energy source, a heat transfer device and a thermoelectric device TED connected to the air channel. A fluid circuit can circulate coolant to the thermal energy source, the heat transfer device, and/or the TED. A bypass circuit can connect the thermal energy source to the heat transfer device, bypassing the TED. An actuator can cause coolant to circulate selectively in either the bypass circuit or a fluid circuit with TED. A control device can operate the actuator when it is determined that the thermal energy source is ready to provide heat to the airflow.

Some embodiments provide a system for controlling temperature in a passenger compartment of a vehicle, the system including at least one passenger air channel configured to deliver a passenger airflow to the passenger compartment of the vehicle, at least one thermal energy source, at least one heat transfer device connected to the passenger air channel, at least one thermoelectric device (TED), a fluid circuit configured to circulate coolant to the thermal energy source, the heat transfer device, and/or the TED, at least one bypass circuit configured to connect the thermal energy source to the heat transfer device, at least one actuator configured to cause coolant to circulate in the bypass circuit instead of the fluid circuit, and at least one control system. The control system can include a second bypass circuit configured to connect the thermal energy source to the TED, at least one actuator configured to cause coolant to circulate in the second bypass circuit instead of the fluid circuit, and at least one control system. The control system may be configured to operate the at least one actuator when it is determined that the thermal energy source is ready to provide heat to the passenger airflow, thereby causing coolant to circulate in the at least one bypass circuit instead of in fluid circuit.

Additional embodiments may include a pump configured to circulate coolant in fluid circuits. The system may also include an evaporator operatively connected to the passenger air channel. The thermal energy source may be a vehicle engine, a heater core supplied with thermal energy from a vehicle engine, an exhaust system, another suitable heat source, or a combination of sources. Another embodiment may include a blend door operatively connected in the passenger air channel and configured to route the passenger airflow across the heat transfer device. In some embodiments the actuator may be a fluid control device, a valve, a regulator, or a combination of structures.

Further embodiments may include a cooling fluid circuit configured to connect the TED to a low temperature core. The low temperature core may be a radiator configured to dissipate heat from a fluid to ambient air. The cooling fluid circuit may also include a pump to provide adequate movement of fluid. The control system may also be further configured to determine whether the system is operating in a heating mode or a cooling mode; and operate at least one actuator to cause coolant to circulate in the cooling fluid circuit when it is determined that the system is operating in the cooling mode.

In some embodiments the thermal energy source is ready to provide heat to the passenger airflow when the thermal energy source reaches a threshold temperature. The controller may also determine the thermal energy source is ready to provide heat to the passenger airflow when the coolant circulating through the thermal energy source reaches a threshold temperature.

Some embodiments provide a method of controlling temperature in a passenger compartment of a vehicle, the method including moving a passenger airflow across a heat transfer device operatively connected within a passenger air channel of the vehicle; operating a temperature control system of the vehicle in a first mode of operation, in which a thermoelectric device (TED) transfers thermal energy between a fluid circuit, which can include a thermal energy source and a heat transfer device; and switching the temperature control system to a second mode of operation after the temperature control system has been operated in the first mode of operation. In the second mode of operation, the temperature control system opens a bypass circuit in thermal communication with the heat transfer device and the thermal energy source. The bypass circuit is configured to transfer thermal energy between the heat transfer device and the thermal energy source without the use of the TED.

In other embodiments the temperature control system switches to a second mode when the thermal energy source has reached a threshold temperature. The thermal energy source may be an automobile engine. The temperature control system may switch to a second mode based on other criterion, such as, when the temperature of the fluid within the fluid circuit reaches a threshold temperature, when a specified amount of time has elapsed, when the temperature of the passenger airflow reaches a threshold temperature, or any other specified condition or combination of conditions.

Certain embodiments provide a method of manufacturing an apparatus for controlling temperature in a passenger compartment of a vehicle, the method including providing at least one passenger air channel configured to deliver a passenger airflow to the passenger compartment of the vehicle, operatively connecting at least one heat transfer device to the passenger air channel, providing at least one thermal energy source, providing at least one thermoelectric device (TED), operatively connecting a fluid circuit to the thermal energy source, heat transfer device, and/or the TED, wherein the fluid circuit is configured to circulate coolant, operatively connecting the TED and/or the heat transfer device to the fluid circuit, operatively connecting at least one bypass circuit to the thermal energy source to the heat transfer device, wherein the at least one bypass circuit is configured to circulate coolant, providing at least one actuator configured to cause coolant to circulate in the bypass circuit instead of the fluid circuit, operatively connecting a second bypass circuit to the thermal energy source to the TED, wherein the second bypass circuit is configured to circulate coolant, providing at least one actuator configured to cause coolant to circulate in the second bypass circuit instead of the fluid circuit, and providing at least one control device configured to operate the at least one actuator when it is determined that the thermal energy source is ready to provide heat to the passenger airflow.

In some embodiments the passenger air channel may include a first air channel and a second air channel. The second air channel can be at least partially in a parallel arrangement with respect to the first air channel. The passenger air channel may also include a blend door configured to selectively divert airflow through the first air channel and the second air channel. The heat transfer device may be disposed in only the second air channel.

In other embodiments an evaporator may be operatively connected to the passenger air channel. Some embodiments may also include a low temperature core. A cooling fluid circuit may be operatively connected to the low temperature core and the TED. The cooling fluid circuit can be configured to circulate coolant.

In accordance with embodiments disclosed herein, a temperature control system for heating, cooling, and/or demisting an occupant compartment of a vehicle during startup of an internal combustion engine of the vehicle is provided. The system comprises an engine coolant circuit comprising an engine block coolant conduit configured to convey coolant therein. The engine block conduit is in thermal communication with the internal combustion engine of the vehicle. The system further comprises a heater core disposed in a comfort air channel of the vehicle and in fluid communication with the engine block coolant conduit. The system further comprises a thermoelectric device having a waste surface and a main surface. The waste surface is in thermal communication with a heat source or a heat sink. The system further comprises a supplemental heat exchanger disposed in the comfort air channel and in thermal communication with the main surface of the thermoelectric device. The supplemental heat exchanger is downstream from the heater core with respect to a direction of comfort airflow in the comfort air channel when the temperature control system is in operation. The system further comprises a controller configured to operate the temperature control system in a plurality of modes of operation. The plurality of modes of operation comprises a startup heating mode wherein the thermoelectric device is configured to heat the comfort airflow by transferring thermal energy from the waste surface to the main surface while receiving electric current supplied in a first polarity and while the internal combustion engine is running. The plurality of modes of operation further comprises a heating mode wherein the internal combustion engine is configured to heat the comfort airflow while electric current is not supplied to the thermoelectric device and while the internal combustion engine is running. In the startup heating mode, the thermoelectric device provides heat to the comfort airflow while the internal combustion engine is not able to heat the comfort airflow to a specified comfortable temperature without the heat provided by the thermoelectric device. A coefficient of performance of the thermoelectric device increases during the startup heating mode as a temperature of the coolant increases.

In some embodiments, the temperature control system, in the startup heating mode, is configured to heat the occupant compartment of the vehicle to a certain cabin temperature faster than heating the passenger cabin to the certain cabin temperature in the heating mode when the internal combustion engine is started with an operating temperature at an ambient temperature; the startup heating mode includes the internal combustion engine configured to heat the comfort airflow while the thermoelectric device receives electric current supplied in the first polarity; the plurality of modes of operation further comprises a supplemental cooling mode; the thermoelectric device is configured to cool the comfort airflow by transferring thermal energy from the main surface to the waste surface while receiving electric current supplied in a second polarity; the plurality of modes of operation further comprises a startup demisting mode; the evaporator core is configured to cool the comfort airflow and the thermoelectric device is configured to heat the comfort airflow by transferring thermal energy from the waste surface to the main surface while receiving electric current supplied in the first polarity; the startup demisting mode includes the internal combustion engine configured to heat the comfort airflow while the thermoelectric device receives electric current supplied in the first polarity; the plurality of modes of operation further comprises a demisting mode; the evaporator core is configured to cool the comfort airflow while electric current is not supplied to the thermoelectric device; the supplemental heat exchanger is downstream of evaporator core in the comfort air channel; the system further comprises a thermal storage device disposed in the comfort air channel, the thermal storage device configured to store thermal energy and at least one of transfer thermal energy to the airflow or absorb thermal energy from the airflow; the system further comprises an evaporator core of a belt driven refrigeration system disposed in the comfort air channel; the thermal storage device is connected to the evaporator core; the thermal storage device is configured to store cooling capacity during at least one of a cooling mode or a demisting mode; the thermoelectric device is disposed in the comfort air channel; the waste surface of the thermoelectric device is in thermal communication with the engine block coolant conduit; the heat source is at least one of a battery, an electronic device, a burner, or an exhaust of the vehicle; the system further comprises a waste heat exchanger connected to the waste surface of the thermoelectric device; the waste heat exchanger is connected to a fluid circuit containing a liquid phase working fluid; the liquid phase working fluid is in fluid communication with the heat source or the heat sink; the fluid circuit includes a first conduit and a first bypass conduit configured to convey coolant therein, the first conduit in fluid communication with the heater core, the first bypass conduit configured to bypass flow of the coolant around the first conduit; the startup heating mode includes restricting flow of the coolant through the first conduit and directing flow of the coolant through the first bypass conduit; the fluid circuit includes a second conduit and a second bypass conduit configured to convey coolant therein, the second conduit in fluid communication with the supplemental heat exchanger, the second bypass conduit configured to bypass flow of the coolant around the second conduit; and/or the heating mode includes restricting flow of the coolant through the second conduit and directing flow of the coolant through the second bypass conduit.

In accordance with embodiments disclosed herein, a method for controlling temperature of an occupant compartment of a vehicle during startup of an internal combustion engine of the vehicle is provided. The method comprises directing an airflow through a comfort air channel. The method further comprises directing a coolant through an engine coolant circuit, the engine coolant circuit including an engine block coolant conduit in thermal communication with the internal combustion engine of the vehicle. The method further comprises directing the airflow through a heater core disposed in the comfort air channel and in thermal communication with the engine block coolant conduit. The method further comprises directing the airflow through a supplemental heat exchanger in thermal communication with a thermoelectric device. The supplemental heat exchanger is downstream from the heater core with respect to a direction of comfort airflow in the comfort air channel while the airflow is flowing. The thermoelectric device has a waste surface and a main surface, the waste surface in thermal communication with the engine block coolant conduit or a heat sink, the main surface in thermal communication with the supplemental heat exchanger. The method further comprises supplying, in a startup heating mode, electric current in a first polarity to the thermoelectric device for the thermoelectric device to heat the comfort air by transferring thermal energy from the waste surface to the main surface. In the startup heating mode, the thermoelectric device provides heat to the comfort airflow while the internal combustion engine is not able to heat the comfort airflow to a specified comfortable temperature without the heat provided by the thermoelectric device.

In some embodiments, the method further comprises restricting, in a heating mode, electric current to the thermoelectric device; the internal combustion engine is configured to heat the comfort airflow; the temperature control system, in the startup heating mode, is configured to heat the occupant compartment of the vehicle to a certain cabin temperature faster than heating the passenger cabin to the certain cabin temperature in the heating mode when the internal combustion engine is started with an operating temperature at an ambient temperature; the method further comprises directing the airflow through an evaporator core of a belt driven refrigeration system disposed in the comfort air channel; the method further comprises supplying, in a supplemental cooling mode, electric current to the thermoelectric device in a second polarity for the thermoelectric device to cool the comfort airflow by transferring thermal energy from the main surface to the waste surface; the method further comprises restricting flow of the coolant through the engine block coolant conduit to inhibit thermal communication between the waste heat transfer surface of the thermoelectric device and the internal combustion engine; the method further comprises supplying, in a startup demisting mode, electric current to the thermoelectric device in the first polarity for the thermoelectric device to heat the comfort air by transferring thermal energy from the waste surface to the main surface while the evaporator cools the comfort air; the supplemental heat exchanger is downstream from the evaporator core with respect to the direction of comfort airflow in the comfort air channel; a waste heat exchanger is connected to the waste surface of the thermoelectric device; the waste heat exchanger is connected to a fluid circuit containing a liquid phase working fluid; and/or the liquid phase working fluid is in fluid communication with the engine block coolant conduit or the heat sink.

In accordance with embodiments disclosed herein, a temperature control system for heating, cooling, and/or demisting an occupant compartment of a vehicle during a stop of an internal combustion engine of the vehicle is provided. The system comprises an engine coolant circuit comprising an engine block coolant conduit configured to convey coolant therein. The engine block conduit is in thermal communication with the internal combustion engine of the vehicle. They system further comprises a heater core disposed in a comfort air channel of the vehicle and in fluid communication with the engine block coolant conduit. The system further comprises a thermoelectric device having a waste surface and a main surface. The system further comprises a supplemental heat exchanger disposed in the comfort air channel and in thermal communication with the main surface of the thermoelectric device. The system further comprises a waste heat exchanger connected to the waste surface of the thermoelectric device. The waste heat exchanger is connected to a fluid circuit containing a liquid phase working fluid. The liquid phase working fluid is in fluid communication with a heat source or a heat sink. The system further comprises a controller configured to operate the temperature control system in a plurality of modes of operation. The plurality of modes of operation comprises a stop heating mode wherein residual heat of the internal combustion engine is configured to heat the comfort airflow while electric current is not supplied to the thermoelectric device and while the internal combustion engine is stopped. The plurality of modes of operation further comprises a stop cold heating mode wherein the thermoelectric device is configured to heat the comfort airflow by transferring thermal energy from the waste surface to the main surface while receiving electric current supplied in a first polarity and while the internal combustion engine is stopped. In the stop cold heating mode, the thermoelectric device provides heat to the comfort airflow while the internal combustion engine is not able to heat the comfort airflow to a specified comfortable temperature without the heat provided by the thermoelectric device.

In some embodiments, the temperature control system, in the stop cold heating mode, is configured to allow for a longer stop time of the internal combustion engine than stopping the internal combustion engine in the stop heating mode while heating the occupant compartment of the vehicle a certain cabin temperature; the stop cold heating mode includes the internal combustion engine configured to heat the comfort airflow while the thermoelectric device receives electric current supplied in the first polarity; the plurality of modes of operation further comprises a supplemental cooling mode; the thermoelectric device is configured to cool the comfort airflow by transferring thermal energy from the main surface to the waste surface while receiving electric current supplied in a second polarity; the system further comprises a thermal storage device disposed in the comfort air channel, the thermal storage device configured to store thermal energy and at least one of transfer thermal energy to the airflow or absorb thermal energy from the airflow; the system further comprises an evaporator core of a belt driven refrigeration system disposed in the comfort air channel; the thermal storage device is connected to the evaporator core; the thermal storage device is configured to store cooling capacity during at least one of a cooling mode or a demisting mode while the internal combustion engine is in operation; the plurality of modes of operation further comprises a first stop demisting mode; the thermal storage device is configured to cool the comfort airflow by absorbing thermal energy from the airflow using stored cooling capacity and the thermoelectric device is configured to heat the comfort airflow by transferring thermal energy from the waste surface to the main surface while receiving electric current supplied in the first polarity; the supplemental heat exchanger is downstream from the heater core with respect to a direction of comfort airflow in the comfort air channel when the temperature control system is in operation; the waste surface of the thermoelectric device is in thermal communication with the engine block coolant conduit; the heat source is at least one of a battery, an electronic device, a burner, or an exhaust of the vehicle; the fluid circuit includes a first conduit and a first bypass conduit configured to convey coolant therein, the first conduit in fluid communication with the heater core, the first bypass conduit configured to bypass flow of the coolant around the first conduit; the stop cold heating mode includes restricting flow of the coolant through the first conduit and directing flow of the coolant through the first bypass conduit; the fluid circuit includes a second conduit and a second bypass conduit configured to convey coolant therein, the second conduit in fluid communication with the supplemental heat exchanger, the second bypass conduit configured to bypass flow of the coolant around the second conduit; the stop heating mode includes restricting flow of the coolant through the second conduit and directing flow of the coolant through the second bypass conduit; the plurality of modes of operation further comprises a second stop demisting mode; the thermoelectric device is configured to cool the comfort airflow by transferring thermal energy from the main surface to the waste surface while receiving electric current supplied in a second polarity and the internal combustion engine is configured to heat the comfort airflow while the internal combustion engine is able to heat the comfort airflow to a specified comfortable temperature; and/or the supplemental heat exchanger is upstream from the heater core with respect to a direction of comfort airflow in the comfort air channel when the temperature control system is in operation.

In accordance with embodiments disclosed herein, a method for controlling temperature of an occupant compartment of a vehicle during a stop of an internal combustion engine of the vehicle is provided. The method comprises directing an airflow through a comfort air channel. The method further comprises directing a coolant through an engine coolant circuit, the engine coolant circuit including an engine block coolant conduit in thermal communication with the internal combustion engine of the vehicle. The method further comprises directing the airflow through a heater core disposed in the comfort air channel and in thermal communication with the engine block coolant conduit. The method further comprises directing the airflow through a supplemental heat exchanger in thermal communication with a thermoelectric device. The thermoelectric device has a main surface and a waste surface, the main surface in thermal communication with the supplemental heat exchanger, the waste surface connected to a waste heat exchanger. The waste heat exchanger is connected to a fluid circuit containing a liquid phase working fluid. The liquid phase working fluid is in fluid communication with the engine block coolant conduit or a heat sink. The method further comprises supplying, in a stop cold heating mode, electric current in a first polarity to the thermoelectric device for the thermoelectric device to heat the comfort air by transferring thermal energy from the waste surface to the main surface while the internal combustion engine is stopped. In the stop cold heating mode, the thermoelectric device provides heat to the comfort airflow while the internal combustion engine is not able to heat the comfort airflow to a specified comfortable temperature without the heat provided by the thermoelectric device.

In some embodiments, the supplemental heat exchanger is downstream from the heater core with respect to a direction of comfort airflow in the comfort air channel while the airflow is flowing; the method further comprises restricting, in a stop heating mode, electric current to the thermoelectric device; the internal combustion engine is configured to heat the comfort airflow; the temperature control system, in the stop cold heating mode, is configured to allow for a longer stop time of the internal combustion engine than stopping the internal combustion engine in the stop heating mode while heating the occupant compartment of the vehicle a certain cabin temperature; the method further comprises supplying, in a supplemental cooling mode, electric current to the thermoelectric device in a second polarity for the thermoelectric device to cool the comfort airflow by transferring thermal energy from the main surface to the waste surface; the method further comprises restricting flow of the coolant through the engine block coolant conduit to inhibit thermal communication between the waste heat transfer surface of the thermoelectric device and the internal combustion engine; the method further comprises supplying, in a stop demisting mode, electric current to the thermoelectric device in a second polarity for the thermoelectric device to cool the comfort air by transferring thermal energy from the main surface to the waste surface and the internal combustion engine is configured to heat the comfort airflow while the internal combustion engine is able to heat the comfort airflow to a specified comfortable temperature; and/or the supplemental heat exchanger is upstream from the heater core with respect to a direction of comfort airflow in the comfort air channel while the airflow is flowing.

BRIEF DESCRIPTION OF THE DRAWINGS

The following drawings and the associated descriptions are provided to illustrate embodiments of the present disclosure and do not limit the scope of the claims.

FIG. 14 is a chart related to the power configuration of an example embodiment of a bithermal thermoelectric device.

FIG. 15 is a schematic illustration of an example embodiment of a temperature control system incorporating a bithermal thermoelectric device.

FIG. 16 is a schematic illustration of an example embodiment of a bithermal thermoelectric circuit.

DETAILED DESCRIPTION

Figure 1A:
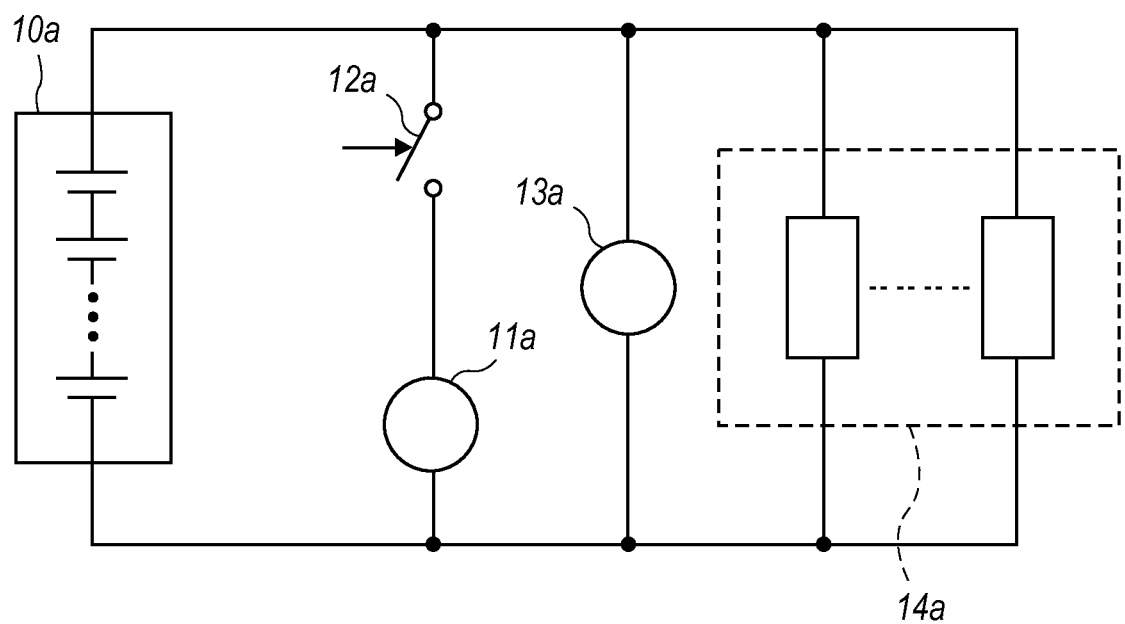
FIG. 1A illustrates a schematic architecture of an example embodiment of a micro-hybrid system.

Although certain preferred embodiments and examples are disclosed herein, inventive subject matter extends beyond the specifically disclosed embodiments to other alternative embodiments and/or uses of the inventions, and to modifications and equivalents thereof. Thus, the scope of the inventions herein disclosed is not limited by any of the particular embodiments described below. For example, in any method or process disclosed herein, the acts or operations of the method or process may be performed in any suitable sequence and are not necessarily limited to any particular disclosed sequence.

For purposes of contrasting various embodiments with the prior art, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein. While some of the embodiments are discussed in the context of particular fluid circuit and valve configurations, particular temperature control, and/or fluid circuit configurations, it is understood that the inventions may be used with other system configurations. Further, the inventions are limited to use with vehicles, but may be advantageously used in other environments where temperature control is desired.

As used herein, the term "coolant" is used in its broad and ordinary sense and includes, for example, fluids that transfer thermal energy within a heating or cooling system. As used herein, the term "heat transfer device" is used in its broad and ordinary sense and includes, for example, a heat exchanger, a heat transfer surface, a heat transfer structure, another suitable apparatus for transferring thermal energy between media, or any combination of such devices. As used herein, the terms "thermal energy source" and "heat source" are used in their broad and ordinary sense and include, for example, a vehicle engine, a burner, an electronic component, a heating element, a battery or battery pack, an exhaust system component, a device that converts energy into thermal energy, or any combination of such devices. In some circumstances, the terms "thermal energy source" and "heat source" can refer to a negative thermal energy source, such as, for example, a chiller, an evaporator, another cooling component, a combination of components, and so forth.

As used herein, the terms "sufficient" and "sufficiently," are used broadly in accordance with their ordinary meanings. For example, in the context of sufficient heating or sufficient heat transfer involving comfort air, these terms broadly encompass, without limitation, a condition in which a passenger airflow (or airstream) is heated to a temperature that is comfortable to a passenger (e.g., when the airflow is forced into the passenger compartment via one or more vents) or a condition in which the passenger airflow is heated to a threshold temperature.

As used herein, the term "ready," is used broadly in accordance with its ordinary meaning. For example, in the context of a heat source being ready to provide heat, the term broadly encompasses, without limitation, a condition in which one or more criteria for determining when the heat source can sufficiently heat the passenger airflow are met. For example, a heat source can sufficiently heat the passenger airflow when a heater core can transfer enough thermal energy to the airflow for it to be comfortable when directed at or in the vicinity of a vehicle occupant. The airflow may be comfortable when it is about room temperature, equal to or somewhat higher than room temperature, greater than room temperature, or greater than or equal to a suitable threshold temperature. A suitable threshold temperature can be about 70° F., about 72° F., about 75° F., room temperature, a temperature that depends on the ambient temperature, or another temperature. A suitable threshold temperature (or a specified comfortable temperature) can be greater than or equal to about 60° F., about 65° F., about 70° F., or room temperature. A suitable threshold temperature (or a specified comfortable temperature) can be about 10° F., about 20° F., about 30° F., or about 40° F. above ambient temperature. In some embodiments, the heat source is ready to heat a passenger cabin when the heat source can heat the airflow such that the passenger cabin does not receive a cold blast of air. In some embodiments, the heat source is ready to heat the passenger cabin when the heat source is sufficiently warm (or hot) to raise the coolant temperature for heating the airflow to a comfortable and/or room temperature as discussed herein.

As used herein, the term "passenger air channel" is broadly used in its ordinary sense. For example, a passenger air channel encompasses components through which comfort air can flow, including ducts, pipes, vents, ports, connectors, an HVAC system, other suitable structures or combination of structures.

As used herein, the term "thermoelectric device" is used broadly in accordance with its ordinary meaning. For example, the term broadly encompasses any device that incorporates thermoelectric material and is used to transfer thermal energy against the thermal gradient upon application of electrical energy or to produce an electrical output based on a temperature differential across the thermoelectric material. A thermoelectric device may be integrated or used in conjunction with other temperature control elements, such as a heater core, an evaporator, an electrical heating element, a thermal storage device, a heat exchanger, another structure, or a combination of structures.

As used herein, the term "actuator" is used broadly in accordance with its ordinary meaning. For example, the term broadly encompasses fluid control devices, such as valves, regulators, and other suitable structures or combination of structures used to the control the flow of fluids.

As used herein, the term "control device" is used broadly in accordance with its ordinary meaning. For example, the term broadly encompasses a device or system that is configured to control fluid movement, electrical energy transfer, thermal energy transfer, and/or data communications among one or more. The control device may include a single controller that controls one or more components of the system, or it may include more than one controller controlling various components of the system.

The temperature of a vehicle passenger compartment is typically controlled using a heating, ventilating, and air conditioning (HVAC) system, which can also be called a comfort air system or temperature control system. When the system is used for heating, a vehicle engine or another suitable device can be a heat source. Thermal energy can be transferred from the heat source to a heat exchanger (such as, for example, a heater core) via a coolant circuit or other fluid circuit. The heat exchanger can transfer the thermal energy to an airflow that crosses the heat exchanger before entering the passenger compartment of the vehicle. In some configurations, the engine or heater core of a vehicle can take a substantial amount of time, such as several minutes, to reach a temperature at which the heater core is able to sufficiently heat air directed into the vehicle passenger compartment. For example, in certain types of vehicles, such as plug-in hybrids, the engine may not even turn on until the vehicle has been driven a substantial distance, such as 50 miles. When the heater core has reached a temperature at which it can transfer sufficient thermal energy to the passenger compartment airflow for it to be comfortable, it can be said that the heater core and/or engine is "ready" to heat the airflow.

Cooling can be achieved using a compressor-based refrigeration system (including various components, such as an evaporator) to cool the airflow entering the passenger compartment. The vehicle engine can provide energy to power the components of a cooling system (e.g., via a mechanical or electrical linkage). Many components of a cooling system are often separate from the components of a heating system. For example, a cooling system typically is connected to the passenger compartment airflow using a heat exchanger separate from the heater core.

Some HVAC systems provide a demisting function, in which humidity is removed from air during a heating mode to remove fogging and/or prevent condensate formation on a windscreen. In some systems, the demisting function is achieved by forcing air first through an evaporator to lower the air temperature below the dew point, thus condensing and removing moisture. The evaporator can, for example, be cooled by a two-phase vapor compression cycle. After passing through the evaporator, the air can be forced through a heater to achieve a suitable temperature for passenger comfort.

FIG. 1A illustrates an embodiment of a micro-hybrid/mild-hybrid system, including a start-stop system (or stop and go system) for a vehicle. A micro-hybrid system can increase fuel efficiency of the vehicle and reduce pollution. Unlike "pure" hybrid motor vehicles, micro-hybrid motor vehicles have an internal combustion engine, but not necessarily an electric motor, for driving the vehicle. The internal combustion engine can be stopped at chosen states of vehicle operations (temporarily stopped), such as for example, while the vehicle is stopped at a stoplight. In some embodiments, the vehicle can function in stop and go mode using a reversible electric machine, or starter-alternator, coupled to an internal combustion engine supplied by an AC/DC converter in "starter" mode.

In some implementations, using a starter-alternator in the stop and go mode can consist of causing the internal combustion engine to stop completely when the vehicle itself is stopped, then restarting the internal combustion engine subsequent, for example, to an action of the driver which is interpreted as a restart command. A typical stop and go situation is that of stopping at a red light. When the vehicle stops at the light, the engine is automatically stopped, then when the light turns green, the engine is restarted using the starter-alternator following detection by the system of the clutch pedal being depressed by the driver or of any other action which is interpreted as meaning that the driver intends to restart the vehicle. Under certain predetermined conditions, the engine can be turned off before the vehicle is stopped. For example, when a predetermined condition indicates that the vehicle is coming to a complete stop, is coasting under a certain velocity, and/or is coasting down a hill, the transmission can be shifted into neutral and the engine can be stopped while the vehicle continues on its trajectory.

Motor vehicles with an internal combustion engines can have an on-board electrical system to supply power to an electric starter for the internal combustion engine and other electrical apparatuses of the motor vehicle. During start of the internal combustion engine, a starter battery $10a$ can supply power to a starter $11a$, which starts the internal combustion engine (for example, when the switch $12a$ is closed by a corresponding starter signal from a controller). The starter battery $10a$ can be a conventional 12 V (or 14 V) vehicle battery connected to a 12 V (or 14 V) electrical system. In some embodiments, the voltage of the battery and corresponding electrical system can be higher, such as for example, up to 18 V, up to 24 V, up to 36 V, up to 48 V, and up to 50V. In some embodiments, the battery $10a$ can be a high-capacity battery. When the internal combustion engine is started, the internal combustion engine can drive an electrical generator $13a$ ("alternator") which then generates a voltage of approximately 14 V and makes the voltage available to the various electrical consumers $14a$ in the motor vehicle through the on-board electrical system. In the process, the electrical generator $13a$ can also recharge the starter battery $10a$.

In some embodiments, micro-hybrid vehicles can have multiple voltage electrical systems. For example, the vehicle can have a low voltage system for powering electrical consumer $14a$ (e.g., conventional electronics) of the vehicle. Continuing with the example, the vehicle can also have a high voltage system to provide power to the starter $11a$. In some embodiments, the low voltage system of the vehicle also can power the starter $11a$.

In some embodiments, the starter $11a$ can have adequate power to initially accelerate the vehicle from a stop while starting the internal combustion engine. For example, when a driver depresses the gas pedal of the vehicle for acceleration after the internal combustion has been stopped, the starter can provide adequate toque to accelerate the vehicle from the stop until the internal combustion starts and takes over accelerating and propelling the vehicle forward.

Figure 1B:
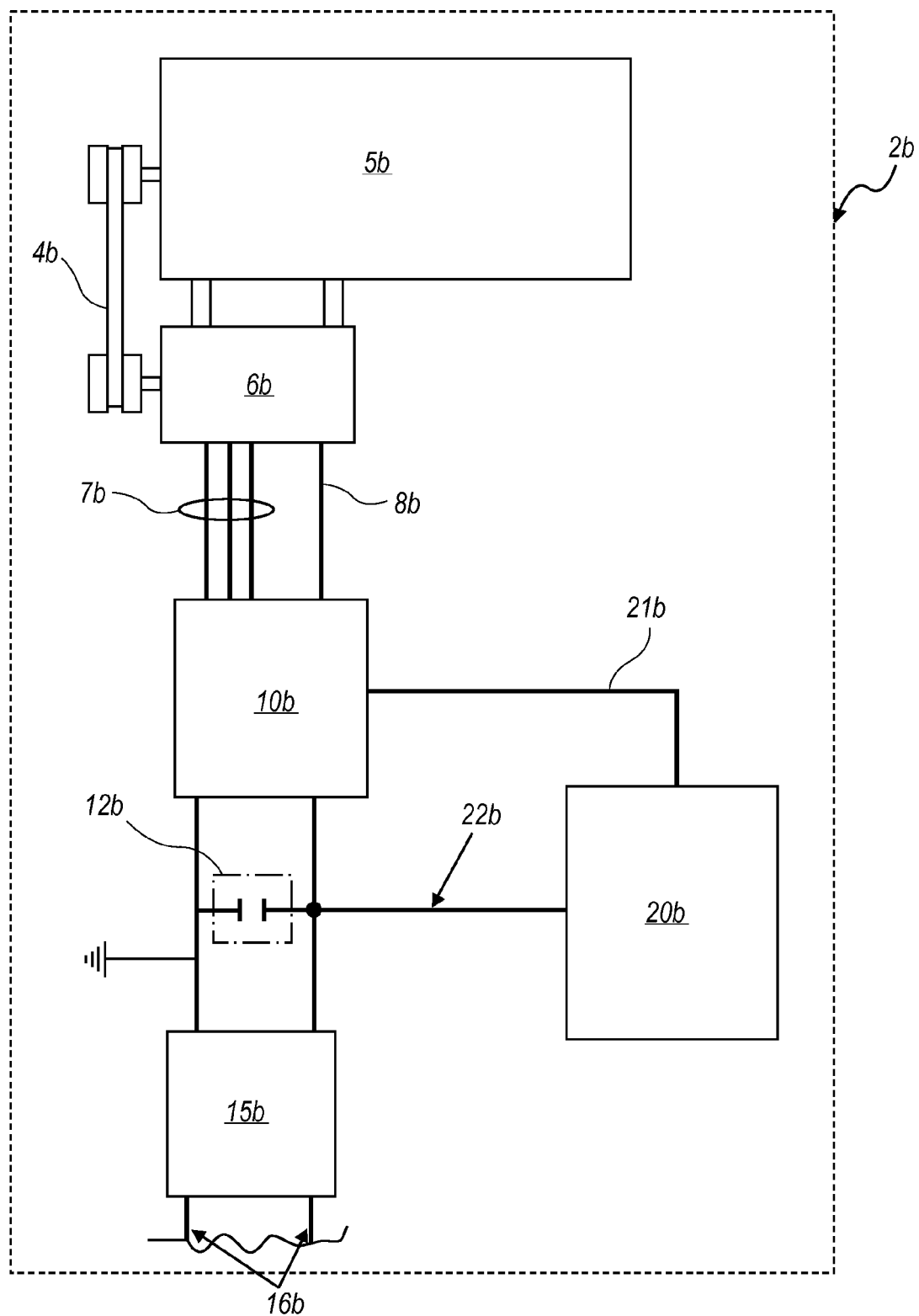
FIG. 1B illustrates a schematic architecture of an example embodiment of a micro-hybrid system.

FIG. 1B illustrates an embodiment of a micro-hybrid/mild-hybrid system, including a start-stop system (or stop and go system) for a vehicle with a capacitor. A micro-hybrid vehicle 2b can have an internal combustion engine 5b to provide tractive effort for the micro-hybrid vehicle 2b via a transmission. An integrated starter-generator 6b is driveably connected to one end of a crankshaft of the engine 5b by means of a drive belt 4b. It will be appreciated that other means of driveably connecting the integrated starter-generator 6b to the engine 5b could be used. In some embodiments, the starter motor and generator can be separate.

In an embodiment, the integrated starter-generator 6b is a multi-phase alternating current device and is connected via a multi-phase cable 7b to an inverter 10b. A control lead 8b is used to transfer data bi-directionally between the integrated starter-generator 6b and the inverter 10b and supplies in this case a signal indicative of the rotational speed of the integrated starter-generator 6b which can be used to calculate the rotational speed of the engine 5b. Alternatively, the engine speed could be measured directly using a crankshaft sensor or another sensing device.

A capacitor pack 12b can be connected to the direct current side of the inverter 10b. In an embodiment, the capacitor pack 12b contains ten 2.7 volt capacitors (electric double-layer capacitors which can be referred to as cells) and so has a nominal terminal voltage of 27 volts. It will be appreciated that more or less capacitors could be used in the capacitor pack and that the voltage of each of the capacitors forming the pack could be more than or less than 2.7 volts. In some embodiments, a high-capacity battery, a high-voltage battery, and/or conventional battery can be substituted for or work simultaneously with the capacitor pack 12b.

The capacitor pack 12b can be connected to a DC/DC voltage converter 15b. The DC/DC converter is connected to a 12 volt supply via supply leads 16. The 12 volt supply can include a conventional electrochemical battery and is used to power electrical devices mounted on the micro-hybrid vehicle 2b. The integrated starter-generator 6b can be electrically connected to recharge the capacitor. A regenerative braking system can be electrically connected recharge the capacitor. In some embodiments, the vehicle can have other kinetic or thermal energy recovery systems to recharge the capacitor (and/or batteries). The DC/DC converter can be also used to recharge the capacitor pack 12b from the 12 volt supply if, for example, the micro-hybrid vehicle 2b has not been operated for several weeks and the charge in the capacitor pack 12b has leaked away below a predetermined level required for successful starting. The DC/DC converter provides a voltage of more than 12 volts for performing this recharging function. Alternatively, a conventional starter, which is connected to the 12V supply, could be used.

A capacitor controller 20b can be operatively connected to the inverter 10b by a control line 21b to control the flow of electricity between the inverter 10b and the capacitor pack 12b. The capacitor controller 20b continuously receives through a voltage sensor line 22b a signal from the capacitor pack 12b indicative of the terminal voltage of the capacitor pack 12b and a signal via the control line 21b indicative of engine speed. It will be appreciated that the capacitor controller 20b could be formed as part of the inverter 10b or another electrical controller such as a powertrain controller.

In some embodiments, similar stop-start concepts can be applied to hybrid vehicles and/or plug-in hybrid vehicles. Throughout the disclosure, "hybrid" applies to both hybrid and plug-in hybrid vehicles unless noted otherwise. Hybrid vehicles can be driven by both an internal combustion engine and an electric motor. Temperature control systems discussed herein can employ a thermoelectric device for hybrid vehicles to provide the same features and comforts as conventional vehicles while achieving longer engine stop times to increase fuel efficiency. In order to achieve maximum efficiency, hybrid vehicles employ a start/stop strategy, meaning the vehicle's internal combustion engine shuts down to conserve energy during normal idle conditions. During this period, it is still important to maintain thermal comfort inside the passenger compartment of the vehicle. In order to keep the cabin comfortable during cold weather climates, coolant can be circulated through the heater core and/or a thermoelectric device as discussed herein to provide cabin heat. In warm weather climates, some vehicles employ an electric compressor for keeping the cabin cool without running the internal combustion engine to drive a conventional belt driven compressor of an air conditioning system. However, an electric compressor can be inefficient and undesirable in certain situations. In some embodiments, the temperature control systems discussed herein can be supplement or replace the electric compressor while providing cooling.

Automotive HVAC architectures (conventional vehicles, micro-hybrid vehicles, and/or hybrid vehicles) can include one or more thermoelectric devices (TED) to supplement or replace one or more portions of a heating and cooling system for the passenger compartment. In some embodiments, micro-hybrid and/or hybrid vehicles can implement an electric pump (e.g., water pump) to provide working fluid circulation, either replacing a conventional belt driven pump or substituting the conventional belt driven pump while the engine is off. By supplying electrical energy to a thermoelectric device, thermal energy can be transferred to or from passenger airflow via one or more fluid circuits and/or heat exchangers. As a standalone heater, a thermoelectric device can remain energized even after the compartment and engine have reached a desired temperature. In a system using such a configuration, the energy applied to the thermoelectric device once the vehicle engine reaches a temperature sufficient to heat the passenger compartment may be wasted because waste heat from the engine may be sufficient to heat the passenger compartment. However, adding thermoelectric devices to a heating and cooling system typically has a large impact on the HVAC system design, and designs can include two or more heat exchangers. Therefore, a need exists for an improved temperature control system that is able to heat and/or cool a passenger compartment quickly and efficiently without requiring additional heat exchangers or large numbers of other components not used in a typical HVAC system design. A system would be advantageous if TEDs could selectively boost heating or cooling power provided by other subsystems, and allow the HVAC system to rely on the evaporator core to dehumidify air when demisting is desired.

Some embodiments include a system architecture that provides an optimum arrangement of subsystems that permit one or more thermoelectric devices to provide dual-mode functionality or multi-mode functionality in a single device. Modes that are implemented by certain embodiments can include, for example, a heating mode, a cooling mode, a demisting mode, a start-up heating mode, a steady-state heating mode, a start-up demisting mode, a steady-state demisting mode, stop cold heating mode, stop cooled heating mode, stop warm heating mode, other useful modes, or a combination of modes. Some embodiments have a system architecture that provides optimized TE HVAC systems in order to overcome issues related to placement of TEDs in series with the evaporator and heater cores. In some embodiments, a first and second fluid conduit is utilized in conjunction with one or more blend doors in order to optimize the position of the subsystems in the comfort air stream.

In some embodiments, TEDs can be configured to supplement the heating and cooling of a passenger compartment. In an example configuration, an engine and a thermoelectric device can transfer heat to one or more heat exchangers that connect to passenger airflow. However, adding thermoelectric devices to a heating and cooling system typically has a large impact on the HVAC system design, and designs can include two or more heat exchangers. Therefore, a need exists for an improved temperature control system that is able to heat and/or cool a passenger compartment quickly and efficiently without requiring additional heat exchangers or large numbers of other components not used in a typical HVAC system design. A system would be advantageous if it could selectively provide heating from an engine and/or thermoelectric device, while also being able to provide cooling from the thermoelectric device, through a common heat exchanger connected to passenger airflow.

HVAC system with a TED can provide a demisting function, in which humidity is removed from air during a heating mode to remove fogging and/or prevent condensate formation on a windscreen. In some systems, the demisting function is achieved by forcing air first through an evaporator to lower the air temperature below the dew point, thus condensing and removing moisture. The evaporator can, for example, be cooled by a two-phase vapor compression cycle. After passing through the evaporator, the air can be forced through a heater (i.e., the TED) to achieve a suitable temperature for passenger comfort.

Figure 2:
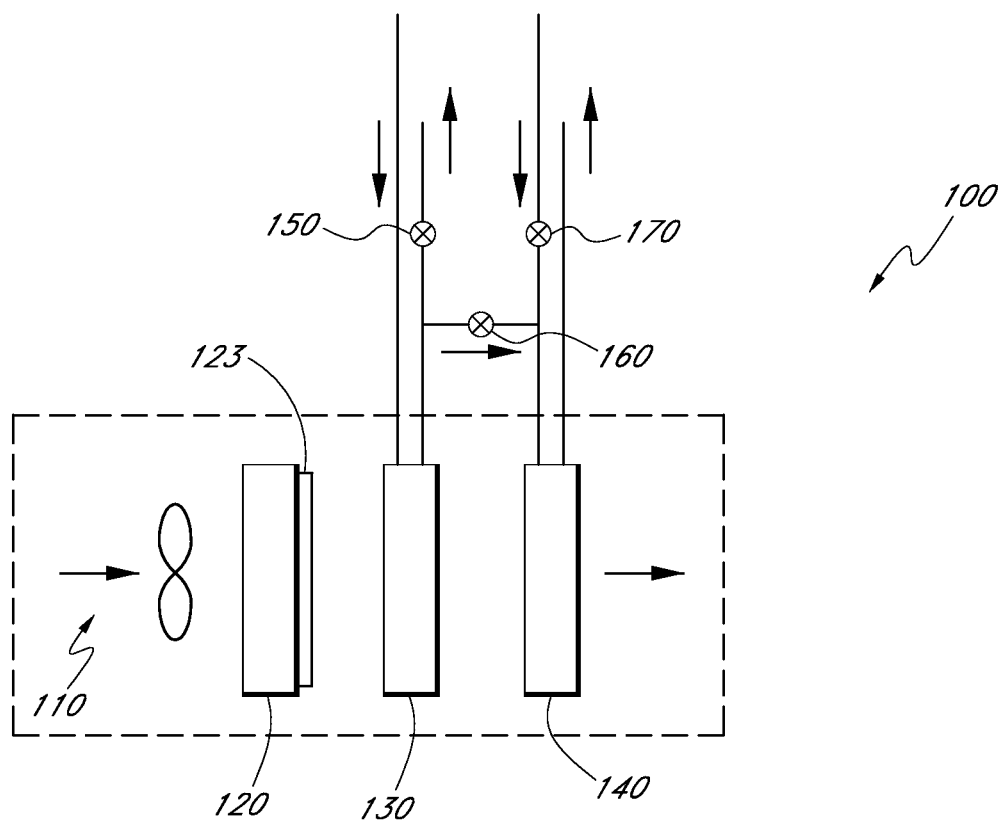
FIG. 2 illustrates a schematic illustration of an example embodiment of an HVAC architecture incorporating a thermoelectric device.

Referring now to FIG. 2, illustrated is an example embodiment of an HVAC system 100 including a heater core 130, an evaporator 120, and a thermoelectric device (TED) 140. At least some of the components of the HVAC system 100 can be in fluid communication via thermal energy transport means such as fluid conducting tubes, for example. Control devices such as valves 150, 160, and 170 can be used to control the thermal energy transfer through the tubing. A controller can be configured to control the various components of the system 100 and their relative fluid communication. In the illustrated embodiment, when valve 160 is open, there is a thermal circuit connecting the heater core 130 and the TED 140. An air handling unit (e.g., a fan) is configured to convey an airflow 110; the airflow is in thermal communication with the evaporator 120, the heater core 130, and the TED 140. The TED 140 can include one or more thermoelectric elements that transfer thermal energy in a particular direction when electrical energy is applied to the one or more TE elements. When electrical energy is applied using a first polarity, the TED 140 transfers thermal energy in a first direction. Alternatively, when electrical energy of a second polarity opposite the first polarity is applied, the TED 140 transfers thermal energy in a second direction opposite the first direction.

In some embodiments, a thermal storage device 123 is coupled to the HVAC system 100. As illustrated in FIG. 2, the thermal storage device 123 can be coupled or be part of the evaporator 120. An evaporator 120 with a thermal storage device 123 can be considered a "heavy-weight" evaporator. An evaporator 120 without a thermal storage device 123 can be considered a "light-weight" evaporator. With a light-weight evaporator, the thermal storage device 123 can be placed anywhere along the HVAC system 100, such as for example, upstream or downstream of evaporator 120, heater core 130, and/or TED 140. The HVAC system 100 can convert electrical power directed to the HVAC system 100 into thermal power and store this thermal power in the thermal storage device 123. One or more thermoelectric devices can be utilized to convert electrical power into thermal power but any suitable electrical power to thermal power conversion device may be used. In order to store the thermal power, the thermal storage device 123 may contain both a high and low temperature phase change material, such as wax (a high temperature phase change material) and water (a low temperature phase change material). The HVAC system 100 can utilize the thermal storage device 123 to use available electrical energy from systems such as an alternator, a regenerative braking system generator, and/or a waste heat recovery system, as further discussed in U.S. application Ser. No. 11/184,742, filed Jul. 19, 2005, the entire contents of which are hereby incorporated by reference and should be considered a part of this specification. In some embodiments, a compressor-based refrigeration system may be used to store thermal energy in the thermal storage device 123 while the engine 13 is running and providing power to the compressor-based refrigeration system. When the engine 13 is stopped as discussed herein, the thermal energy in the thermal energy storage device 123 may be utilized to provide cooling for a longer period of time without requiring the engine to start and/or the TED 140 to operate. The thermal storage device 123 can be used with the TED 140 as discussed herein to provide even longer periods of time without requiring the engine to start while providing cooling. For example, when the engine is stopped, the thermal storage device 123 may initially cool the airflow. When the thermal energy stored in the thermal storage device 123 has been absorbed by the airflow, the TED 140 may be engaged to continue cooling the airflow. In some embodiments, the same concepts can be applied to utilize the thermal storage device 123 during heating modes to provide longer engine stop times. For example, when the engine is stopped, the thermal storage device 123 may initially heat the airflow. When the thermal energy stored in the thermal storage device 123 has been transferred to the airflow, the TED 140 may be engaged to continue heating the airflow.

In a first mode, which can be called a heating mode, valve 150 is open to allow the heater core 130 to be in thermal communication with a thermal energy source (not shown), such as a vehicle engine, a separate fuel-burning engine, an electrical heat generator, or any other heat source. The evaporator 120 is not in fluid communication with a thermal energy sink in order to minimize the thermal energy transferred between the airflow and the evaporator 120. Thermal energy from the heater core 130 is transferred to the airflow 110. In order to provide supplemental heating to the airflow, valve 160 may be opened, which opens the thermal circuit between the TED 140 and the heater core 130, in which case the TED 140 is in thermal communication with the thermal energy source. Electric energy is applied to the TED 140 in a polarity that transfers thermal energy to the airflow 110.

In a second mode, which can be called a cooling mode, valves 150 and 160 are closed, and valve 170 is open. Accordingly, fluid flow between heater core 130 and the thermal energy source is stopped in order to minimize thermal energy transferred from the heater core 130 to the airflow 110. The evaporator 120 is in fluid communication with a thermal energy sink (not shown), such as a compressor-based refrigeration system, causing a fluid, such as coolant to flow through the evaporator 120. The evaporator 120 transfers thermal energy away from the airflow 110. The TED 140 is now in fluid communication with a thermal energy sink via the valve 170, such as an auxiliary radiator or cooling system, and can be used to transfer additional thermal energy away from the airflow 110. The polarity of the TED is opposite the polarity that was used in the first mode.

In a third mode, which can be called a demisting mode, valve 150 is open and valve 170 is closed. The heater core 130 is in thermal communication with the thermal energy source. The evaporator 120 is in thermal communication with the thermal heat sink. In order to provide supplemental heating to the airflow 110, valve 160 may be opened so that the TED 140 is in thermal communication with the thermal energy source, in which case the TED 140 transfers thermal energy from the thermal energy source into the airflow 110. The third mode functions as a demister where, first, the airflow 110 is cooled below the dew point, condensing the air and removing moisture, by the evaporator 120. Second, the airflow 110 is heated by the heater core 130 and, if needed, the TED 140 to achieve a suitable temperature for passenger comfort.

Figure 3:
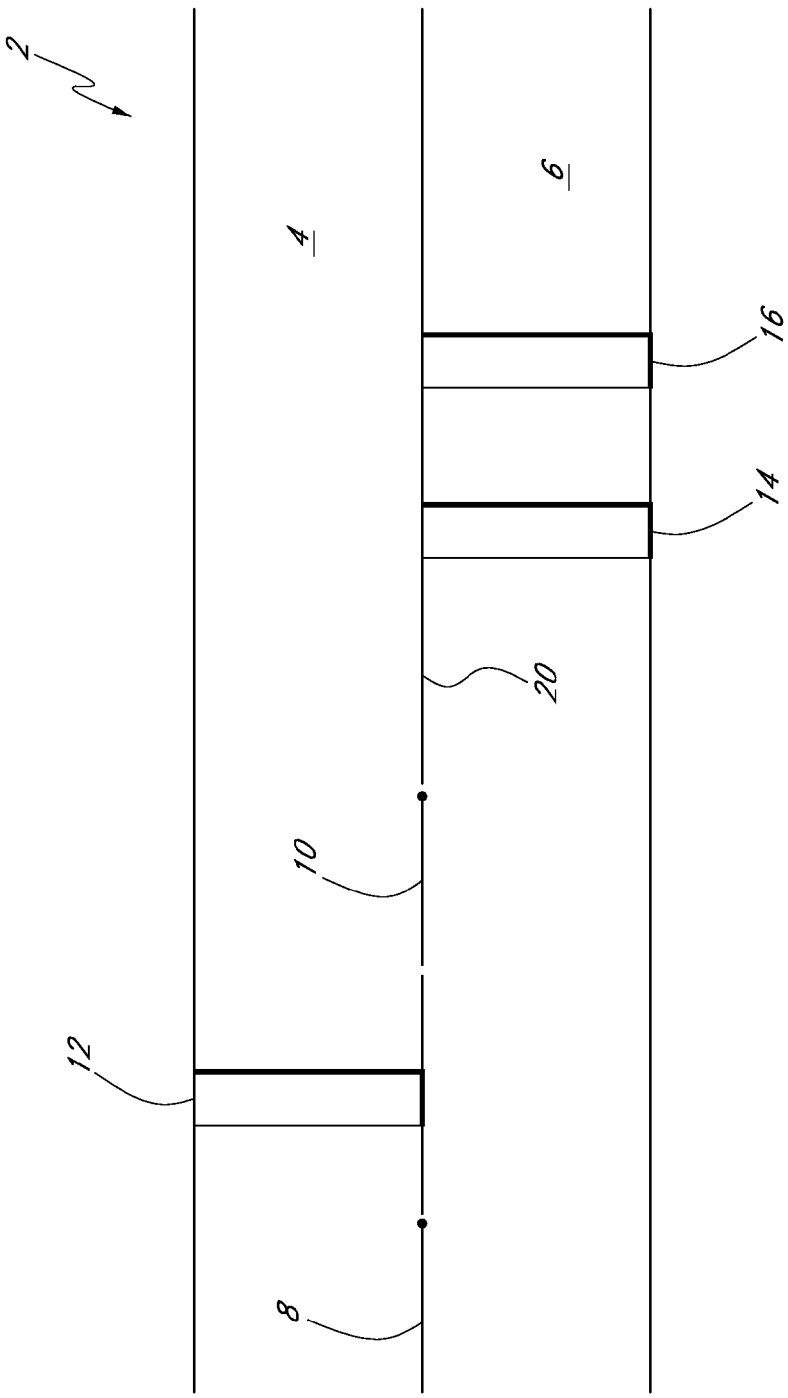
FIG. 3 illustrates a schematic illustration of an example embodiment of an HVAC system incorporating a dual channel architecture.

FIG. 3 illustrates an example embodiment of an HVAC system 2 through which an airflow 18 passes before entering the passenger compartment (not shown). The HVAC system 2 includes a cooling apparatus 12, a heater core 14, and a thermoelectric device (TED) 16. At least some of the components of the HVAC system 2 can be in fluid communication with one another via thermal energy transport means, such as fluid conducting tubes, for example. A controller can be configured to control the various components of the HVAC system 2 and their relative fluid communication. The heater core 14 is generally configured to be in thermal communication with a thermal energy source, such as a vehicle engine, a separate fuel-burning engine, an electrical heat generator, or any other heat source. Thermal energy from the heat source may be transferred via coolant through tubing to the heater core 14.

The cooling apparatus 12, such as an evaporator or a thermoelectric device, is in thermal communication with a thermal heat sink, such as a compressor-based refrigeration system, a condenser, or any other cooling system. The TED 16 can include one or more thermoelectric elements that transfer thermal energy in a particular direction when electrical energy is applied. When electrical energy is applied using a first polarity, the TED 16 transfers thermal energy in a first direction. Alternatively, when electrical energy of a second polarity opposite the first polarity is applied, the TED 16 transfers thermal energy in a second direction opposite the first direction. The TED 16 is configured such that it can be in thermal and fluid communication with a thermal energy source, such as a vehicle engine, a separate fuel-burning engine, an electrical heat generator, or any other heat source. The TED 16 is also configured such that it can be in thermal and fluid communication with thermal energy sink, such as a low temperature core or radiator, a compressor-based refrigeration system, or any other cooling system. The TED 16 is configured to either heat or cool the airflow 18 dependent upon a mode of the HVAC system 2, such as heating, cooling, or demisting.

The airflow 18 in the HVAC system 2 can flow through one or more channels or conduits. In some embodiments, a first channel 4 and a second channel 6 are separated by a partition 20. In certain embodiments, the first and second channels 4, 6 are of the same approximate size (e.g., same approximate height, length, width, and/or cross-sectional area), as shown in FIG. 3. However, in other embodiments, the first and second channels 4, 6 are of differing sizes. For example, the width, height, length, and/or cross-sectional area of the first and second channels 4, 6 can be different. In some embodiments, the first channel 4 is larger than the second channel 6. In other embodiments, the first channel 4 is smaller than the second channel 6. In further embodiments, additional partitions may be used to create any number of channels or conduits. The partitions may be of any suitable material, shape, or configuration. The partitions can serve to partially or completely separate the conduits or channels and may have apertures, gaps, valves, blend doors, other suitable structures, or a combination of structures that allow for fluid communication between channels. At least a portion of the partition can thermally insulate the first channel 4 from the second channel 6.

In certain embodiments, the HVAC system 2 comprises a first movable element configured to be operable to control the airflow passing through the first and second channels 4, 6. For example, a first blend door 8, which may also be called an inlet blend door, may be located upstream of the first and second channels 4, 6 (e.g., proximate the entrance of the first and second channels 4, 6) and is operable to control the airflow passing through the first and second channels 4, 6. The first blend door 8 can selectively modify, allow, impede, or prevent airflow through one or both of the first and second channels 4, 6. In certain configurations, the first blend door 8 can prevent airflow through one of the channels while directing all of the airflow through the other channel. The first blend door 8 can also allow airflow through both channels in varying amounts and ratios. In some embodiments, the first blend door 8 is coupled to the partition 20 and rotates relative to the partition 20. Other first movable elements are also compatible with certain embodiments disclosed herein.

A second movable element (e.g., a second blend door 10) may be positioned downstream from the cooling apparatus 12 and upstream from the heater core 14 and the TED 16. The second movable element is operable to control the airflow passing through the first and second channels 4, 6 by selectively diverting air from the first channel 4 to the second channel 6. In some embodiments, the second blend door 10 is coupled the partition 20 and rotates relative to the partition 20 between an open position, in which fluid (e.g., air) is permitted to flow between the first and second channels 4, 6, and a closed position, in which flow between the first and second channels 4, 6 is substantially impeded or prevented. The first and second blend doors 8, 10 can be controlled by the controller or a separate control system. In some embodiments, the first and second blend doors 8, 10 can operate independently from one another. Other second movable elements are also compatible with certain embodiments disclosed herein.

In the illustrated embodiment, the cooling apparatus 12 is located upstream and in a separate conduit or channel than are the heater core 14 and the thermoelectric device 16. The first and second channels 4, 6 are configured such that when the HVAC system 2 is used to selectively heat, cool, and/or demist, the first and second blend doors 8, 10 may selectively direct airflow between the first and second channels 4, 6.

In some embodiments, one or more of the cooling apparatus 12, the heater core 14, and the thermoelectric device 16 may be in thermal communication with a heat exchanger configured to be in thermal communication with the airflow.

Figure 4:
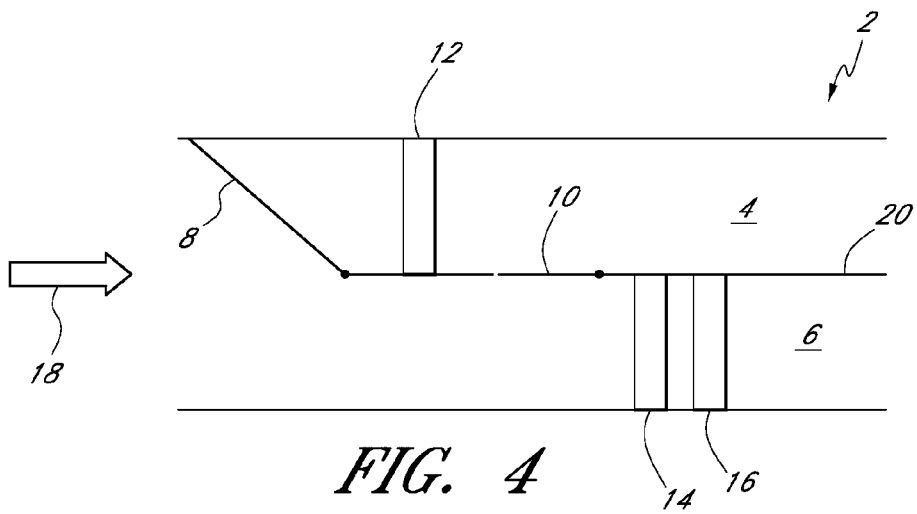
FIG. 4 illustrates a schematic illustration of an example embodiment of an HVAC system incorporating a dual channel architecture in a heating configuration.

FIG. 4 illustrates an example embodiment of an HVAC system 2 configured in a first mode, which may be called a heating mode. In this mode, a first blend door 8 is configured in a position such that it substantially prevents or blocks an airflow 18 from entering a first channel 4, thereby forcing substantially all of the airflow 18 into a second channel 6. In some embodiments, a portion of the airflow 18 may pass through the first channel 4. A second blend door 10 is configured so that it does not allow a substantial portion of the airflow 18 to pass between the first and second channels 4, 6. Preferably, in this mode, a substantial portion of the airflow 18 does not pass through a cooling apparatus 12. In this mode, the cooling apparatus 12 may be configured so that it is not in thermal communication with a thermal energy sink, such as a coolant system, whereby the resources, such as coolant, may be more efficiently used elsewhere. Additionally, directing the airflow through the second channel 6 and bypassing the cooling apparatus 12, reduces unwanted transfer of thermal energy from the airflow 18 and into the cooling apparatus 12. Even when the cooling apparatus 12 is not actively in thermal communication with a thermal heat sink, the cooling apparatus 12 will generally have a lower temperature than the airflow 18, thus, if a substantial portion of the airflow 18 would be in thermal communication with the cooling apparatus 12, the cooling apparatus 12 would undesirably lower the temperature of the airflow 18 before it is heated.

In the first mode, a heater core 14 in fluid communication with the second channel 6 is in thermal communication with a thermal heat source, such as a vehicle engine. Thermal energy transferred from the heat source to the heater core 14 is transferred to the airflow 18. Although a warm heater core 14 can sometimes supply enough thermal energy to the airflow 18 for heating the passenger compartment, a thermoelectric device (TED) 16 can be used as a supplemental or alternative thermal energy source. Thus, the TED 16 can add supplemental thermal energy while the heater core 14 transfers thermal energy to the airflow 18. The TED 16 can be configured so that it is in thermal communication with the same thermal energy source as is the heater core 14, or another thermal energy source. Electric energy is supplied to the TED 16 with a polarity that transfers thermal energy to the airflow 18. In order to optimize supplemental heating, it is preferable that the TED 16 is located downstream of the heater core 14, which can decrease differences in temperature between a first thermal transfer surface (or main surface, not shown) of the TED 16 and a second thermal transfer surface (or waste surface, not shown) of the TED 16, thereby enhancing the coefficient of performance. Positioning the TED 16 downstream of the heater core 14 can also prevent or inhibit the thermal energy transferred from the TED 16 to the airflow 18 from being absorbed by a relatively cold heater core 14 when the engine and coolant loop are relatively cold in the first mode; thus, inhibiting transfer of thermal energy from the airflow 18 into the coolant loop in the first mode (or other heating modes). The TED 16 is generally used for supplemental heating; however, it may be used as a primary heat source when the thermal heat source is not supplying enough heat to the heater core 14, for example, when the engine is warming up. The TED 16 may also be disengaged when the heater core 14 is supplying enough thermal energy to the airflow 18. The resulting airflow 18 is accordingly heated to a desired temperature and directed to the passenger compartment.

In some embodiments, the first blend door 8, which can also be called an inlet blend door, may be configured so that it can direct at least a portion of the airflow 18 through the second channel 6 so that the portion of the airflow 18 is heated before entering the passenger compartment. To heat the passenger compartment at a slower rate, the inlet blend door 8 can be selectively adjusted to allow less of the airflow to pass through the second channel 6 and/or allow more of the airflow to pass through the first channel 4, in which the airflow is not heated. To increase the heating rate, the blend door can be selectively adjusted so that more of the airflow is directed through the second channel 6 and less of the airflow is allowed into the first channel 4.

Figure 5:
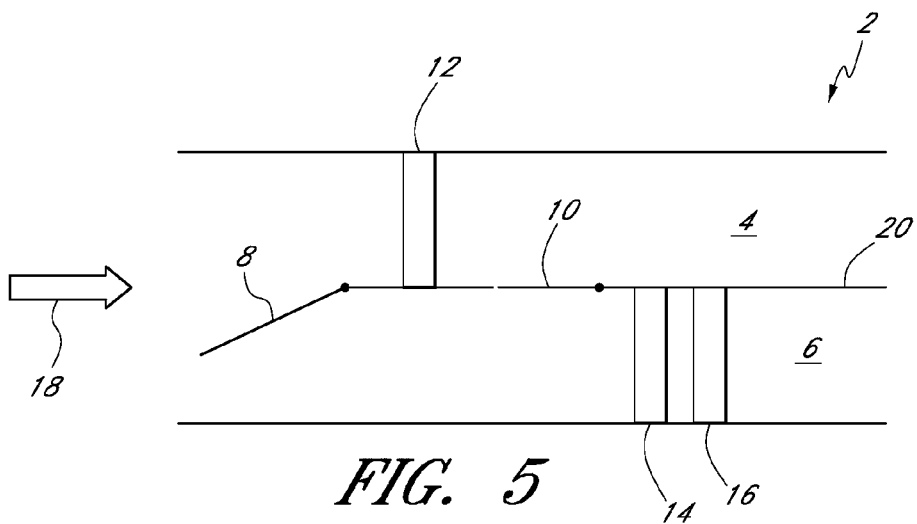
FIG. 5 illustrates a schematic illustration of an example embodiment of an HVAC system incorporating a dual channel architecture in a cooling configuration.

FIG. 5 illustrates an example embodiment of an HVAC system 2 configured in a second mode, which may be called a cooling mode. In this mode, a first blend door 8 is configured so that it can direct at least a portion of an airflow 18 (e.g., all, substantially all, or a substantial portion of an airflow 18) through a first channel 4 to which a cooling apparatus 12 is operatively connected so that the portion of the airflow 18 is cooled before entering the passenger compartment. A second blend door 10 is configured so that it does not allow a substantial portion of the airflow 18 to pass between the first and the second channels 4, 6. The amount of airflow 18 passing through the first and second channels 4, 6 may be adjusted by selectively varying the position of the first blend door 8.

In the second mode, the cooling apparatus 12, such as an evaporator, is thermally connected to a thermal heat sink (not shown), such as an auxiliary radiator, for example. In this mode, the HVAC system 2 cools the airflow 18 by transferring heat from the airflow 18 to the cooling apparatus 12. In some embodiments, a thermoelectric device (TED) 16 may be used to provide supplemental cooling to the airflow 18 in the second channel 6. The TED 16 can be configured so that it is in thermal communication with a thermal energy sink (not shown), such as a low temperature core or auxiliary radiator. Electric energy is supplied to the TED 16 with a polarity that causes the TED 16 to absorb thermal energy from the airflow and, in turn, transfer thermal energy to the thermal heat sink. Thus, the TED 16 can provide supplemental transfer of thermal energy from the airflow 18 to the thermal heat sink while the cooling apparatus 12 cools the airflow 18. In the second mode, the heater core 14 is inactive; for example, the heater core 14 is not actively in substantial thermal communication with a thermal heat source (e.g., power train coolant). In certain embodiments, activation of the heater core 14 can be controlled using a valve or other control system (not shown), and the heater core 14 can be operatively decoupled from the thermal heat source.

To cool the passenger compartment at a slower rate, the first blend door 8 can be selectively adjusted to allow less of the airflow 18 to pass through the first channel 4 and/or to allow more of the airflow 18 to pass through the second channel 6. To increase the cooling rate, the first blend door 8 can be selectively adjusted so that more of the airflow 18 is directed through the first channel 4 and less of the airflow is allowed into the second channel 6. In some embodiments, the first blend door 8 may be positioned such that it substantially prevents or blocks the airflow 18 from entering the second channel 6, thereby forcing at least a substantial portion or substantially all of the airflow 18 into the first channel 4. In certain of such embodiments, the TED 16 is operatively decoupled from the airflow 18, and the electrical energy that the TED 16 would otherwise use can be directed elsewhere.

Figure 6:
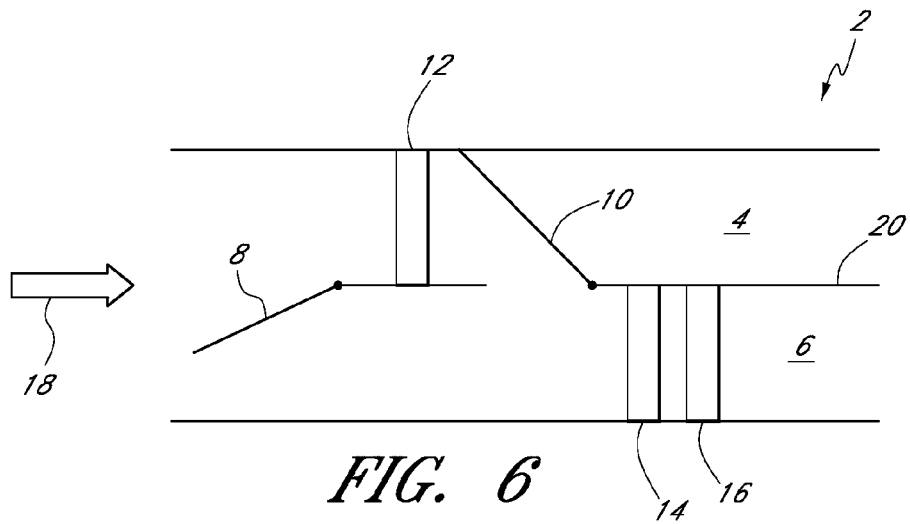
FIG. 6 illustrates a schematic illustration of an example embodiment of an HVAC system incorporating a dual channel architecture in a demisting configuration.

FIG. 6 illustrates an example embodiment of an HVAC system 2 configured in a third mode, which may be called a demisting mode. In this mode, a first blend door 8 is configured so that it can direct at least a portion of an airflow 18 (e.g., all, substantially all, or a substantial portion) through a first channel 4 with a cooling apparatus 12 so that the airflow 18 is cooled in order to remove moisture from the airflow 18. In this mode, a second blend door 10 is configured in a position such that it substantially prevents or blocks the airflow 18 from continuing through the first channel 4, thereby diverting at least a portion of the airflow 18 from the first channel 4 into a second channel 6 after the airflow 18 has passed through the cooling apparatus 12.

In the third mode, the cooling apparatus 12, such as an evaporator, can be in fluid communication with the first channel 4 and in thermal communication with a thermal heat sink, such as, for example, an auxiliary radiator (not shown). In this mode, the HVAC system 2 cools the airflow 18 by transferring heat from the airflow 18 to the cooling apparatus 12. In some embodiments, the cooling apparatus 12 may be a thermoelectric device. When the cooling apparatus 12 is a thermoelectric device, electric energy is supplied to the thermoelectric device with a polarity selected such that the TED absorbs thermal energy from the airflow 18 and adds thermal energy to a heat sink. In some embodiments, multiple thermoelectric devices are operatively connected to the HVAC system 2. In at least some such embodiments, the polarity of electrical energy directed to each TED and to each thermal zone of each TED can be controlled independently.

Figure 7:
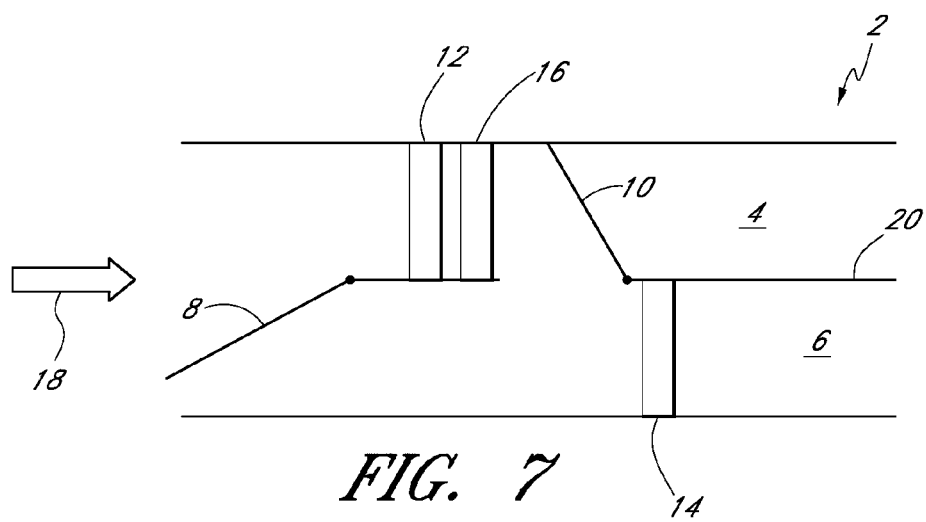
FIG. 7 illustrates a schematic illustration of an example embodiment of an HVAC system incorporating a dual channel architecture with a repositioned or additional thermoelectric device in a demisting configuration.

In an embodiment as illustrated in FIG. 7, a cooling apparatus 12 and a TED 16 can be separate units with the TED 16 placed in a first channel 4. Still in the third mode or demisting mode, the cooling apparatus 12 and the TED 16 can be in fluid communication with the first channel 4. Electric energy can be supplied to the TED 16 with a polarity selected such that the TED 16 absorbs thermal energy from the airflow 18 and adds thermal energy to a heat sink. In demisting mode, a first blend door 8 can be configured so that it can direct at least a portion of an airflow 18 (e.g., all, substantially all, or a substantial portion) through a first channel 4 with the cooling apparatus 12 and the TED 16 so that the airflow 18 is cooled in order to remove moisture from the airflow 18. In this mode, a second blend door 10 can be configured in a position such that it substantially prevents or blocks the airflow 18 from continuing through the first channel 4, thereby diverting at least a portion of the airflow 18 from the first channel 4 into a second channel 6 after the airflow 18 has passed through the cooling apparatus 12. As described herein for other embodiments, the first, second, and/or third modes of operation can be achieved for the embodiment of FIG. 7 by reversing the polarity of the TED as needed for either absorbing or transferring thermal energy to the airflow 18. Further, a TED may be added downstream of the heater core 14 to also achieve the first, second, and/or third modes as described herein for the other embodiments.

Referring back to FIG. 6, in the third mode, a heater core 14 is in thermal communication with a thermal heat source, such as a vehicle engine (not shown). Thermal energy transferred from the heat source to the heater core is transferred to the airflow 18. Although the heater core 14 can typically supply enough thermal energy for heating the passenger compartment, a thermoelectric device (TED) 16 can be used as a supplemental heat source. Thus, the TED 16 can add supplemental thermal energy while the heater core 14 transfers thermal energy to the airflow 18. The TED 16 can be configured so that it is in thermal communication with the thermal energy source, such as the engine (not shown). Electric energy is supplied to the TED 16 with a polarity that causes the TED to transfer thermal energy to the airflow 18. In some embodiments, the efficiency of supplemental heating is increased when the TED 16 is positioned downstream of the heater core. This can decrease differences in temperature between the main surface of the TED 16 and the waste surface, thereby enhancing the coefficient of performance. Positioning the TED 16 downstream of the heater core 14 can also prevent or inhibit the thermal energy transferred from the TED 16 to the airflow 18 from being absorbed by a relatively cold heater core 14 when the engine and coolant loop are relatively cold in the third mode; thus, inhibiting transfer of thermal energy from the airflow 18 into the coolant loop in the third mode (or other heating modes). When the airflow 18 is already at the desired temperature for the passenger compartment before reaching the TED 16, the TED 16 may be disengaged and its resources diverted elsewhere.

Figure 8:
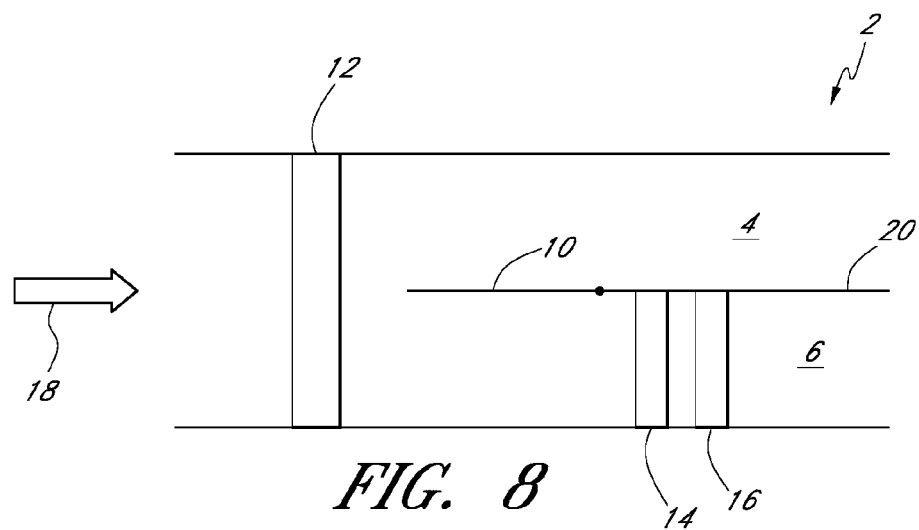
FIG. 8 illustrates a schematic illustration of an example embodiment of an HVAC system incorporating a dual channel architecture with a blend door.

In an embodiment as illustrated in FIG. 8, an HVAC system 2 can also be configured to have a cooling apparatus 12 span the height of both a first channel 4 and a second channel 6. In this embodiment, a first blend door is removed and just the blend door 10 can divert the airflow 18 to the first channel 4 and/or the second channel 6 to achieve the operating modes described herein. In the first mode or heating mode, the blend door 10 can be configured in a position (swings up in FIG. 8) such that it substantially prevents or blocks airflow 18 into the first channel 4, thereby forcing substantially all the airflow 18 into the second channel 6. In some embodiments, a portion of the airflow 18 may pass through the first channel 4. In the first mode, even though the cooling apparatus 12 can be in fluid contact with the airflow 18, the cooling apparatus 12 may be configured so that it is not in thermal communication with a thermal energy sink, such as a coolant system, whereby the resources, such as coolant, may be more efficiently used elsewhere. The heater core 14 and TED 16 can operate as described herein for the heating mode to transfer thermal energy to the airflow 18.

In some embodiments, a blend door 10 may be configured so that it can direct at least a portion of the airflow 18 through a second channel 6 so that the portion of the airflow 18 is heated before entering the passenger compartment. To heat the passenger compartment at a slower rate, the blend door 10 can be selectively adjusted to allow less of the airflow to pass through a second channel 6 and/or allow more of the airflow to pass through the first channel 4, in which the airflow is not heated. To increase the heating rate, the blend door can be selectively adjusted so that more of the airflow is directed through the second channel 6 and less of the airflow is directed through the first channel 4.

In the embodiment as illustrated in FIG. 8, the HVAC system 2 can also be configured to operate in a second mode or cooling mode. In this mode, the blend door 10 can be configured so that it can direct at least a portion of an airflow 18 (e.g., all, substantially all, or a substantial portion of the airflow 18 by swinging down in FIG. 8) through the first channel 4 after being cooled by the cooling apparatus 12. The amount of airflow 18 passing through the first and second channels 4, 6 may be adjusted by selectively varying the position of the blend door 10 such as to add supplemental cooling by diverting a portion of the airflow 18 through the second channel 6 and supplying electrical energy to the TED 16 with a polarity that causes the TED 16 to absorb thermal energy from the airflow and, in turn, transfer thermal energy to a thermal heat sink. Thus, the TED 16 can provide supplemental transfer of thermal energy from the airflow 18 to the thermal heat sink while the cooling apparatus 12 cools the airflow 18. In the second mode, the heater core 14 is inactive.

In the embodiment as illustrated in FIG. 8, the HVAC system 2 can also be configured to operate in the third mode or demisting mode. In this mode, the blend door 10 is configured in a position (swings up in FIG. 8) such that it substantially prevents or blocks airflow 18 into the first channel 4, thereby forcing substantially all of the airflow 18 into the second channel 6. In some embodiments, a portion of the airflow 18 may pass through the first channel 4. The cooling apparatus 12 is active so that the airflow 18 is cooled in order to remove moisture from the airflow 18. In the third mode, the cooling apparatus 12, such as an evaporator, can be in fluid communication with the HVAC system 2 and in thermal communication with a thermal heat sink, such as, for example, an auxiliary radiator (not shown). In this mode, the HVAC system 2 can cool the airflow 18 by transferring heat from the airflow 18 to the cooling apparatus 12. In some embodiments, the cooling apparatus 12 may be a thermoelectric device. When the cooling apparatus 12 is a thermoelectric device, electric energy can be supplied to the thermoelectric device with a polarity selected such that the TED absorbs thermal energy from the airflow 18 and adds thermal energy to a heat sink. In some embodiments, multiple thermoelectric devices are operatively connected to the HVAC system 2. In at least some such embodiments, the polarity of electrical energy directed to each TED and to each thermal zone of each TED can be controlled independently.

In the third mode, the heater core 14 is in thermal communication with a thermal heat source, such as a vehicle engine (not shown). Thermal energy transferred from the heat source to the heater core can be transferred to the airflow 18. Although the heater core 14 can typically supply enough thermal energy for heating the passenger compartment, the TED 16 can be used as a supplemental heat source. The TED 16 can be configured so that it is in thermal communication with the thermal energy source, such as the engine (not shown). Electric energy can be supplied to the TED 16 with a polarity that causes the TED to transfer thermal energy to the airflow 18. In some embodiments, the efficiency of supplemental heating can be increased when the TED 16 is positioned downstream of the heater core. This can decrease differences in temperature between the main surface of the TED 16 and the waste surface, thereby enhancing the coefficient of performance. Positioning the TED 16 downstream of the heater core 14 can also prevent or inhibit the thermal energy transferred from the TED 16 to the airflow 18 from being absorbed by a relatively cold heater core 14 when the engine and coolant loop are relatively cold in the third mode; thus, inhibiting transfer of thermal energy from the airflow 18 into the coolant loop in the third mode (or other heating modes). When the airflow 18 is already at the desired temperature for the passenger compartment before reaching the TED 16, the TED 16 may be disengaged and its resources diverted elsewhere.

Figure 9:
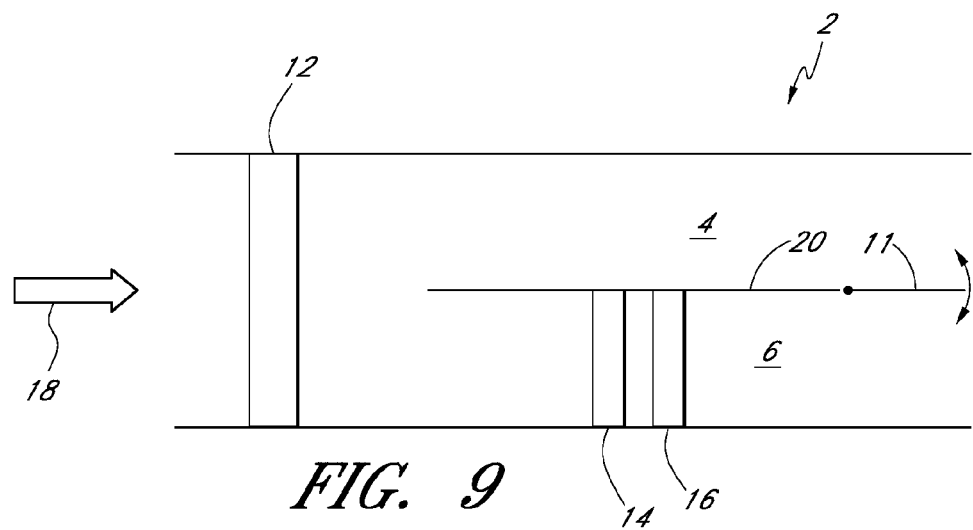
FIG. 9 illustrates a schematic illustration of an example embodiment of an HVAC system incorporating a dual channel architecture with a blend door.
Figure 10:
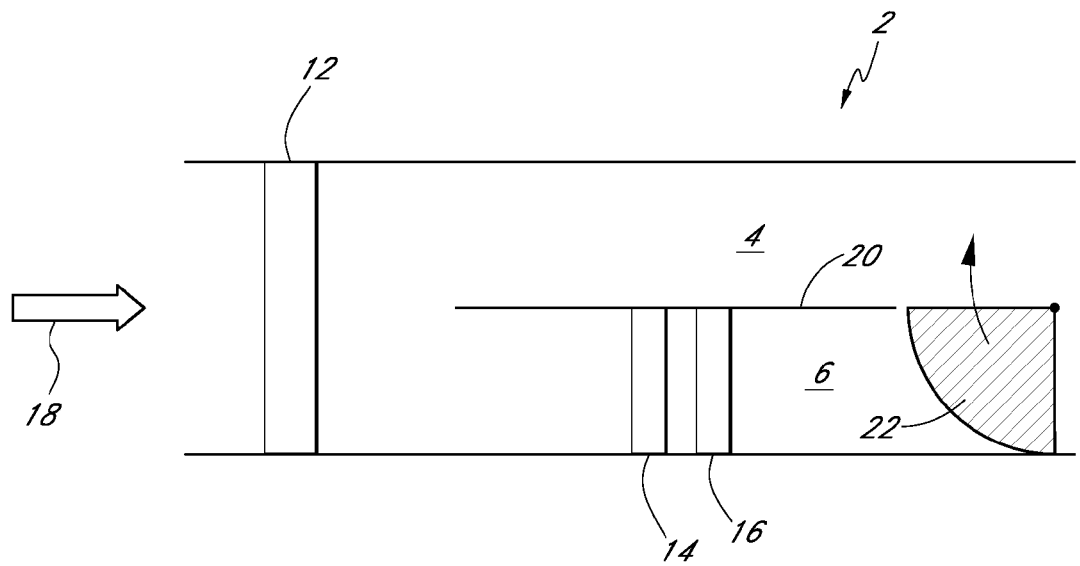
FIG. 10 illustrates a schematic illustration of an example embodiment of an HVAC system incorporating a dual channel architecture with a flow diversion element.
Figure 11:
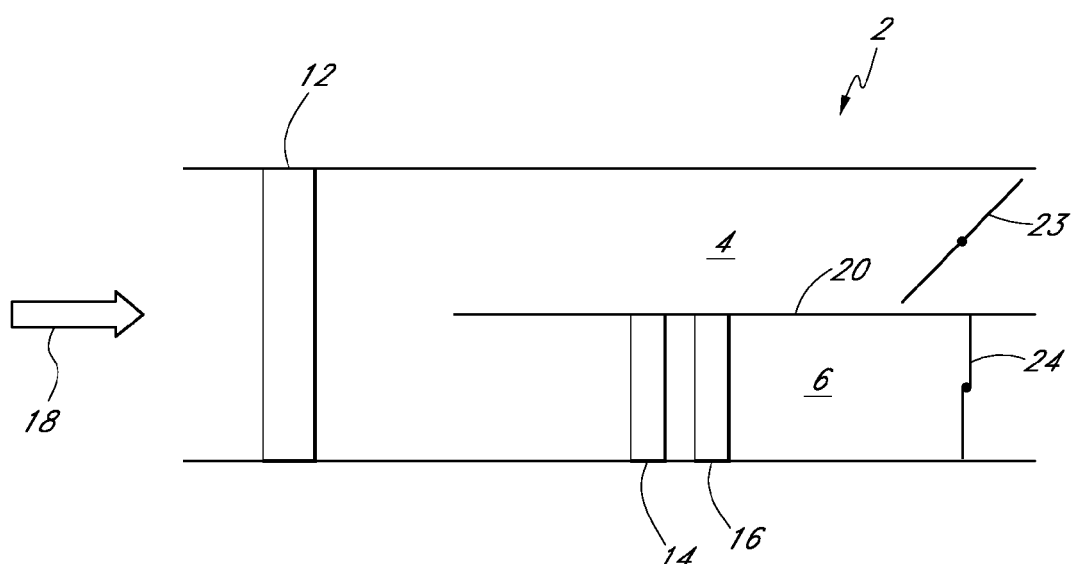
FIG. 11 illustrates a schematic illustration of an example embodiment of an HVAC system incorporating a dual channel architecture with a plurality of valves.

FIGS. 9-11 illustrate other example embodiments configured to divert an airflow 18 as described for the embodiment of FIG. 8 in order operate in the first, second, and/or third modes. In an embodiment of FIG. 9, the blend door 11 is disposed downstream of a cooling apparatus 12, a heater core 14, and a TED 16. In the first and third modes, the blend door 11 can be configured in a position (swings up in FIG. 9) such that it substantially prevents or blocks airflow 18 into a first channel 4, thereby forcing substantially all the airflow 18 into a second channel 6. In the second mode, the blend door 11 can be configured so that it can direct at least a portion of an airflow 18 (e.g., all, substantially all, or a substantial portion of an airflow 18 by swinging down in FIG. 9) through the first channel 4 after being cooled by the cooling apparatus 12. In some embodiments, the blend door 11 may be configured so that it can direct at least a portion of the airflow 18 through the first channel 4 while directing the other portion of the airflow 18 through the second channel 6. The cooling apparatus 12, the heater core 14, and the TED 16 can be configured to operate as described herein for FIGS. 3-6 to achieve the first, second, and/or third modes of operation.

In an embodiment of FIG. 10, a flow diversion element 22 is configured to operate in substantially the same way as the blend door 11 of FIG. 9 described herein to achieve the operating regimes of the first, second, and/or third modes. The flow diversion element 22 can be configured (swing up or down in the embodiment of FIG. 10) to block all or substantially all the airflow 18 through the either a first channel 4 or a second channel 6, or direct at least a portion of the airflow 18 through the first channel 4 while directing the other portion of the airflow 18 through the second channel 6. As illustrated in FIG. 10, the flow diversion element 22 can be downstream of the heater core 14 and TED 16. In some embodiments, the flow diversion element 22 can be upstream of the heater core 14 and TED 16. A cooling apparatus 12, a heater core 14, and a TED 16 can be configured to operate as described herein for FIGS. 3-6 to achieve the first, second, and/or third modes of operation.

In an embodiment of FIG. 11, a first valve 23 and a second valve 24, disposed in a first channel and second channel, respectively, downstream of a cooling apparatus 12, are configured to functionally operate in substantially the same way as the blend door 11 of FIG. 9 described herein to achieve the operating regimes of the first, second, and/or third modes. As illustrated in FIG. 11, the first valve 23 and second valve 24 can be downstream of the heater core 14 and TED 16. In some embodiments, the first valve 23 and/or second valve 24 can be upstream of the heater core 14 and TED 16. To block all or substantially all airflow 18 through the first channel 4, the first valve 23 can be configured (closed) to restrict the airflow 18 through first channel 4 while the second valve 24 can be configured (opened) to direct the airflow 18 through the second channel 6. To block all or substantially all the airflow 18 through the second channel 6, the first valve 23 can be configured (opened) to direct the airflow 18 through first channel 4 while the second valve 24 can be configured (closed) to restrict the airflow 18 through the second channel 6. To direct at least a portion of the airflow 18 through the first channel 4 and the other portion of the airflow 18 through the second channel 6, the first valve 23 and the second valve 24 can be configured to both be open or configured with one of the valves open while the other valve is only partially open. A cooling apparatus 12, a heater core 14, and a TED 16 can be configured to operate as described herein for FIGS. 3-6 to achieve the first, second, and/or third modes of operation.

In certain embodiments described herein, the heating functionality and the cooling functionality of an HVAC system is implemented by two or more distinct subsystems that may be located at substantially different positions within an HVAC system. In some alternative embodiments, a single TED simultaneously heats and cools to achieve increased thermal conditioning, human comfort and system efficiency. This can be achieved, for example, by constructing a single TED with separate electrical zones that can be excited with user selected voltage polarities to simultaneously cool and heat comfort air. As used herein, the terms "bithermal thermoelectric device" and "bithermal TED" broadly refer to thermoelectric devices with two or more electrical zones, where the electrical zones can have any suitable electric, geometric or spatial configuration in order to achieve desired conditioning of air.

Bithermal TEDs, whether they be air to air, liquid to air, or liquid to liquid, can be designed and constructed so that the thermoelectric circuit is subdivided into a plurality of thermal zones. The thermoelectric devices may be constructed using the high density advantages taught by Bell, et al, or may be constructed using traditional technologies (see, e.g., U.S. Pat. Nos. 6,959,555 and 7,231,772). The advantages of new thermoelectric cycles, as taught by Bell, et al., may or may not be employed (see, e.g., L. E. Bell, "Alternate Thermoelectric Thermodynamic Cycles with Improved Power Generation Efficiencies," 22nd Int'l Conf. on Thermoelectrics, Hérault, France (2003); U.S. Pat. No. 6,812,395, and U.S. Patent Application Publication No. 2004/0261829, each of which is incorporated in its entirety by reference herein).

In some embodiments, a controller or energy management system operates a bithermal TED to optimize the use of power according to ambient conditions, climatic conditions in a target compartment, and the desired environmental state of the target compartment. In a demisting application, for example, the power to the bithermal TED can be managed according to data acquired by sensors that report temperature and humidity levels so that the TED appropriately uses electric energy to condition and dehumidify the comfort air.

Some embodiments reduce the number of devices used to demist comfort air during cold weather conditions by combining two or more functions, such as, for example, cooling, dehumidification, and/or heating, into a single device. Certain embodiments improve system efficiency by providing demand-based cooling power according to climatic conditions in order to demist comfort air. In some embodiments, a cooling system provides cooling power proportional to demand.

Certain embodiments enable a wider range of thermal management and control by providing the ability to fine-tune comfort air temperature in an energy efficient manner. Some embodiments provide the ability to advantageously utilize thermal sinks and sources in a single device by further separating the heat exchanger working fluid loops according to sink and source utilization.

Figures 12, 13:
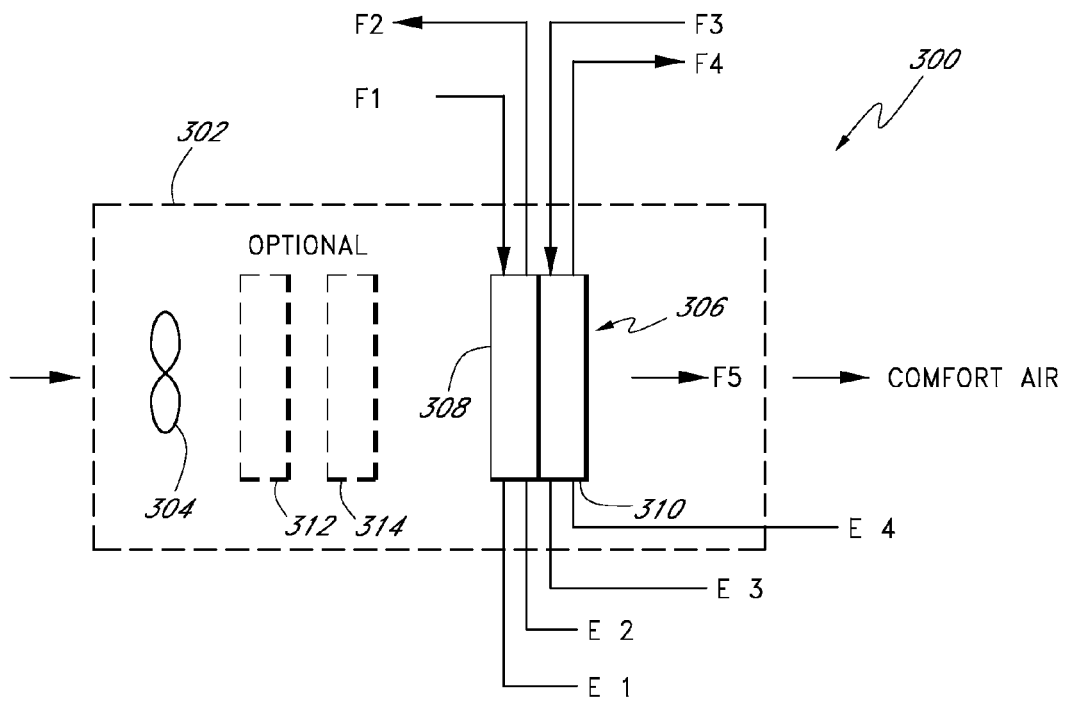
FIG. 12 is a chart related to an example embodiment of an HVAC system incorporating a bithermal thermoelectric device.
FIG. 13 is a schematic illustration of an example embodiment of an HVAC system incorporating a bithermal thermoelectric device.

In the example HVAC system 300 illustrated in FIGS. 12-13, heating and cooling functionality is implemented in a unitary or substantially contiguous heater-cooler subsystem 306 having a first thermal zone 308 and a second thermal zone 310. In some embodiments, the heater-cooler subsystem 306 is a bithermal thermoelectric device (or bithermal TED). Each of the first thermal zone 308 and the second thermal zone 310 can be configured to selectively heat or cool a comfort airstream F5 independently. Further, each of the thermal zones 308, 310 can be supported by an independently configurable electrical network and working fluid network. A controller (not shown) can be configured to control the electrical networks and working fluid networks in order to operate the heater-cooler subsystem 306 in one of a plurality of available modes. For example, the controller can adjust the electrical and working fluid networks of the HVAC system 300 according to the configurations shown in the table of FIG. 12 when a demisting, heating, or cooling mode is selected.

Any suitable technique can be used to select a mode of operation for the HVAC system 300. For example, a mode of operation may be selected at least in part via a user interface presented to an operator for selecting one or more settings, such as temperature, fan speed, vent location, and so forth. In some embodiments, a mode of operation is selected at least in part by a controller that monitors one or more sensors for measuring passenger compartment temperature and humidity. The controller can also monitor sensors that detect ambient environmental conditions. The controller can use information received from sensors, user controls, other sources, or a combination of sources to select among demisting, heating, and cooling modes. Based on the selected mode of operation, the controller can operate one or more pumps, fans, power supplies, valves, compressors, other HVAC system components, or combinations of HVAC system components to provide comfort air having desired properties to the passenger compartment.

In the example embodiment illustrated in FIG. 13, the HVAC system 300 includes an air channel 302, a fan 304 configured to direct an airflow F5 through the air channel 302, a bithermal TED 306 configured to heat, cool, and/or demist the airflow F5 flowing through the air channel 302, an optional cooling apparatus 312 configured to cool the airflow F5, an optional heating apparatus 314 configured to heat the airflow F5, a power supply (not shown), electrical connections E1-E4 connected between the power supply and the bithermal TED 306, a heat source (not shown), a heat sink (not shown), working fluid conduits F1-F4 configured to carry working fluids between the bithermal TED 306 and one or more heat sources or sinks, other HVAC system components, or any suitable combination of components. The heat source can include one or more repositories of waste heat generated by a motor vehicle, such as, for example, power train coolant, a motor block, a main radiator, exhaust system components, a battery pack, another suitable material, or a combination of materials. The heat sink can include an auxiliary radiator (for example, a radiator not connected to the power train coolant circuit), a thermal storage device, another suitable material, or a combination of materials.

In a demisting mode of operation, the first thermal zone 308 of the bithermal TED 306 cools and dehumidifies comfort air F5. A controller causes a power supply to provide electric power in a first polarity (or cooling polarity) via a first electrical circuit E1-E2 connected to the first thermal zone 308. The controller causes the first working fluid circuit F1-F2 connected to the high temperature side of the first thermal zone 308 of the TED 306 to be in thermal communication with a heat sink, such as, for example, an auxiliary radiator. The polarity of electric power provided to the first thermal zone 308 of the TED 306 causes thermal energy to be directed from the comfort air F5 to the first working fluid circuit F1-F2.

In the demisting mode, the second thermal zone 310 of the bithermal TED 306 heats the dehumidified comfort air F5 after the air has passed through the first thermal zone 308. The controller causes a power supply to provide electric power in a second polarity (or heating polarity) via a second electrical circuit E3-E4 connected to the second thermal zone 310. The controller causes the second working fluid circuit F3-F4 connected to the low temperature side of the second thermal zone 310 of the TED 306 to be in thermal communication with a heat source, such as, for example, power train coolant. The polarity of electric power provided to the second thermal zone 310 of the TED 306 causes thermal energy to be directed from the second working fluid circuit F3-F4 to the comfort air F5. The controller can regulate the thermal energy transferred to or from the comfort air F5 in each thermal zone in order to cause the comfort air F5 to reach a desired temperature and/or humidity. The comfort air F5 can then be directed to the passenger compartment.

When a heating mode of operation is selected, the first and second thermal zones 308, 310 of the bithermal TED 306 both heat comfort air F5. A controller causes a power supply to provide electric power in a heating polarity via first and second electrical circuits E1-E4 connected to the thermal zones 308, 310. The controller causes the working fluid circuits F1-F4 connected to the low temperature side of the TED 306 to be in thermal communication with a heat source, such as, for example, power train coolant. The polarity of electric power provided to both thermal zones 308, 310 of the bithermal TED 306 causes thermal energy to be directed from the working fluid circuits F1-F4 to the comfort air F5.

When a cooling mode of operation is selected, the first and second thermal zones 308, 310 of the bithermal TED 306 both cool comfort air F5. A controller causes a power supply to provide electric power in a cooling polarity via first and second electrical circuits E1-E4 connected to the thermal zones 308, 310. The controller causes the working fluid circuits F1-F4 connected to the high temperature side of the TED 306 to be in thermal communication with a heat sink, such as, for example, an auxiliary radiator. The polarity of electric power provided to both thermal zones 308, 310 of the bithermal TED 306 causes thermal energy to be directed from the comfort air F5 to the working fluid circuits F1-F4.

The HVAC system 300 illustrated in FIGS. 12-13 can optionally include a cooling apparatus 312, such as, for example, an evaporator, and a heating apparatus 314, such as, for example, a heater core. The cooling apparatus 312 and the heating apparatus 314 can be configured to supplement or replace one or more of the cooling, demisting and heating functions of the bithermal TED 306 while the HVAC system 300 is operated in a particular mode. For example, a heater core 314 can be used to heat the comfort air F5 instead of the bithermal TED 306 when the power train coolant has reached a sufficiently high temperature to make the comfort air F5 reach a desired temperature when it passes through the heater core 314. While the example embodiment illustrated in FIG. 13 shows that the cooling apparatus 312 and/or the heating apparatus 314 can be positioned upstream from the bithermal TED 306, it is understood that at least one of the cooling apparatus 312 and the heating apparatus 314 can be positioned downstream from the bithermal TED 306. For example, in some embodiments, when the HVAC system 300 is operated in a demisting mode, at least one of the thermal zones 308, 310 of the bithermal TED 306 can be used to cool or dehumidify the comfort air F5 while a heating apparatus positioned downstream from the TED 306 heats the dehumidified air.

In an example embodiment of a heater-cooler 400 illustrated in FIGS. 14-16, a first fluid stream F1 passes through two heat exchange zones 404, 410 located on a first side of a bithermal TED having two thermoelectric circuit zones 402, 408. A second fluid stream F2 passes through two heat exchange zones 406, 412 located on a second side of the bithermal TED. Each of the first thermoelectric circuit zone 402 and the second thermoelectric circuit zone 408 can be configured to selectively transfer thermal energy in a desired direction independently from each other. Further, each of the thermoelectric circuit zones 402, 408 can be connected to an independently configurable electric circuit paths E1-E2, E3-E4. A controller can be configured to control the electrical networks E1-E4 and fluid streams F1-F2 in order to operate the heater-cooler 400 in one of a plurality of available modes. For example, the controller can adjust the electrical networks of the heater-cooler 400 according to the configurations shown in the table of FIG. 14 when a demisting, heating, or cooling mode is selected.

Any suitable technique can be used to select a mode of operation for the heater-cooler 400, including the techniques described previously with respect to the HVAC system 300 shown in FIGS. 12-13.

In the example embodiment illustrated in FIGS. 15-16, the heater-cooler 400 includes a first pair of heat exchange zones 404, 406 in thermal communication with opposing sides of a first thermoelectric circuit zone 402. A second pair of heat exchange zones 410, 412 is in thermal communication with opposing sides of a second thermoelectric circuit zone 408. The first and second thermoelectric circuit zones 402, 408 are configured to heat, cool, and/or demist fluids flowing through the heat exchange zones. A power supply (not shown) can provide power to each of the thermoelectric circuit zones 402, 408 using independent electric circuit paths E1-E2, E3-E4. The heater-cooler can include fluid conduits configured to carry fluid streams F1-F2 through the heat exchange zones 404 and 410, 406 and 412 in thermal communication with the TED.

In a demisting mode of operation, the first thermoelectric circuit zone 402 of the heater-cooler 400 cools a main fluid stream F1 flowing through the first heat exchange zone 404 of a main fluid conduit. A controller causes a power supply to provide electric power in a first polarity (or cooling polarity) via a first electrical circuit E1-E2 connected to the first thermoelectric circuit zone 402. A working fluid stream F2 flowing through the first heat exchange zone 406 of a working fluid conduit removes heat from the high temperature side of the first thermoelectric circuit zone 402. The working fluid stream F2 can flow counter to the direction of flow of the main fluid stream F1 as the fluid streams F1-F2 traverse the heater-cooler 400. The polarity of electric power provided to the first thermoelectric circuit zone 402 of the heater-cooler 400 causes thermal energy to be directed from the main fluid stream F1 to the working fluid stream F2. In some embodiments, the working fluid stream F2 is in thermal communication with a heat sink, such as, for example, an auxiliary radiator. In alternative embodiments, the controller can cause the working fluid stream F2 to be directed to a target compartment along with the main fluid stream F1 when the demisting mode is selected.

In the demisting mode, the second thermoelectric circuit zone 408 of the heater-cooler 400 heats the main fluid stream F1 after the fluid has passed through the first heat exchange zone 404 and while the fluid flows through the second heat exchange zone 410 of the main fluid conduit. The controller causes a power supply to provide electric power in a second polarity (or heating polarity) via a second electrical circuit E3-E4 connected to the second thermoelectric circuit zone 408. The working fluid stream F2 flowing through the second heat exchange zone 412 of the working fluid conduit is in thermal communication with the low temperature side of the second thermoelectric circuit zone 408. When the direction of working fluid stream F2 flow is counter to the direction of main fluid stream F1 flow, the working fluid stream F2 passes through the second heat exchange zone 412 before flowing to the first heat exchange zone 406 of the working fluid conduit. The polarity of electric power provided to the second thermoelectric circuit zone 408 of the heater-cooler 400 causes thermal energy to be directed from the working fluid stream F2 to the main fluid stream F1.

When a heating mode of operation is selected, one or both of the first and second thermoelectric circuit zones 402, 408 of the heater-cooler 400 heat the main fluid stream F1 flowing through the first and second heat exchange zones 404, 410 of the main fluid conduit. A controller causes a power supply to provide electric power in a heating polarity via first and second electrical circuits E1-E4 connected to the thermoelectric circuit zones 402, 408. The working fluid stream F2 flowing through the first and second heat exchange zones 406, 412 transfers heat to the low temperature side of the thermoelectric circuit zones 402, 408. In some embodiments, a controller causes the working fluid stream F2 to be in thermal communication with a heat source, such as, for example, power train coolant, when the heating mode is selected. The polarity of electric power provided to the first and second thermoelectric circuit zones 402, 408 of the heater-cooler 400 causes thermal energy to be directed from the working fluid stream F2 to the main fluid stream F1. In some embodiments, electric power is provided to only one of the thermoelectric circuit zones 402, 408 when it is determined that the main fluid stream F1 can reach a desired temperature without both thermoelectric circuit zones 402, 408 being active.

When a cooling mode of operation is selected, the first and second thermoelectric circuit zones 402, 408 of the heater-cooler 400 both cool the main fluid stream F1 flowing through the first and second heat exchange zones 404, 410 of the main fluid conduit. A controller causes a power supply to provide electric power in a cooling polarity via first and second electrical circuits E1-E4 connected to the thermoelectric circuit zones 402, 408. The working fluid stream F2 flowing through the first and second heat exchange zones 406, 412 removes heat from the high temperature side of the thermoelectric circuit zones 402, 408. In some embodiments, a controller causes the working fluid stream F2 to be in thermal communication with a heat sink, such as, for example, an auxiliary radiator, when the cooling mode is selected. The polarity of electric power provided to the first and second thermoelectric circuit zones 402, 408 of the heater-cooler 400 causes thermal energy to be directed from the main fluid stream F1 to the working fluid stream F2. In some embodiments, electric power is provided to only one of the thermoelectric circuit zones 402, 408 when it is determined that the main fluid stream F1 can reach a desired temperature without both thermoelectric circuit zones 402, 408 being active.

Figure 17:
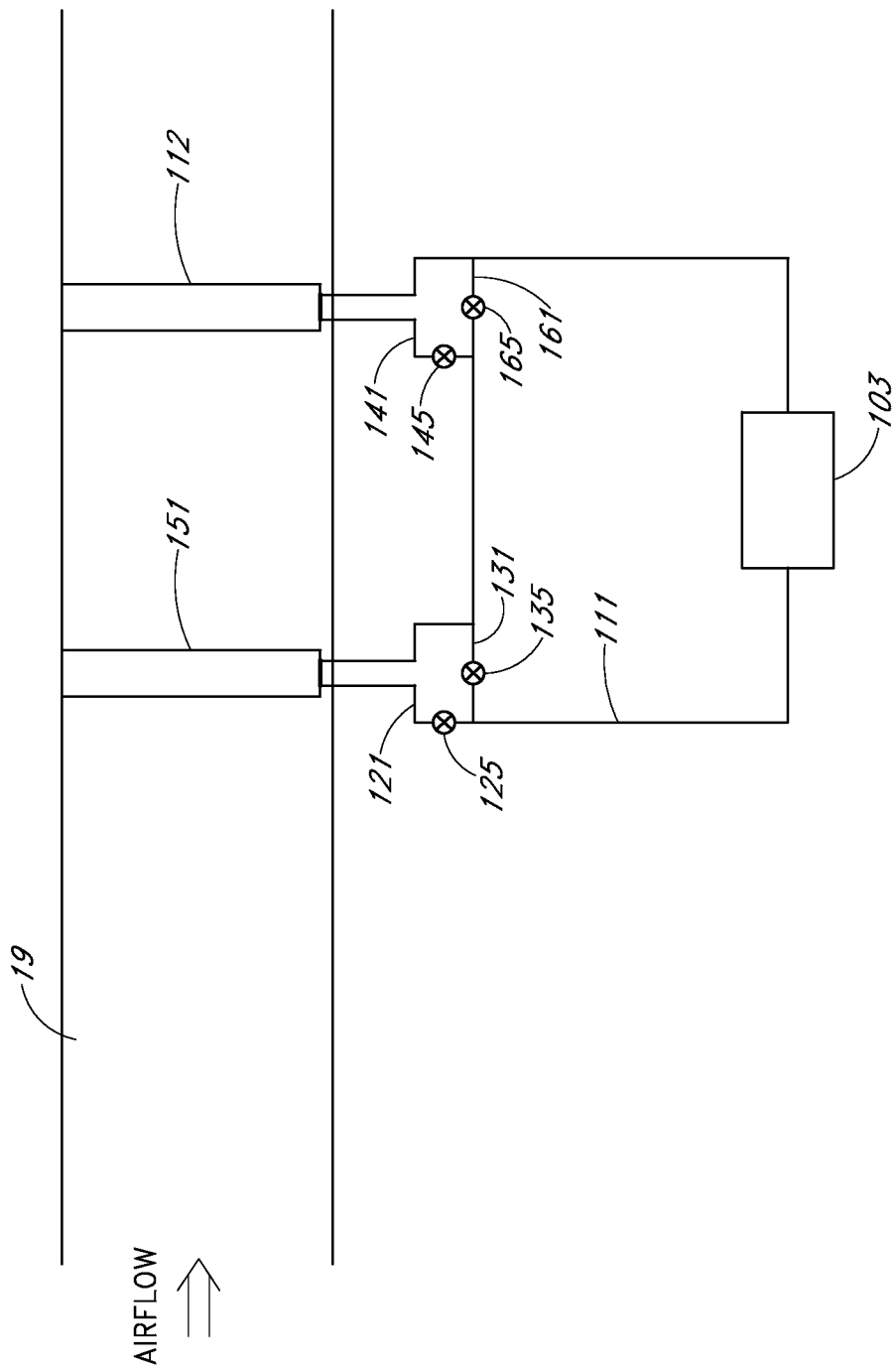
FIG. 17 is a schematic illustration of an embodiment of a temperature control system.

Referring now to FIG. 17, illustrated is an embodiment of a temperature control system including an engine 103 (and/or other heat generating system, such as for example, a battery, an electronic device, an internal combustion engine, an electric motor, an exhaust of a vehicle, a heat sink, a heat storage system such as a phase change material, a positive temperature coefficient device, and/or any heat generating system that is known or later developed), a thermoelectric device (TED) 112, a heat transfer device 151, and a passenger air channel 19. The heat transfer device 151 is disposed in the passenger air channel 19. In the illustrated embodiment, the TED 112 is a liquid-to-air heat transfer device. Thus, at least a portion of the TED 112 can also be disposed within the passenger air channel 19. The passenger air channel 19 can be configured such that comfort air can pass through the channel 19 and be in thermal communication with the heat transfer device 151 and the TED 112. In some embodiments, an air handling unit (e.g., a fan) is configured to convey the airflow. At least some of the components of the system can be in fluid communication via thermal energy transport means such as fluid conducting tubes, for example. Actuators, such as valves 125, 135, 145, and 165 can be used to control the thermal energy transfer through the tubing. A control device, such as a controller can be configured to control the various components of the system and their relative fluid communication.

In the illustrated embodiment, in a first mode, when valves 135 and 145 are open and valves 125 and 165 are closed, there is thermal communication between the TED 112 and the engine 103. In a first circuit, or thermal source circuit comprising circuit lines 111, 131, and 141, a fluid, such as coolant, is circulated and thermal energy is transferred between the engine 103 and the TED 112. The TED 12 is provided with electrical energy of a specific polarity that allows it to transfer thermal energy between the first circuit and the passenger air channel 19. In the first mode, the TED 112 pumps thermal energy from the first circuit to the airflow of the passenger air channel 19.

In a second mode, valves 135 and 145 are closed and valves 125 and 165 are open. The circulating fluid permits thermal communication between the engine 103 and the heat transfer device 151. In a second circuit, or bypass circuit comprising circuit lines 111, 121, and 161, a fluid, such as coolant, is circulated and thermal energy is transferred between the engine 103 and the heat transfer device 151. The TED 12 is bypassed and is no longer in thermal communication with the engine 103. In this mode of operation, fluid flow is stopped in the thermal circuit 141 and electrical energy is not supplied to the TED 112. In some embodiments, the system can switch between the first mode and the second mode of operation. In some embodiments, a low temperature core (not shown) can be operatively connected or selectively operatively connected to the thermal circuit 111 and used to transfer thermal energy to ambient air from the heat transfer device 151, the TED 112, and/or other elements of the temperature control system. For example, the low temperature core could be connected parallel to or in place of the engine 103 in at least some modes of operation.

The TED 112 can include one or more thermoelectric elements that transfer thermal energy in a particular direction when electrical energy is applied. When electrical energy is applied using a first polarity, the TED 112 transfers thermal energy in a first direction. Alternatively, when electrical energy is applied using a second polarity opposite the first polarity, the TED 112 transfers thermal energy in a second direction opposite the first direction. The TED 112 can be configured to transfer thermal energy to airflow of the passenger air channel 19 when electrical energy of a first polarity is applied by configuring the system such that the heating end of the TED 112 is in thermal communication with the passenger air channel 19. Further, the cooling end of the TED 112 can be in thermal communication with the engine 103 so that the TED 112 draws thermal energy from the circuit to which the engine is connected. In certain embodiments, a control system (not shown) regulates the polarity of electrical energy applied to the TED 112 to select between a heating mode and a cooling mode. In some embodiments, the control system regulates the magnitude of electrical energy applied to the TED 112 to select a heating or cooling capacity.

Figure 18:
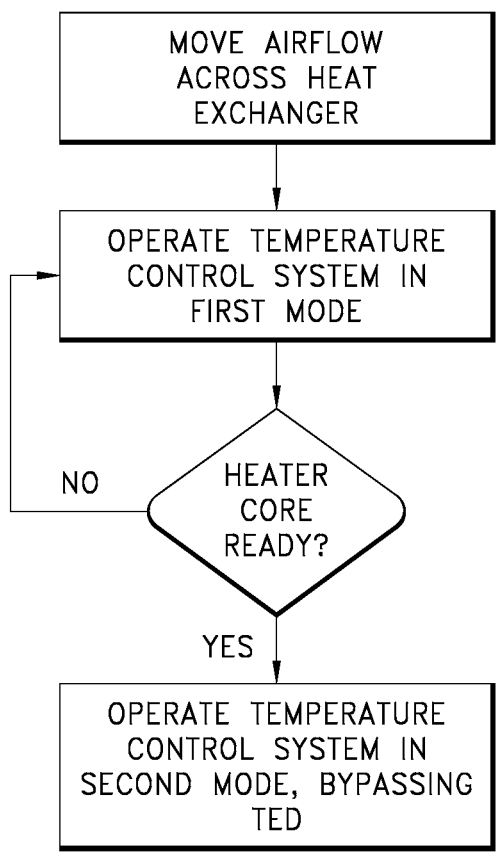
FIG. 18 is a flowchart related to an embodiment of a temperature control system with a bypassable TED.

FIG. 18 illustrates a method of controlling temperature in a passenger compartment of a vehicle. The method includes moving airflow across a heat exchanger. The airflow can travel through one or more passenger air channels, such as ducts, before entering the passenger compartment. Initially, the control system operates in a first mode, in which a TED pumps thermal energy from a heat source to an passenger air channel. The control system continues to operate in the first mode until one or more switching criteria are met. When the one or more criteria are met the control system switches to a second mode of operation. In one embodiment, the control system switches to the second mode when coolant circulating through an engine or another heat source is ready to heat the airflow. In the second mode thermal energy is transferred from the engine or other heat source to the heat exchanger. The TED is bypassed and is not in substantial thermal communication with the heat source or the heat exchanger. In this configuration, a fluid, such as coolant, flows through a bypass circuit so that thermal energy transfer occurs in the bypass circuit. The system can also operate one or more actuators, such as valves, in order to cause the fluid flow to bypass the TED. In one embodiment, a controller controls valves to switch between modes of operation. In the second mode of operation, the heat exchanger can act much the same as a heater core in a conventional vehicle HVAC system.

The one or more criteria for switching modes of operation can be any suitable criteria and are not limited to characteristics of the vehicle or temperature parameters. In some embodiments, the criteria for switching the fluid flow include one or more of the following: algorithms, user action or inaction, the temperature of a thermal energy source, fluid temperature, an amount of time elapsed, and air temperature. In certain embodiments, the criteria can also be user-specified or user-adjusted according to preference. In one embodiment, switching from a first mode to a second mode occurs when the engine reaches a threshold temperature. In another embodiment, the switch occurs when a fluid circuit reaches a threshold temperature. In yet another embodiment, the switch occurs when the air temperature reaches a threshold temperature.

Figure 19:
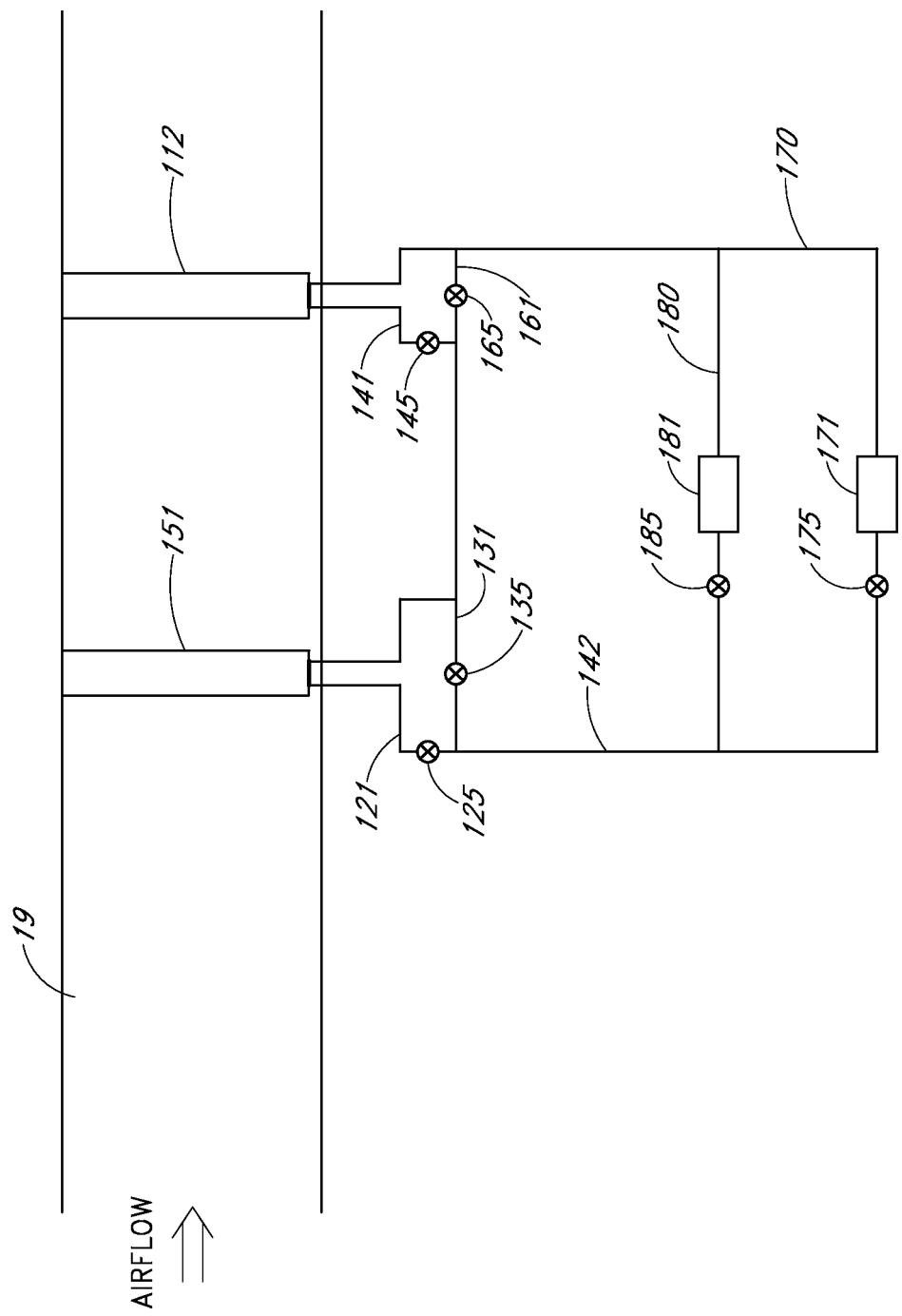
FIG. 19 is a schematic illustration of an embodiment of a temperature control system including a cooling circuit and a heating circuit.

Referring to FIG. 19, an embodiment of a temperature control system is illustrated which can be configured to heat and cool an airflow in a passenger air channel 19. The system comprises a TED 112, a heat transfer device 151, a low temperature core, or heat sink 171, a thermal energy source 181, and a plurality of actuators 125, 135, 145, 165, 175, 185. The plurality of actuators can restrict fluid or coolant flow through circuits as discussed herein. The heat transfer device 151 is disposed in the passenger air channel 19. The TED 112, illustrated as a liquid-to-air embodiment, can also be disposed in the passenger air channel 19. The passenger air channel 19 is configured such that an airflow may pass through the channel 19 and be in thermal communication with the heat transfer device 151 and the TED 112. In some embodiments, an air handling unit (e.g., a fan) is configured to convey the airflow. The system further comprises a heat sink circuit 170 which includes the low temperature core 171 and at least one valve 175. The TED 112 is in thermal communication with the heat sink circuit 170 via a working fluid circuit 142. The system also comprises a heat source circuit 180 which includes the thermal energy source 181 and at least one valve 185. The TED 112 is in thermal communication with the heat source circuit 180 via a working fluid circuit 142. Some embodiments also comprise a thermal transfer circuit 121 including the heat transfer device 151 and at least one valve 125. Heat is transferred between the airflow and the heat transfer device 151 and the TED 112. In one embodiment, the thermal energy source 181 is an automobile engine and the low temperature core 171 is a radiator. In some embodiments, the thermal energy source can include a battery, an electronic device, an internal combustion engine, an exhaust of a vehicle, a heat sink, a heat storage system such as a phase change material, a positive temperature coefficient device, and/or any heat generating system that is known or later developed. It is also contemplated that pumps can be configured to function with the system in order to cause fluid flow. In some embodiments, micro-hybrid and/or hybrid vehicles can implement electric pumps (e.g., water pumps) to provide working fluid circulation, either replacing a conventional belt driven pump or substituting the conventional belt driven pump while the engine is stopped.

The following description illustrates versatility of the embodied system where just the TED 112 can be used for both heating and cooling. The system may be configured for operation in different modes by operating at least one of the valves 175 and 185, which causes coolant to flow through the heat source circuit 180 or the heat sink circuit 170 depending on whether a heating or cooling mode is selected. In a heating mode, opening valve 185 and closing valve 175 causes coolant to flow through the heat source circuit 180 and not through the heat sink circuit 170. In this mode, the TED 112 operates in a first polarity and is configured to transfer thermal energy from the heat source circuit 180 the airflow of the passenger air channel 19. The heat transfer device 151 can also be operated with the TED 112 to further enhance heat transfer by opening valve 125 and closing valve 135. In some embodiments, the heat transfer device 151 can be operated without the TED 112 as described previously.

In a cooling mode, closing valve 185 and opening valve 175 causes coolant to flow through the heat sink circuit 170 and not through the heat source circuit 180. In this mode, the TED 112 operates in a second polarity, which is opposite the first polarity, and is configured to transfer thermal energy from the passenger air channel 19 to the heat sink circuit 170, which lowers the temperature of the airflow by transferring thermal energy from the airflow to the heat sink circuit 170.

Figure 20:
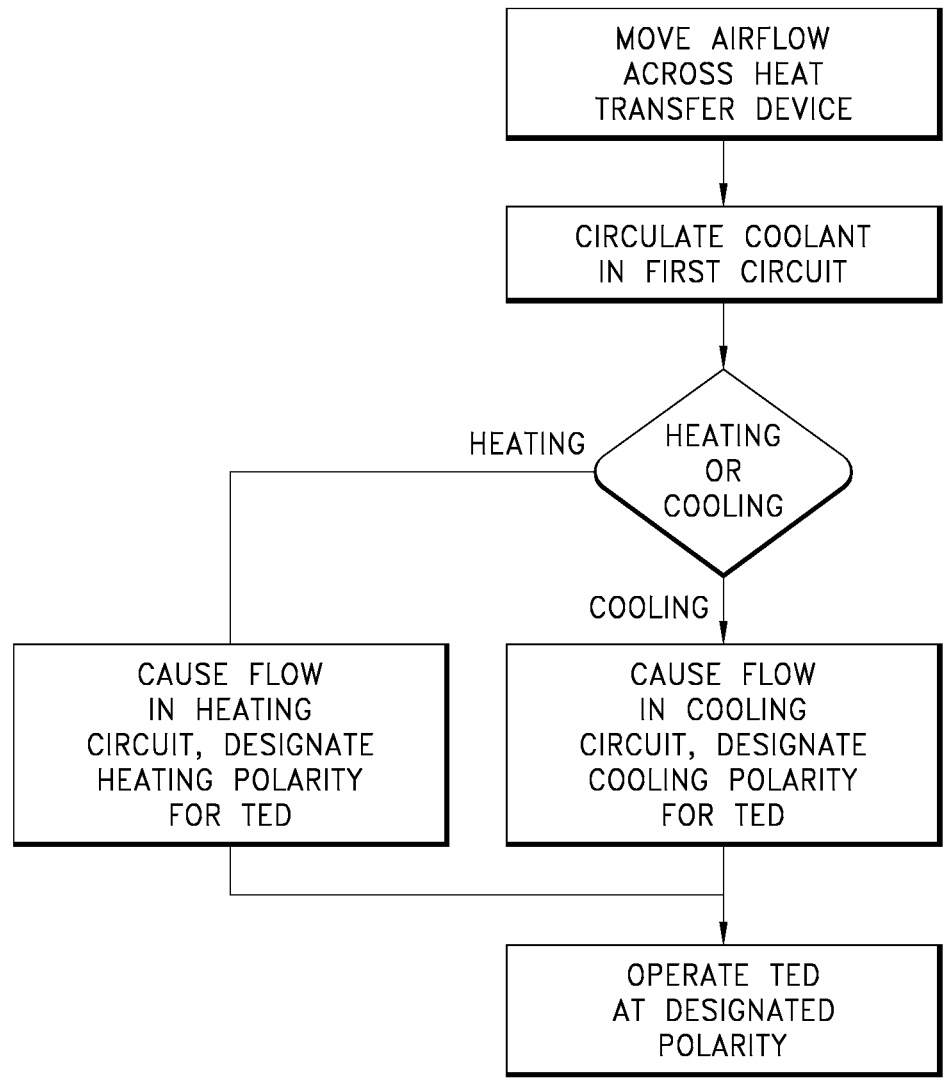
FIG. 20 is a flowchart related to the embodiment of a temperature control system illustrated in FIG. 14.

FIG. 20 illustrates another embodiment of a method of operation for a temperature control system, in which the embodiment of the system illustrated in FIG. 19 could follow, utilizing a TED for heating and cooling. In this embodiment, an airflow moves across a heat transfer device and TED, and into a passenger compartment. In certain embodiments, the system circulates a fluid, such as coolant, in a first circuit, or heat transfer circuit, which is in thermal communication with the heat transfer device and/or a thermoelectric device (TED). The system receives an indication as to whether a heating mode or a cooling mode is selected. If the heating mode is selected, then the system causes fluid to flow in a heat source circuit which is in thermal communication with a thermal energy source, heat transfer device, and/or TED. In the heating mode, the TED transfers thermal energy between the heat source circuit and the passenger air channel. A heat transfer device can also be utilized to complement or substitute the functions of the TED. If the cooling mode is selected, then the system causes fluid to flow in the heat sink circuit which is in thermal communication with a low temperature core and the TED. In the cooling mode, the TED transfers thermal energy between the heat sink circuit and passenger air channel. The system designates a selected polarity based on whether the heating mode or cooling mode is selected and electrical energy of the selected polarity is provided to the TED. In the heating mode, a polarity is selected that causes the TED to transfer thermal energy from the heat source circuit to passenger air channel. In the cooling mode, a polarity is selected that causes the TED to transfer thermal energy from passenger air channel to the heat sink circuit.

As discussed in relation to the embodiment of the system illustrated in FIG. 19, the heat sink circuit and the working fluid circuit can include actuators which can be used to control the flow of fluid or coolant within the system. In one embodiment, the system causes fluid to flow through the heat sink circuit by operating an actuator associated with the heat source circuit. In another embodiment, the system can cause fluid to flow through the heat sink circuit by operating an actuator associated with the heat sink circuit. Further, in some embodiments, an actuator associated with the heat sink circuit can be opened and an actuator associated with the heat source circuit can be closed in order to cause fluid to flow in the heat sink circuit. It is also contemplated that a plurality of pumps can be configured to function with the working fluid circuit, heat source circuit, and the heat sink circuit in order to facilitate fluid flow.

Figure 21:
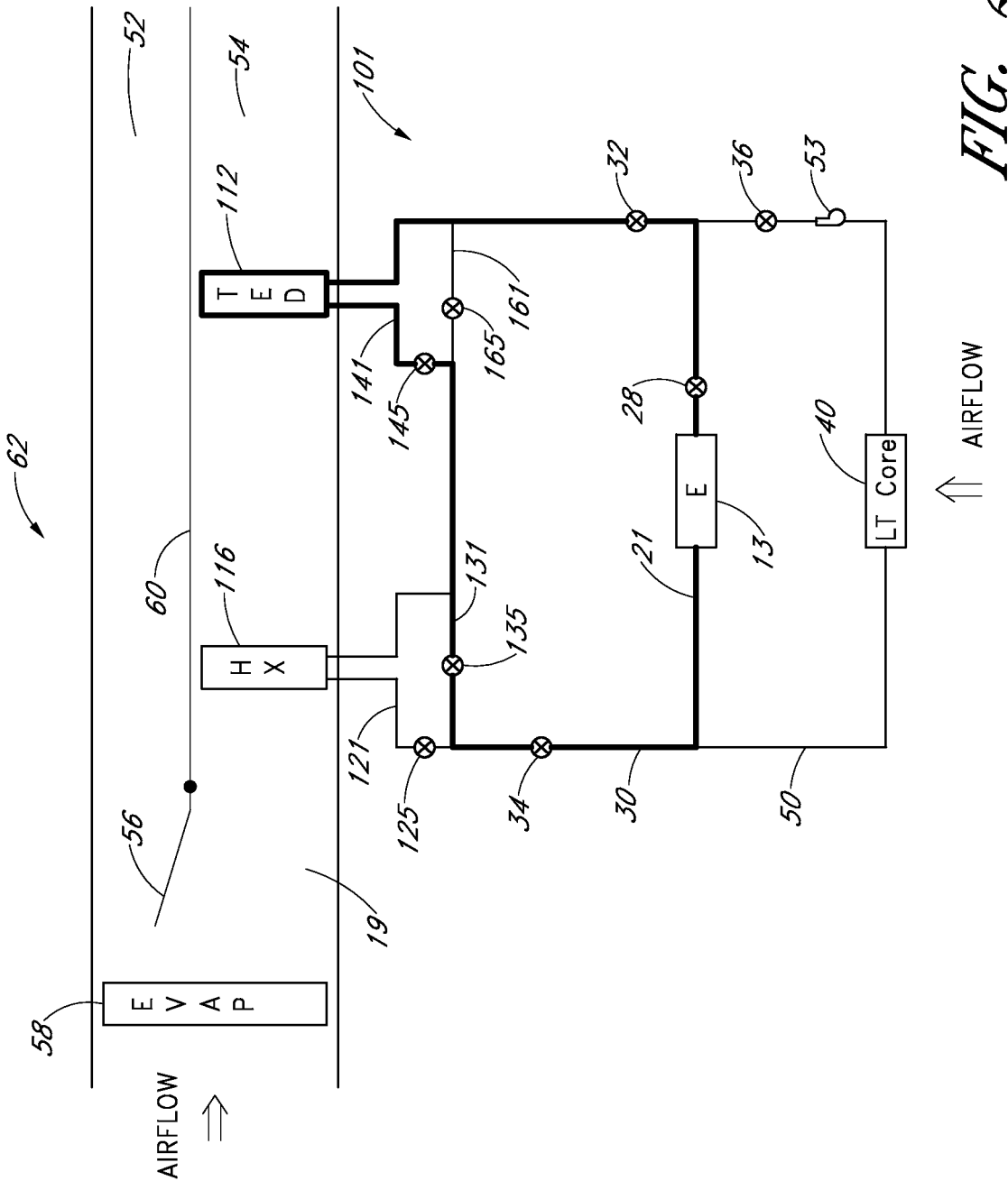
FIG. 21 is a schematic illustration of an embodiment of a temperature control system in a heating mode.

FIG. 21 illustrates an embodiment of a temperature control system 101 used for providing temperature controlled air to a passenger compartment. In this embodiment, the system 101 comprises a thermoelectric device (TED) 112, an engine 13, a heat transfer device, such as a heat exchanger 116, and a passenger air channel 19, part of an HVAC system 62. In some embodiments, the system 101 additionally comprises a low temperature core 40. The system 101 further comprises one or more pumps 53 and actuators 28, 32, 34, 36, 125, 135, 145, and 165 that are configured to transfer fluid, such as coolant, among the different components and inhibit (or restrict) fluid communication and/or thermal communication among different components. The engine 13 can be any type of vehicle engine, such as an internal combustion engine, that is a source of thermal energy. In some embodiments, the engine 13 can be any heat generating system such as a battery, an electronic device, an exhaust of a vehicle, a heat sink, a heat storage system such as a phase change material, a positive temperature coefficient device or any heat generating system that is known or later developed. The system 101 can be controlled by a controller, plurality of controllers, or any other device which can function to control the pumps, valves, heat source, TED, and other components of the system 101. By controlling the components, valves and pumps, the controller can operate the system 101 in various modes of operation. The controller can also change the mode of the system 101 in response to input signals or commands.

In one embodiment, a fluid such as a liquid coolant transfers thermal energy among the system 101 components and is controlled by one or more pumps. The liquid coolant can carry the thermal energy via a system of tubes that provide fluid communication among the various components. The actuators can be used to control which components are in thermal communication with the heat exchanger 116 and/or the TED 112 at a given time. Alternatively, a temperature control system might use other materials or means to provide thermal communication among components.

In this embodiment, the system 101 uses a single heat exchanger 116 and single TED 112, which allows for minimal impact on the HVAC design because it can maintain a typical configuration without the need for an additional heat exchangers. However, it is also contemplated that the system 101 could be configured with a plurality of heat exchangers, TEDS, and/or a plurality of HVAC systems or airflow channels. In some embodiments, the system 101 can combine heat exchangers and other components into a single heat exchanger for minimal impact on the HVAC design. For example, it is contemplated that the heat exchanger 116 and TED 112 can be a single heat exchanger. In some embodiments, working fluid circuits can be arranged such that a single heat exchanger is thermally connected to both an engine and a thermoelectric device that is removed from the air channel 19, as further discussed in U.S. application Ser. No. 12/782,569, filed May 18, 2010, the entire contents of which is incorporated by reference and made a part of this specification. Depending on the mode of the system 101, the heat exchanger 116 and/or TED 112 may be in thermal communication with the engine 13. Further depending on the mode of the system 101, the TED may be in thermal communication with the low temperature core 40. In a heating mode, the heat exchanger 116 and/or the TED 112 may be in thermal communication with the engine 13. In a cooling mode, the heat transfer device 116 and/or the TED 112 may be in thermal communication with the low temperature core or radiator 40.

Also illustrated in FIG. 21 is an embodiment of the HVAC system 62 through which an airflow passes before entering the passenger compartment. In this embodiment, the heat transfer device 116 and the TED 112 are functionally coupled to or disposed within the HVAC system 62 so that they can transfer thermal energy to or from the airflow. The airflow in the HVAC system 62 can flow through one or more channels 52, 54 separated by a partition 60. In certain embodiments, the first and second channels 52, 54 are of the same approximate size (e.g., same approximate height, length, width, and/or cross-sectional area). In other embodiments, the first and second channels 52, 54 are of differing sizes, as illustrated in FIG. 21. For example, the width, height, length, and/or cross-sectional area of the first and second channels 52, 54 can be different. In some embodiments, the first channel is larger than the second channel. In other embodiments, the first channel is smaller than the second channel. In further embodiments, additional partitions may be used to create any number of channels or conduits. The partitions may be of any suitable material, shape, or configuration. The partitions can serve to partially or completely separate the conduits or channels and may have apertures, gaps, valves, blend doors, other suitable structures, or a combination of structures that allow for fluid communication between channels. At least a portion of the partition can thermally insulate the first channel 52 from the second channel 54.

In certain embodiments, the HVAC system 62 comprises a first movable element configured to be operable to control the airflow passing through the first and second channels 52, 54. For example, a blend door 56 can be configured to control the airflow passing through the channels 52, 54. The blend door can be rotatably coupled proximate the entrance of the channels 52, 54. By rotating, the blend door can control the airflow through the channels 52, 54. The blend door 56 can selectively modify, allow, impede, or prevent airflow through one or both of the first and second channels 52, 54. Preferably, the blend door 56 can prevent airflow through one of the channels while directing all of the airflow through the other channel. The blend door 56 can also allow airflow through both channels in varying amounts and ratios. In some embodiments, the blend door 56 is coupled to the partition 60 and rotates relative to the partition 60. It is also contemplated that more than one blend door could be used in the HVAC system 62 in order to direct airflow and improve heating and/or cooling of the airflow.

In some embodiments an evaporator 58 may be disposed in the HVAC system 62 in the path of the airflow in order to remove moisture from the airflow before it enters the passenger compartment. In some embodiments, the evaporator 58 may be positioned before the channels 52, 54 so that it may condition the entire airflow. In other embodiments the evaporator may be positioned within one of the channels so that it may condition only the airflow in a certain channel.

Other devices such as condensers can also be used to prepare or cool the airflow before it enters the passenger compartment.

In some embodiments, the system 101 works in different modes including a first mode, or a heating mode, corresponding to a period of time while the engine is warming up ("startup heating mode"); a second mode, or a heating mode, corresponding to a period of time when the engine is still warming up, but is sufficiently warm to aid in heating airflow ("warm up engine heating mode," or "warm up heating mode," or "supplemental heating mode"); a third mode, or a heating mode, corresponding to a period of time when the engine is sufficiently warm ("warm engine heating mode," "warm heating mode," or "heating mode"); and a fourth mode for cooling the passenger compartment ("cooling mode" or "supplemental cooling mode"). In some embodiments, a single system can perform each of the various modes, but it is also contemplated that embodiments of the invention can be configured to perform only one of the modes described below. For example, one embodiment might be configured to only perform the mode of providing thermal energy from the thermoelectric device while the engine warms. Another embodiment might be configured to only provide cooling as described in the cooling mode.

In some embodiments, the system 101 can also work in other modes for a micro-hybrid or hybrid systems. The system 101 can work in a fifth mode, or a "stop cold heating mode," corresponding to a period of time when the engine temperature drops and the coolant temperature correspondingly drops below a first predetermined threshold (e.g. engine is cold and engine (and/or coolant) temperature drops below a first temperature threshold); a sixth mode, or a "stop heating mode" or "stop cooled heating mode" corresponding to a time period when the engine temperature drops and the coolant temperature correspondingly drops below a second predetermined threshold, but is sufficiently warm to aid in heating airflow (e.g., engine is warmed up and engine (and/or coolant) temperature is between the first temperature threshold and a second temperature threshold); a seventh mode, or a "stop warm heating mode," corresponding to a time period when the engine temperature is above and the coolant temperature correspondingly (e.g., engine is warm the engine (and/or coolant) temperature is above the second temperature threshold). The second predetermined threshold can correspond to a temperature of the coolant sufficient to provide the desired amount of heating to the airflow. In some embodiments, a single system can perform each of the various modes, but it is also contemplated that embodiments of the invention can be configured to perform only one of the modes described below. For example, one embodiment might be configured to only perform the mode of providing thermal energy from the thermoelectric device when coolant temperature is below the first predetermined threshold.

FIG. 21 illustrates an embodiment of a temperature control system 101 in the first mode, which may also be referred to as the "startup heating mode." In this mode, heat is provided to the passenger compartment while the engine 13 is warming up and has not yet reached a temperature sufficient to heat the passenger compartment (e.g., the engine temperature is below a first temperature threshold). When the engine 13 is first started, it does not generate enough heat to sufficiently increase the temperature within the passenger compartment. A vehicle engine can take several minutes or more to warm up to the necessary temperature to provide comfort air to the passenger compartment. In this mode, a controller provides electrical energy to the TED 112 which generates a thermal gradient and transfers heat from the heating end of the TED 112 to the air channel 54. Liquid coolant within the working fluid circuit 30 and thermal circuit 141 is moved through the circuits by a pump within the engine 13 (not illustrated). In alternative embodiments, a pump can be located outside the engine 13. Valve 145 is open and the working fluid circuit 30 is in fluid communication with the TED 112 via thermal circuits 131 and 141, which thermally connects the TED 112 and the engine 13 via thermal circuit 21. Valves 125, 165, and 36 can be closed during the startup heating mode. In some embodiments, the low temperature core 40 is not needed during the startup heating mode because the airflow into the passenger compartment is being heated.

FIG. 21 also illustrates an embodiment of a temperature control system 101 in the fifth mode, which may also be referred to as the "stop cold heating mode" in, for example, a micro-hybrid or hybrid vehicle. When the engine 13 is stopped in a micro-hybrid or hybrid system, the engine 13 will cool while stopped. As the engine 13 cools, the liquid coolant temperature will correspondingly drop. In this mode, heat is being provided to the passenger compartment when the temperature of the engine 13 drops and is insufficient to heat the passenger compartment (e.g., the engine temperature is below a first (or second) temperature threshold). In this mode, a controller provides electrical energy to the TED 112 which generates a thermal gradient and transfers heat from the heating end of the TED 112 to the air channel 54. Liquid coolant within the working fluid circuit 30 and thermal circuit 141 is moved through the circuits by a pump (e.g., electric pump) within the engine 13 (not illustrated). In alternative embodiments, a pump can be located outside the engine 13. Valve 145 is open and the working fluid circuit 30 is in fluid communication with the TED 112 via thermal circuits 131 and 141, which thermally connects the TED 112 and the engine 13 via thermal circuit 21. Valves 125, 165, and 36 can be closed during the stop cold heating mode heating mode. In some embodiments, the low temperature core 40 is not needed during the stop cold heating mode because the airflow into the passenger compartment is being heated. Thus, the temperature control system 101 is able to provide a relatively longer period of time over which the engine 13 does not have to be started to heat the airflow in a micro-hybrid or hybrid system. Without the heating function being provided by the TED 112 as discussed herein, the engine 13 may need to be started for the purpose of heating the passenger compartment while the engine 13 is otherwise not needed to, for example, drive the vehicle.

The TED 112 is disposed in the HVAC system 62. In this manner, the thermal energy transferred to the airflow entering the passenger compartment by the thermoelectric device 112 is transferred to the coolant in thermal communication with the engine 13. In one embodiment, the TED 112 is the sole source of thermal energy for the airflow entering the passenger compartment and no or little thermal energy is taken from the engine 13 even though liquid coolant is circulating through the thermal circuits. Once the engine is sufficiently warm, still in the startup heating mode, thermal energy from the engine 13 is also used to heat the coolant in the working fluid circuit 30. Thus, the airflow entering the passenger compartment, after initial startup, can be receiving thermal energy from both the engine 13 and the TED 112.

In this embodiment, the HVAC system 62 can include a blend door 56 or other device that is configured to direct the airflow into different channels 52, 54 leading to the passenger compartment. In this embodiment, the heat exchanger 116 and TED 112 is located in the second channel 54. In the startup heating mode, the blend door 56 is positioned so that at least a portion of the airflow is directed through the second channel 54. In an alternative embodiment, the heat exchanger 116 and/or TED 112 may be operatively coupled to or placed within more than one channel of the HVAC system 62.

During the startup heating mode, the system 101 can be configured to provide demisting of the airflow before it enters the passenger compartment. The evaporator 58 can be configured within the HVAC system 62 so that the airflow passes through the evaporator 58, thereby cooling and removing moisture from the airflow before it is heated by heat exchanger 116 and/or TED 112.

Figure 22:
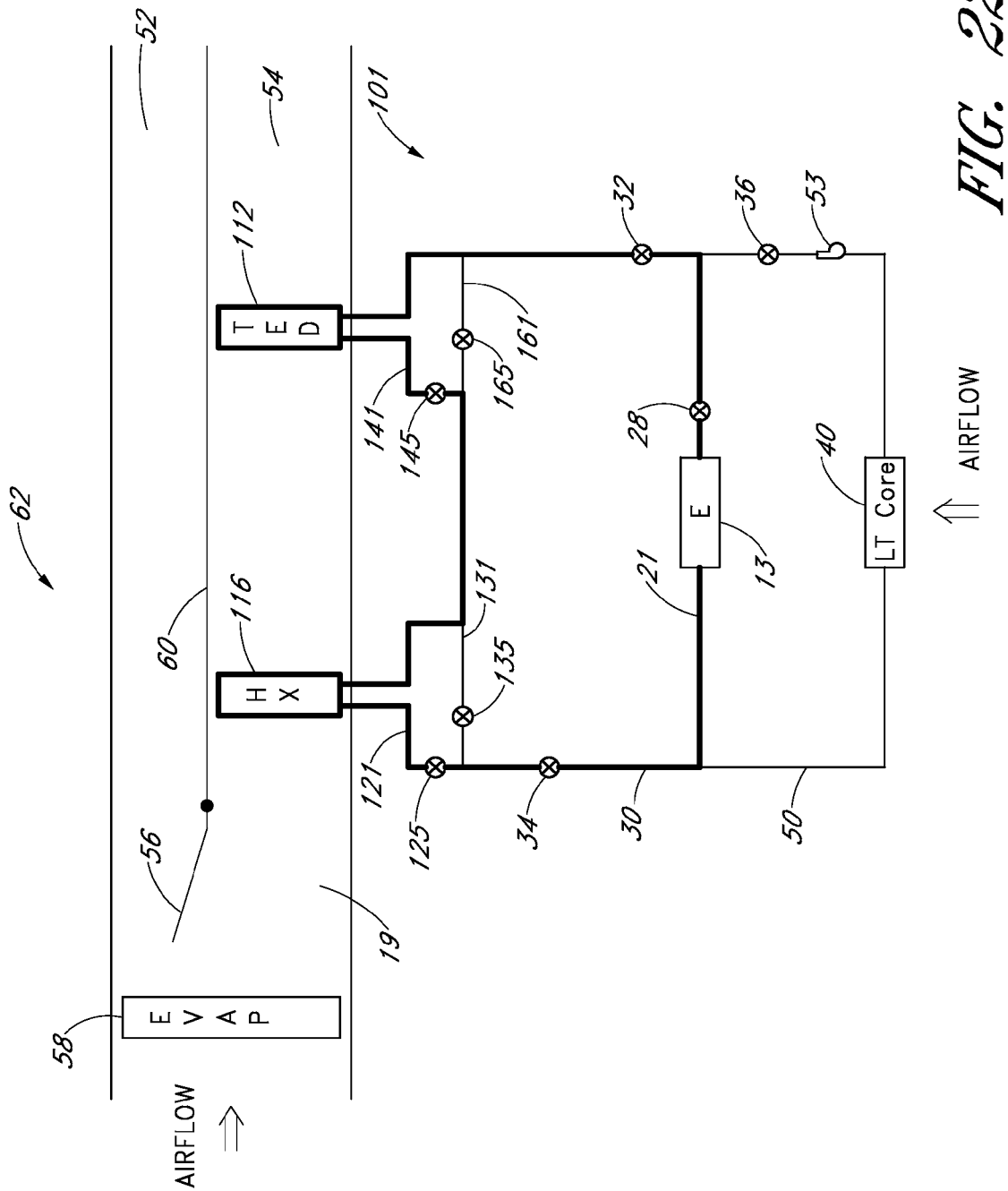
FIG. 22 is a schematic illustration of an embodiment of a temperature control system in a heating mode.

FIG. 22 illustrates an embodiment of a temperature control system 101 in a second mode, which can also be referred to as the "warm up engine heating mode" or "warm up heating mode." In this mode, the engine 13 has reached a warm up temperature that can provide some heat to the airflow, but is insufficiently warm to be the sole source of thermal energy for the system 101 (e.g., the engine temperature is between a first temperature threshold and a second temperature threshold). In this mode, the engine 13 is in thermal communication with the heat exchanger 116 and TED 112. Thermal energy from the engine 13 is transferred via coolant through the tubing (thermal circuits 21, 30, and 121) to the heat exchanger 116, moved through the circuits by a pump within or outside the engine 13 (not illustrated). Concurrently, more thermal energy can be transferred to the airflow using the TED 112 via thermal circuit 141 to supplement the thermal energy imparted from the engine 13 via the heat exchanger 116. The controller operates to open actuators 28, 32, 34, 125, and 145 (closing actuators 135 and 165) in order to allow fluid communication between the heat exchanger 116, the TED 112, and the engine 13. In some embodiments, actuator 36 is closed so that there is no coolant flow to the radiator 40. With the TED 112 in thermal communication with the engine 13 via thermal circuit 21, more of the available thermal energy of the engine 13 and coolant can be transferred to the airflow than if just the heat exchanger 116 was operating. As the engine 13 warms, the heat exchanger 116 can transfer increasingly more thermal energy to the airflow. With the TED 112 located downstream of the heat exchanger 116 in the embodiments illustrated in FIG. 23, the difference in temperature decreases between a first heat transfer surface (or main surface) of the TED 112 and a second heat transfer surface (or waste surface) of the TED 112 as the airflow flowing across the TED 112 becomes increasingly warmer, thereby enhancing the coefficient of performance of the TED 112. Positioning the TED 16 downstream of the heater core 14 can also prevent or inhibit the thermal energy transferred from the TED 16 to the airflow 18 from being absorbed by a relatively cold heater core 14 when the engine and coolant loop are relatively cold in the warm up heating mode; thus, inhibiting transfer of thermal energy from the airflow 18 into the coolant loop in the warm up heating mode. In some embodiments, the operation according to the processes described in reference to FIGS. 21 and 22 may in combination also be considered the "startup heating mode."

FIG. 22 also illustrates an embodiment of a temperature control system 101 in a sixth mode, which can also be referred to as the "stop heating mode" (or "stop cooled heating mode") in, for example, a micro-hybrid or hybrid vehicle. When the engine 13 is stopped in a micro-hybrid or hybrid system, the engine 13 will cool while stopped. As the engine 13 cools, the liquid coolant temperature will correspondingly drop. In this mode, the engine 13 and coolant can provide some heat to the airflows using residual thermal energy, but are insufficiently warm to be the sole source of thermal energy for the system 101 (e.g., the engine temperature is between a first and second temperature threshold). In this mode, the engine 13 is in thermal communication with the heat exchanger 116 and TED 112. Thermal energy from the engine 13 is transferred via coolant through the tubing (thermal circuits 21, 30, and 121) to the heat exchanger 116, moved through the circuits by a pump (e.g., electric pump) within or outside the engine 13 (not illustrated). Concurrently, more thermal energy can be transferred to the airflow using the TED 112 via thermal circuit 141 to supplement the thermal energy imparted from the engine 13 via the heat exchanger 116. The controller operates to open actuators 28, 32, 34, 125, and 145 (closing actuators 135 and 165) in order to allow fluid communication between the heat exchanger 116, the TED 112, and the engine 13. In some embodiments, actuator 36 is closed so that there is no coolant flow to the radiator 40. With the TED 112 in thermal communication with the engine 13 via thermal circuit 21, more of the available thermal energy of the engine 13 and coolant can be transferred to the airflow than if just the heat exchanger 116 was operating. Thus, the temperature control system 101 is able to provide a relatively longer period of time over which the engine 13 does not have to be started to heat the airflow in a micro-hybrid or hybrid system. Without supplemental heating (e.g., the system 101 does not have a TED 112), the engine 13 may need to be started for the purpose of heating the passenger compartment while the engine 13 is otherwise not needed to, for example, drive the vehicle.

Figure 23:
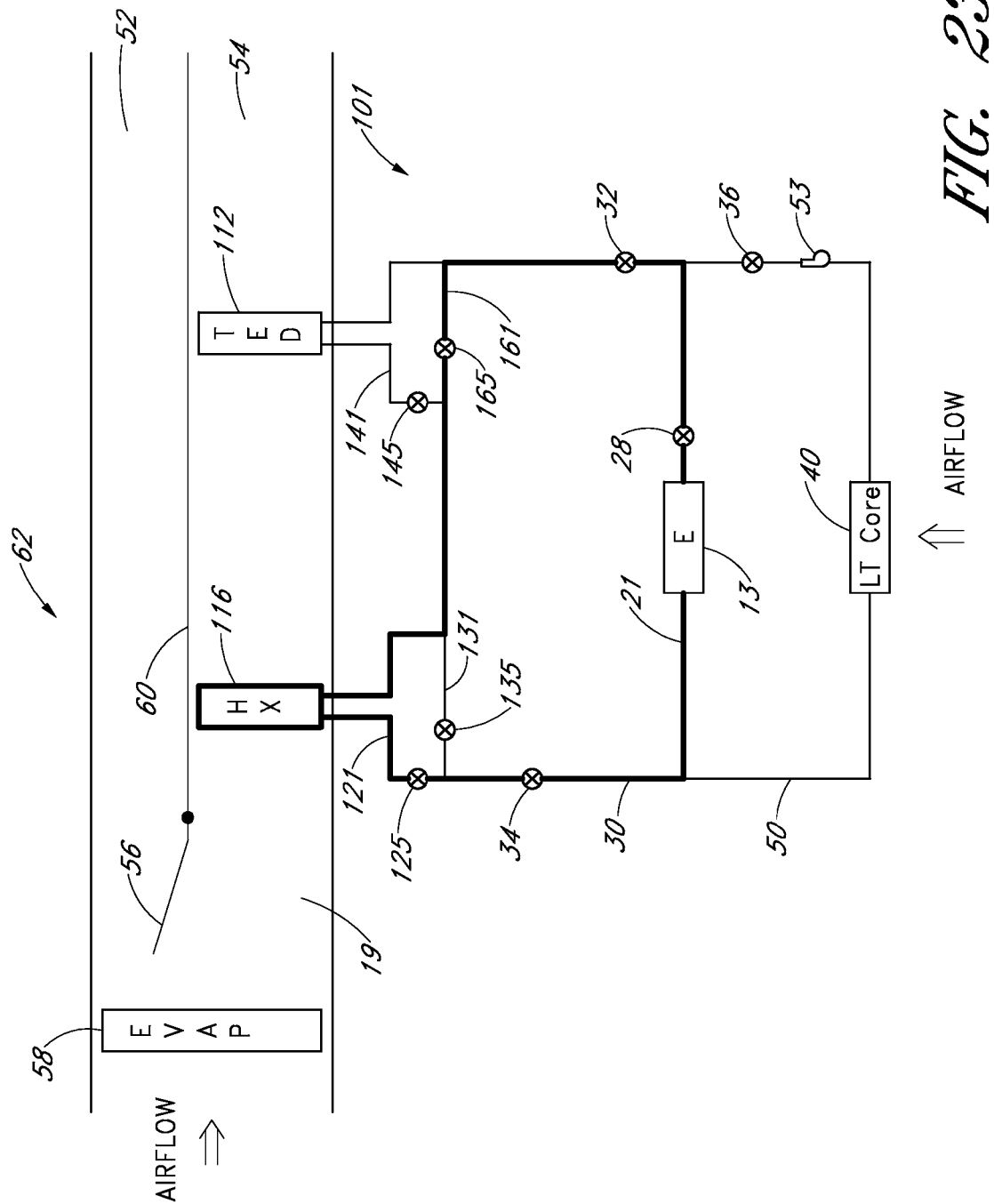
FIG. 23 illustrates schematically an embodiment of a temperature control system in a heating mode.

FIG. 23 illustrates an embodiment of a temperature control system 101 in a third mode, which can also be referred to as the "warm engine heating mode," "warm heating mode," or "heating mode." In this mode, the engine 13 has reached a sufficient temperature and is the sole source of thermal energy for the system 101 (e.g., the engine temperature is above a second temperature threshold). In this mode, the engine 13 is in thermal communication with the heat exchanger 116. Thermal energy from the engine 13 is transferred via coolant through the tubing (thermal circuits 21, 30, and 121) to the heat exchanger 116. A pump within or outside the engine 13 (not illustrated) may be configured to circulate coolant between the engine 13 and the heat exchanger 116. The controller operates to open actuators 28, 32, 34, 125, and 165 (closing actuators 135 and 145) in order to allow fluid communication between the heat exchanger 116 and the engine 13. Electric current to the TED 112 can be stopped or restricted to stop operation of the TED 112. In some embodiments, actuator 36 is closed so that there is no coolant flow to the radiator 40.

FIG. 23 also illustrates an embodiment of a temperature control system 101 in a seventh mode, which can also be referred to as the "stop warm heating mode" in, for example, a micro-hybrid or hybrid vehicle. In this mode, the engine 13 is stopped, but is of sufficient temperature to be the sole source of thermal energy for the system 101 (e.g., the engine temperature is above a second (or first) temperature threshold). When the engine 13 is stopped in a micro-hybrid or hybrid system, the engine 13 and coolant will initially have residual thermal energy. In this mode, the engine 13 is in thermal communication with the heat exchanger 116. Thermal energy from the engine 13 is transferred via coolant through the tubing (thermal circuits 21, 30, and 121) to the heat exchanger 116. A pump (e.g., electric pump) within or outside the engine 13 (not illustrated) may be configured to circulate coolant between the engine 13 and the heat exchanger 116. The controller operates to open actuators 28, 32, 34, 125, and 165 (closing actuators 135 and 145) in order to allow fluid communication between the heat exchanger 116 and the engine 13. Electric current to the TED 112 can be stopped or restricted to stop operation of the TED 112. In some embodiments, actuator 36 is closed so that there is no coolant flow to the radiator 40.

In the warm engine heating mode and/or stop warm heating mode, the controller can stop the electrical energy supplied to the TED 112. When the engine 13 is at a sufficient temperature, the TED 112 is no longer needed and the electrical energy applied to the TED 12 can be conserved. By controlling the operation of the actuators, the system 101 is able to bypass the TED 112 and thermally connect the heat exchanger 116 to the engine 13. In this embodiment, it is not necessary to have multiple heat exchangers 116 or multiple sets of heat exchangers in the passenger air channel 19. Instead, the system 101 can operate in various cooling and/or heating modes while being connected to a single heat exchanger 116 or a single set of heat exchangers, and/or a TED 112 or a single set of TEDs 112.

A blend door 56 can direct at least a portion of the airflow through a channel 54 in which the heat exchanger 116 and/or TED 112 is located so that the airflow is heated before entering the passenger compartment. To heat the passenger compartment at a slower rate, the blend door 56 can be adjusted to allow less of the airflow to pass through the heat exchanger 116 and/or TED 112 channel 54 and/or allow more of the airflow to pass through the other channel 52 which is not heated. To increase the heating rate, the blend door can be adjusted so that more of the airflow is directed through the channel 54 with the heat exchanger 16 and/or TED 112, and less of the airflow is allowed into the other channel 52.

If desired, it is also possible to use the TED 112 as a thermal energy source during the warm engine heating mode and/or stop warm heating mode. Although a warm engine 13 can typically supply enough thermal energy to the heat exchanger 116 for heating the passenger compartment, a TED 112 can be used as a supplemental thermal energy source as illustrated for FIG. 22. The actuators in the system 101 can be configured such that the engine 13 and the working fluid circuit 30 are placed in thermal communication with the heat exchanger 116 and the TED 112. Electric energy can continue to be supplied to the TED 112 so that it transfers thermal energy to airflow of the passenger air compartment. The thermal energy from the TED 112 is supplemental because the engine 13 also transfers thermal energy to the heat exchanger 116 via heated coolant moved by a pump within or outside the engine 13.

When the temperature control system 101 is in the warm engine heating mode, an evaporator 58 can be configured to remove moisture from the airflow. Therefore, demisting is possible during the entire heating process. Similar to the configuration of the startup heating mode, the evaporator 58 can be positioned in the HVAC system 62 so that the airflow passes through the evaporator 58 before being heated by the heat exchanger 116 and/or TED 112.

Figure 24:
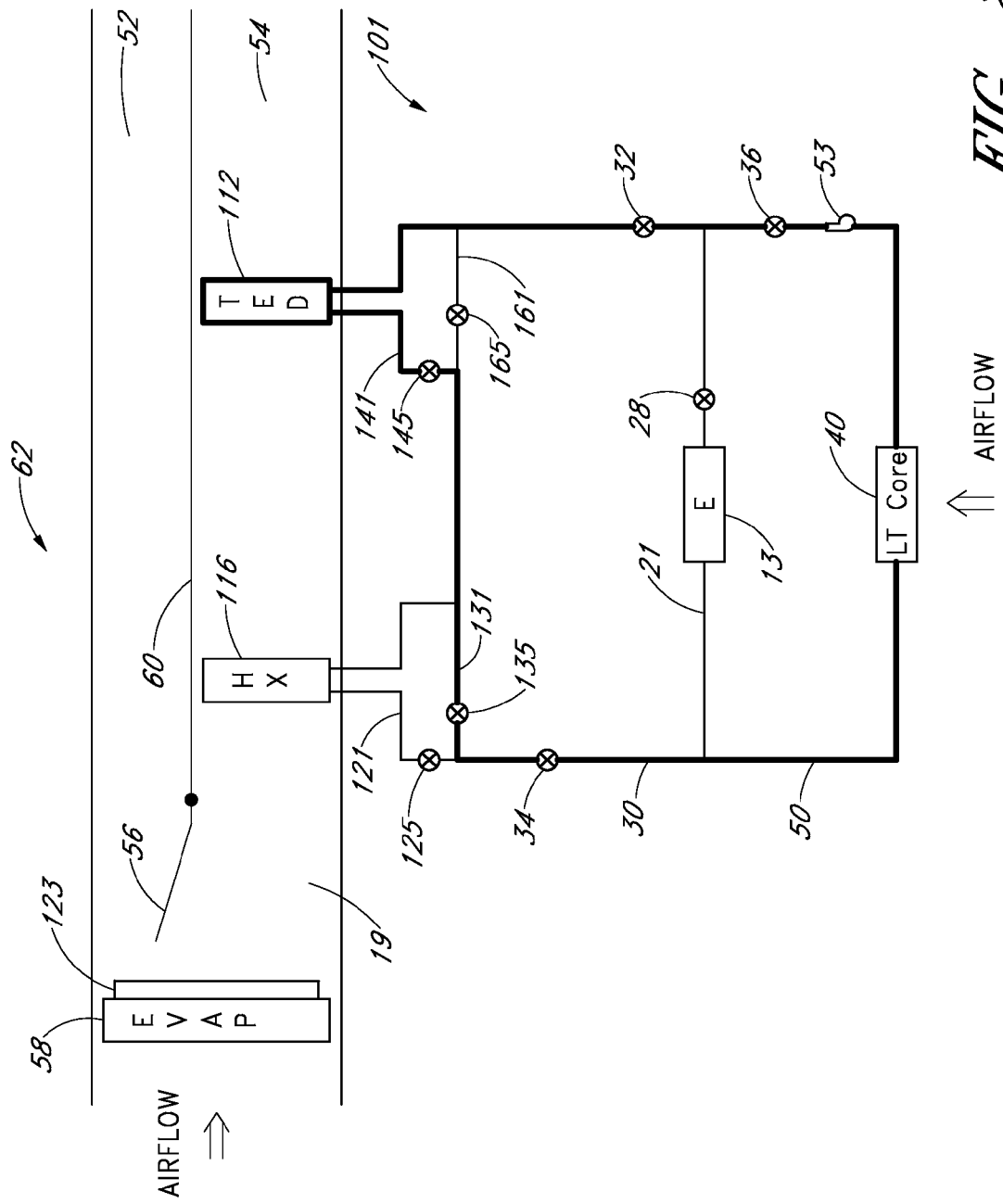
FIG. 24 illustrates schematically an embodiment of a temperature control system in a cooling mode.

FIG. 24 illustrates an embodiment of a temperature control system 101 in a fourth mode or "cooling mode." This mode can be utilized in conventional, micro-hybrid, or hybrid vehicles. By cooling in this mode as discussed herein, the engine 13 may not be necessary to cool the passenger compartment. For example, a belt driven compressor may not be necessary to provide the necessary cooling. In some embodiments, the engine 13 either remains stopped or can remain stopped for a longer period of time while in the cooling mode. The disclosed embodiments can substitute or supplement cooling provided by an electric compressor system in, for example, a hybrid vehicle. In the cooling mode, the system 101 cools the airflow in the HVAC system 62 by transferring heat from the airflow to a low temperature core 40 via the TED 112. In one embodiment, valves 32, 34, 36, 135, and 145 are opened, and valves 28 and 125 are closed. Pump 53 is engaged to allow coolant flow through the working fluid circuit 30 and cooling circuit 50, transferring thermal energy from the TED 112 via thermal circuit 141 to the low temperature core 40. The low temperature core or radiator 40 is configured to assist in cooling the airflow. As part of the system 101, a heat sink circuit or cooling circuit 50 is configured so that the TED 112 is in thermal communication with the low temperature core or radiator 40. In this configuration the engine 13 is bypassed by the coolant system and is not in thermal communication with the heat exchanger 116 or the TED 112. Thus, the cooling circuit 50 and the low temperature core 40 transfer heat from the TED 112 in an efficient manner.

The TED 112 receives electric energy with a polarity opposite the polarity used in the heating modes. When electrical energy of the opposite polarity is applied to the TED 112, the direction of the thermal gradient is reversed. Instead of providing heat or thermal energy to airflow of the passenger air channel 19, the TED 112 cools the airflow by transferring thermal energy away from the airflow to the thermal circuit 141, which is in thermal communication with thermal circuits 30 and 50 and ultimately with the low temperature core 40. The cooling circuit 50 and/or the low temperature core 40 can be located proximate the thermoelectric device 112 to provide more efficient transfer of thermal energy. Preferably, the low temperature core or radiator 40 is exposed to airflow or another source for dissipating heat. While airflow may be passing through an evaporator 58, the evaporator system (i.e., compressor-based refrigeration system) can be deactivated such that the evaporator 58 does not substantially affect the thermal energy of the airflow (e.g., the evaporator does not absorb thermal energy from the airflow).

In some embodiments, during the cooling mode, the evaporator 58 may be used as part of cooling the airflow before it enters the passenger compartment to provide a "supplemental cooling mode." In some embodiments, such as for example in hybrid vehicles, the evaporator 58 can be part of a compressor-based refrigeration system with a belt driven compressor. In some embodiments, the compressor can be an electric compressor. The evaporator 58 can be configured so that the airflow passes through it and moisture is removed before it reaches the TED 112. Also, the TED 112 can be located within one of a plurality of channels 52, 54. A blend door 56 can be configured to direct airflow into the channel 54 in which the TED 112 is located. Similar to the heating modes, in the cooling mode the blend door 56 can adjust the rate of cooling by adjusting how much air flow is allowed through the channels 52, 54. Alternatively, the TED 112 could be configured to transfer heat from the entire airflow without the use of separate channels. Thus, the TED 112 can provide supplemental cooling by absorbing thermal energy along with the evaporator 58 absorbing thermal energy from the airflow.

In some embodiments, a thermal storage device 123 is coupled to the HVAC system 101. As illustrated in FIG. 24, the thermal storage device 123 can be coupled or be part of the evaporator 58. An evaporator 58 with a thermal storage device 123 can be considered a "heavy-weight" evaporator, while an evaporator 58 without a thermal storage device 123 can be considered a "light-weight" evaporator. In a "heavy-weight" evaporator, the thermal storage device 123 can be in thermal communication with the evaporator 58 as illustrated in FIG. 24. In some embodiments, the thermal storage device 123 can be connected, inside, or a part of the evaporator 58. With a light-weight evaporator, the thermal storage device 123 can be placed anywhere along the HVAC system 101, such as for example, upstream or downstream of evaporator 58, heater exchanger 116, and/or TED 112. When the internal combustion engine is stopped as discussed herein, the thermal energy in the thermal energy storage device 123 may be utilized to provide cooling for a longer period of time without requiring the engine to start. For example, when the engine is stopped, the thermal storage device 123 may initially cool the airflow. When the thermal energy stored in the thermal storage device 123 has been absorbed by the airflow, the TED 112 may be engaged to continue cooling the airflow.

The thermal storage device 123 can be located in the first or second channel 52, 54 to provide versatility during the cooling mode. For example, the thermal storage device 123 can be located in the first channel 52. When the engine 13 is shutoff and the evaporator 58 is no longer operating, the blend door 56 can be oriented to direct all or a substantial portion of the airflow through the first channel 52 such that the thermal storage device 123 provides cooling during an initial period of the engine 13 being off. When the thermal energy stored in the thermal storage device 123 has been expanded, the blend door 56 can be oriented to direct all or a substantial portion of the airflow through the second channel 54 for the TED 112 to cool the airflow as discussed herein.

The HVAC system 101 can convert electrical power directed to the HVAC system 101 into thermal power and store this thermal power in the thermal storage device 123. One or more thermoelectric devices can be utilized to convert electrical power into thermal power, but any suitable electrical power to thermal power conversion device may be used. In order to store the thermal power, the thermal storage device 123 may contain both a high and low temperature phase change material, such as wax (a high temperature phase change material) and water (a low temperature phase change material). The HVAC system 100 can utilize the thermal storage device 123 to utilize available electrical energy from systems such as an alternator, a regenerative braking system generator, and/or a waste heat recovery system, as further discussed in U.S. application Ser. No. 11/184,742, filed Jul. 19, 2005, the entire contents of which are hereby incorporated by reference and should be considered a part of this specification. In some embodiments, a compressor-based refrigeration system may be used to store thermal energy in the thermal storage device 123 while an internal combustion engine is running and providing power to the compressor-based refrigeration system. In some embodiments, the same concepts can be applied to utilize the thermal storage device 123 during heating modes to provide longer engine stop times.

Figure 25:
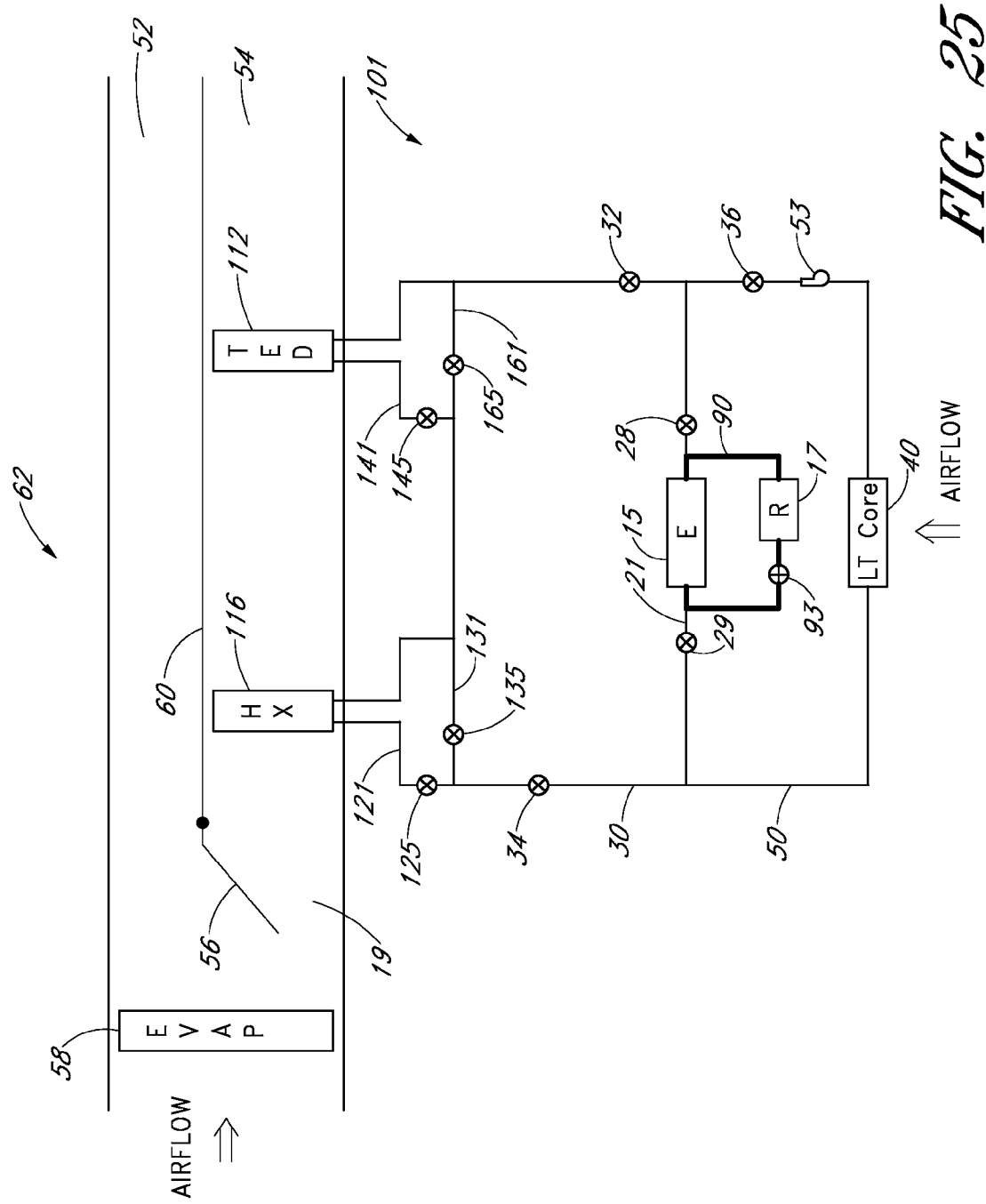
FIG. 25 illustrates an embodiment of a temperature control system in an alternative cooling mode.

FIG. 25 illustrates an alternate embodiment of a temperature control system that can be used to cool the passenger compartment of a vehicle. In this embodiment, the airflow can be cooled without the use of a heat exchanger 116 or TED 112. All of the valves can be closed and all of the pumps turned off. In this embodiment, FIG. 25 illustrates that the one thermal circuit that can still be in operation is a radiator circuit 90 that utilizes a pump inside the engine 15 to circulate the cooling fluid in the radiator circuit 90 controlled by separate temperature controls 93, which can be independent of the HVAC system 62 and the temperature control system 101. Actuators 28 and 29 are closed. In an embodiment, the radiator 17 is a separate component from the low temperature core 40. In this mode, no electrical energy is applied to the TED 112, and there is no thermal energy transfer from the engine 15 to the heat exchanger 116. Instead of using the heat exchanger as a source of heat transfer, the airflow is directed into a channel 52 and then into the passenger compartment. In one embodiment, a blend door 56 is configured to direct substantially all of the airflow into channel 52 so that the airflow does not pass through the heat exchanger 116 before entering the passenger compartment. In some embodiments, airflow may pass through an evaporator 58 before entering into the channel 52. Alternatively, an evaporator 58 may be located within the channel 52 through which the airflow passes. In this manner, the airflow is cooled without system 101 providing any heat transfer to the HVAC system 62.

Figure 26A:
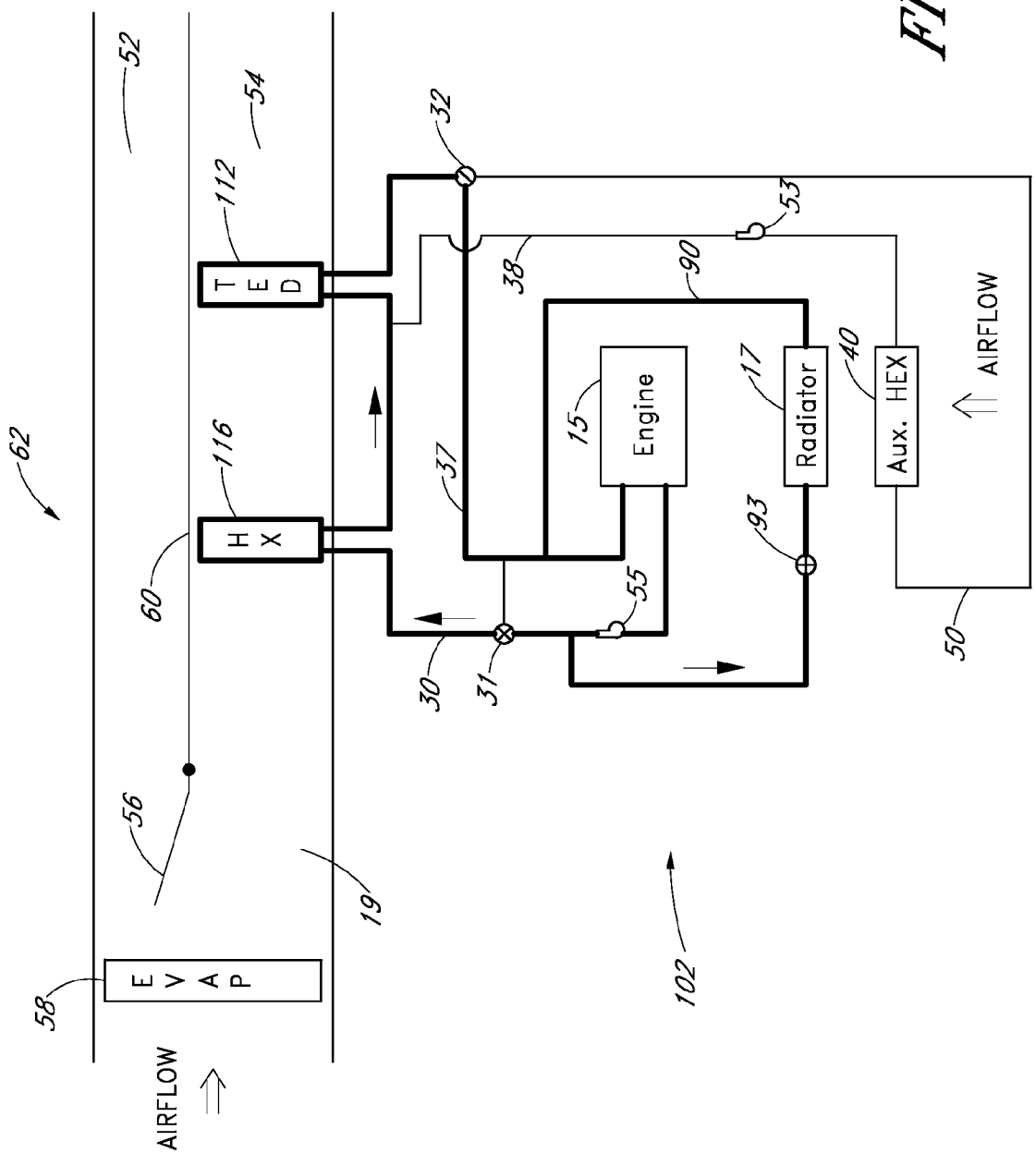
FIG. 26A is another schematic illustration of an embodiment of a temperature control system in a heating mode.

FIG. 26A illustrates an alternative embodiment with a simplified control schematic with two modes of operation: a heating mode or a cooling mode. FIG. 26A illustrates an embodiment of a temperature control system 102 in a first mode, which may also be referred to as a heating mode, a supplemental heating mode, and/or stop heating mode. In some embodiments, the heating mode of the embodiment shown in FIG. 26A combines the startup heating mode, warm up engine heating mode, and/or warm engine mode (in combination embodiment show in in FIG. 26A can be considered startup heating mode), as well as stop cold heating mode, stop heating mode, and/or stop warm heating mode, described above for FIGS. 21-23.

As discussed above, when the engine 15 is first started, it may not generate enough heat to sufficiently increase the temperature within the passenger compartment. In heating mode, heat is provided to the passenger compartment while the engine 15 is initially warming up and has not yet reached a temperature sufficient to heat the passenger compartment. A controller provides electrical energy to the TED 112 which generates a thermal gradient and transfers heat from the heating end of the TED 112 to the air channel 54. Pump 55 moves the liquid coolant within the working fluid circuit 30 and radiator circuit 90. Radiator circuit 90 and thermal controller 93 keep the engine 15 cool, which can be independent of the temperature control system 102. Actuator 31 can open both the working fluid circuit 30 and radiator circuit 90 simultaneously. Valve 93 can control fluid flow through the radiator circuit 90. The working fluid circuit 30 is in fluid communication with the heat exchanger 116 and the TED 112. An actuator 32 connects the working fluid circuit 30 with a thermal circuit 37 leading back to the engine 15 during heating mode. In some embodiments, the low temperature core 40 is not needed during heating mode because the airflow into the passenger compartment is being heated. Thus, the actuator 32 closes liquid coolant flow to auxiliary heat exchanger or low temperature core 40.

As also discussed herein, when the engine 13 is stopped in a micro-hybrid or hybrid system, the engine 13 will cool while stopped. As the engine 13 cools, the liquid coolant will correspondingly drop in temperature. In stop cold heating mode and/or stop heating mode, heat is being provided to the passenger compartment when the temperature of the engine 13 drops and is insufficient to heat the passenger compartment. A controller provides electrical energy to the TED 112 which generates a thermal gradient and transfers heat from the heating end of the TED 112 to the air channel 54. Liquid coolant within the working fluid circuit 30 and thermal circuit 141 is moved through the circuits by a pump (e.g., electric pump) within the engine 13 (not illustrated). Liquid coolant within the working fluid circuit 30 and thermal circuit 141 is moved through the circuits by a pump within the engine 13 (not illustrated). In alternative embodiments, a pump can be located outside the engine 13. Valve 145 is open and the working fluid circuit 30 is in fluid communication with the TED 112 via thermal circuits 131 and 141, which thermally connects the TED 112 and the engine 13 via thermal circuit 21. Valves 125, 165, and 36 can be closed during the stop cold heating mode heating mode. In some embodiments, the low temperature core 40 is not needed during the stop cold heating mode heating mode because the airflow into the passenger compartment is being heated. Thus, the temperature control system 102 is able to provide a relatively longer period of time over which the engine 13 does not have to be started to heat the airflow in a micro-hybrid or hybrid system. Without heating being provided by a TED 112, the engine 13 may need to be started for the purpose of heating the passenger compartment while the engine 13 is otherwise not needed to, for example, drive the vehicle.

Figure 26B:
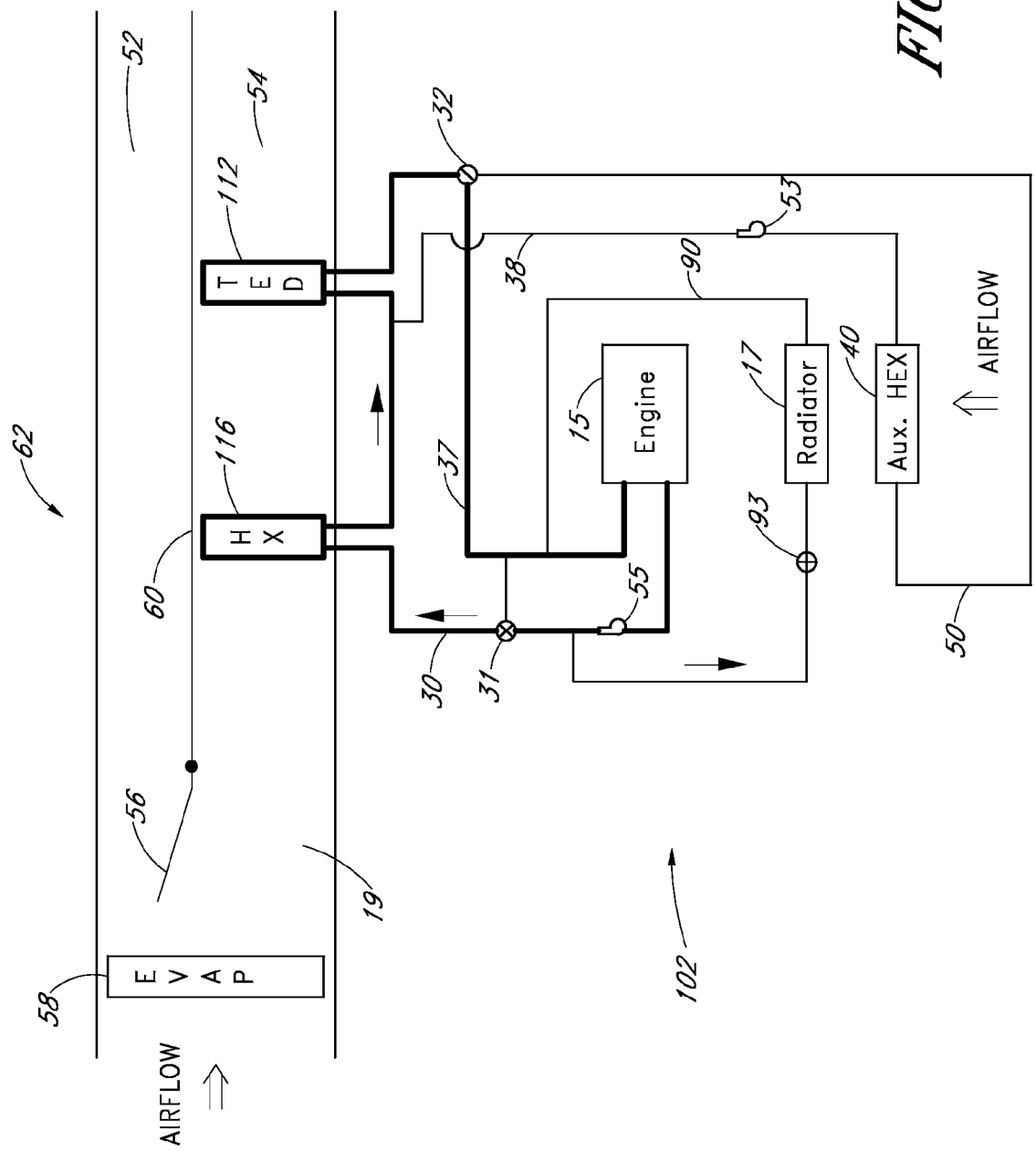
FIG. 26B is another schematic illustration of an embodiment of a temperature control system in a heating mode.

FIG. 26B illustrates an alternative embodiment with a simplified control schematic in a heating mode for a micro-hybrid or hybrid system while the engine 15 is stopped. Flow through the radiator circuit 90 can be restricted when keeping the engine 15 cool is not necessary as, for example, during the stop cold heating mode, stop heating mode, and/or stop warm heating mode. Valve 93 can be closed to restrict coolant flow through thermal circuit 93 and when the engine is stopped in a micro-hybrid or hybrid vehicle. By preventing coolant flow through the radiator 17 while the engine is stopped, loss of residual heat to ambient can be mitigated. A controller provides electrical energy to the TED 112 which generates a thermal gradient and transfers heat from the heating end of the TED 112 to the air channel 54. Pump 55 (e.g., electric pump) moves the liquid coolant within the working fluid circuit 30 and radiator circuit 90. Actuator 31 can open the working fluid circuit 30. The working fluid circuit 30 is in fluid communication with the heat exchanger 116 and the TED 112. An actuator 32 connects the working fluid circuit 30 with a thermal circuit 37 leading back to the engine 15 during heating to absorb residual heat of the engine 15 and coolant. As the residual heat of the engine 15 and coolant drops while the engine 15 is stopped, the TED 112 can continue to transfer heat from the heating end of the TED 112 to the air channel to allow the engine 15 to remain stopped for a relatively longer period of time.

The heat exchanger 116 and TED 112 are disposed in the HVAC system 62. In this manner, the thermal energy transferred to the airflow entering the passenger compartment by the thermoelectric device 112 is transferred to the coolant in thermal communication with the engine 15. When the engine 15 is warming up, the TED 112 can be the sole or almost entirely the source of thermal energy the airflow entering the passenger compartment. Little or no thermal energy may be removed from the engine 15 while the engine 15 is still warming up, even though liquid coolant is circulating through the thermal circuits including the heat exchanger 116 and the engine 15.

In some embodiments, a part of the TED 112 can be a portion of the heat exchange 116, further simplifying the system 102. In certain such embodiments, the temperature control system 102 can switch between heating and cooling modes by operating one or more actuators, a bypass valve 31, and/or one or more selector valves 32. In certain such embodiments, the temperature control system 102 is configured to switch between heating and cooling modes using two or fewer actuators. The bypass valve 31 can control whether the working fluid circuit 30 is bypassed. The selector valve 32 (in conjunction with valve 31) can control whether liquid coolant is in thermal contact with the engine 15 or liquid coolant is in thermal contact with the auxiliary heat exchanger 40.

Once the engine is sufficiently warm, thermal energy from the engine 15 is used to heat the coolant in the working fluid circuit 30. When the engine 15 provides sufficient heat to the coolant, the heat exchanger 116 begins to also heat the airflow in the channel 54 by transferring thermal energy from the heated coolant in working fluid circuit 30 to the airflow. Thus, the airflow entering the passenger compartment is receiving thermal energy from both the engine 13 and the TED 112 once the engine 15 is warm. In an embodiment, the coolant can flow through both the heat exchanger 116 and the TED 112 from startup to when the engine 15 is fully warm. During startup, the heat exchanger 116 is not providing any thermal energy to the airflow because the engine 15 and consequently the coolant flowing through the heat exchanger 116 is relatively cold. Once the engine 15 is warm, the engine 15 can be the sole heat source through thermal communication with the air channel 19 via the working fluid circuit 30 and heat exchanger 116. The controller can also completely stop the electrical energy supplied to the TED 112 even though the coolant continues to flow through the TED 112. When the engine 15 is at a sufficient temperature, the TED 112 can be shut off, and the electrical energy applied to the TED 12 can be conserved. In some embodiments, the controller can continue to supply electrical energy to the TED 112, as appropriate, to provide supplemental heating.

Figure 27:
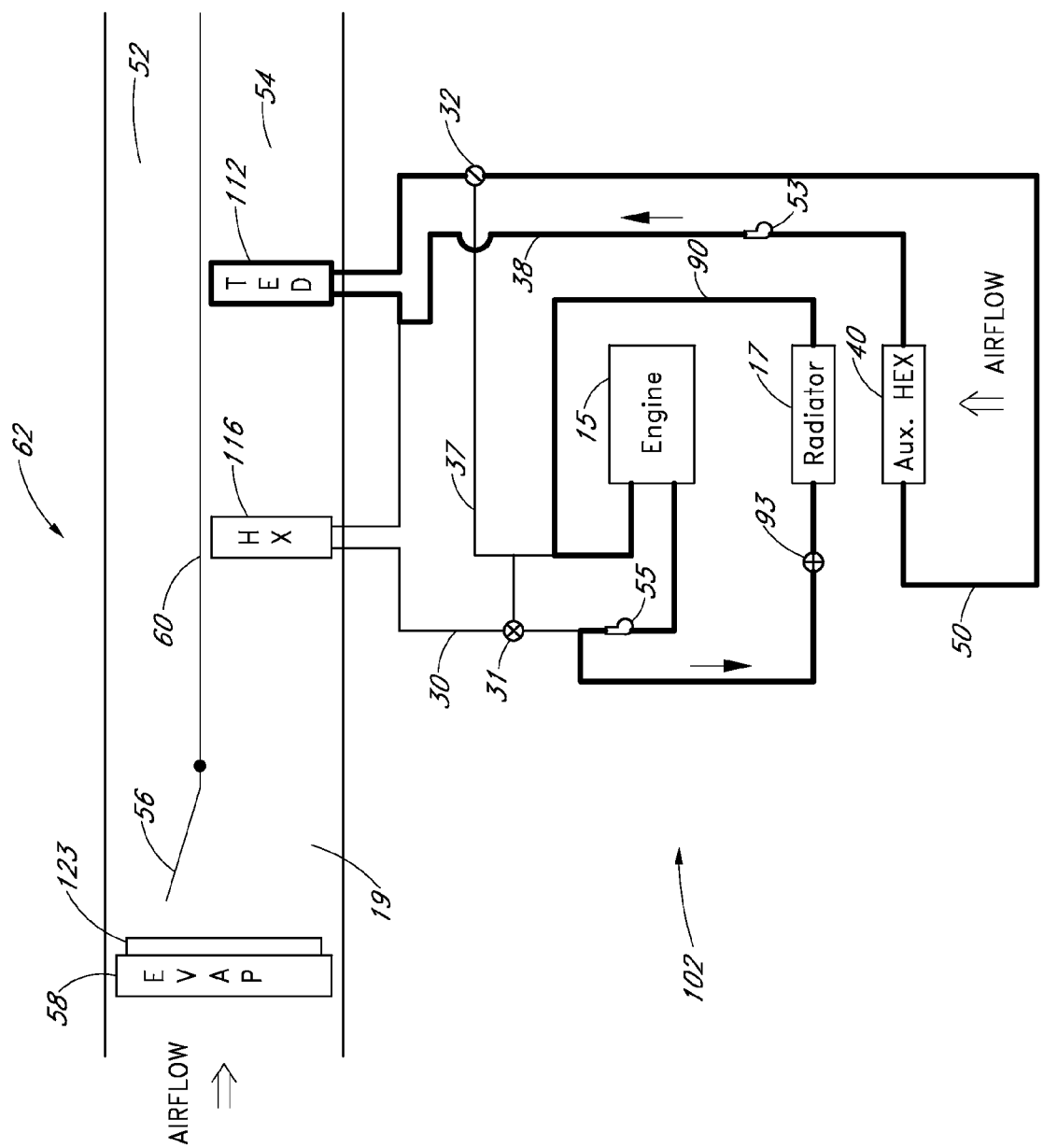
FIG. 27 illustrates schematically another embodiment of a temperature control system in a cooling mode.

FIG. 27 illustrates an alternative embodiment with a simplified control schematic. FIG. 27 an embodiment of a temperature control system 102 in a second mode, which may also be referred to as the "cooling mode." This mode can be utilized in conventional, micro-hybrid, or hybrid vehicles. By cooling in this mode as discussed herein, the engine 13 may not be necessary to cool the passenger compartment. In some embodiments, the engine 13 either remains stopped or can remain stopped for a longer period of time while in the cooling mode. The disclosed embodiments can substitute or supplement cooling provided by an electric compressor system in, for example, a hybrid vehicle. In the cooling mode, the system 102 cools the airflow in the HVAC system 62 by transferring heat from the airflow to a low temperature core 40 via the TED 112. Actuator 31 selectively closes coolant flow through working fluid circuit 30 to the heat exchanger 116. Radiator circuit 90 and thermal controller 93 keep the engine 13 cool via pump 55, which can be independent of system 102. Pump 53 is engaged to allow coolant flow through the cooling circuit 50, transferring thermal energy from the TED 112 to the low temperature core 40. The low temperature core or auxiliary heat exchanger 40 is configured to assist in cooling the airflow. As part of the system 102, a heat sink circuit or cooling circuit 50 is configured so that the TED 112 is in thermal communication with the low temperature core 40. In this configuration the engine 15 is bypassed by the coolant system and is not in thermal communication with the heat exchanger 116 or the TED 112. Thus, the cooling circuit 50 and auxiliary heat exchanger 40 transfer heat from the TED 112 in an efficient manner.

The TED 112 receives electric energy with a polarity opposite the polarity used in the heating modes. When electrical energy of the opposite polarity is applied to the TED 112, the direction of the thermal gradient is reversed. Instead of providing heat or thermal energy to airflow of the passenger air channel 19, the TED 112 cools the airflow by transferring thermal energy away from the airflow to the cooling circuit 50, which is in thermal communication with the auxiliary heat exchanger 40. The cooling circuit 50 and the auxiliary heat exchanger 40 can be located proximate the thermoelectric device 112 to provide more efficient transfer of thermal energy. Preferably, the low temperature core or auxiliary heat exchanger 40 is exposed to airflow or another source for dissipating heat. While airflow may be passing through an evaporator 58, the evaporator system (i.e., refrigeration cycle system) can be deactivated such that the evaporator 58 does not substantially affect the thermal energy of the airflow (e.g., the evaporator does not absorb thermal energy from the airflow).

In some embodiments, during the cooling mode, the evaporator 58 may be used to at least partially or completely cool comfort air before it enters the passenger compartment. In some embodiments, such as for example in hybrid vehicles, the evaporator 58 can be part of a compressor-based refrigeration system with an electric compressor. The evaporator 58 can be configured such that the airflow passes through it and moisture is removed before it reaches the TED 112. Also, the TED 112 can be located within one of a plurality of channels 52, 54. A blend door 56 can be configured to selectively direct airflow into the channel 54 in which the TED 112 is located or to direct comfort air into a channel 52 that bypasses the TED 112. Similar to the heating modes, in the cooling mode, the blend door 56 can adjust the rate of cooling by adjusting how much air flow is allowed through the channels 52, 54. Alternatively, the TED 112 could be configured to transfer heat from the entire airflow without the use of separate channels. Thus, the TED 112 can provide supplemental cooling by absorbing thermal energy along with the evaporator 58 absorbing thermal energy from the airflow.

In some embodiments, a thermal storage device 123 is coupled to the HVAC system 102. As illustrated in FIG. 27, the thermal storage device 123 can be coupled or be part of the evaporator 58. With a light-weight evaporator, the thermal storage device 123 can be placed anywhere along the HVAC system 101, such as for example, upstream or downstream of evaporator 58, heater exchanger 116, and/or TED 112. The thermal storage device 123 can be located in the first or second channel 52, 54 to provide different arrangements during the cooling mode as discussed herein. In some embodiments, a compressor-based refrigeration system may be used to store thermal energy in the thermal storage device 123 while an internal combustion engine is running and providing power to the compressor-based refrigeration system. When the internal combustion engine is stopped as discussed herein, the thermal energy in the thermal energy storage device 123 may be utilized to provide cooling for a longer period of time without requiring the engine to start. In some embodiments, the same concepts can be applied to utilize the thermal storage device 123 during heating modes to provide longer engine stop times.

In the embodiments of FIGS. 26A-B and 27, the HVAC system 62 can include a blend door 56 or other device that is configured to direct the airflow into different channels 52, 54 leading to the passenger compartment. In these embodiments, the blend door 56, and location of the heat exchanger 116 and TED 112 can be configured in a similar set up as described for the above embodiments of FIGS. 21-25 for varying the rates of heating or cooling. Further, an evaporator 58 and demisting can also be provided as described for the above embodiments of FIGS. 21-25 during heating or cooling.

Figure 28:
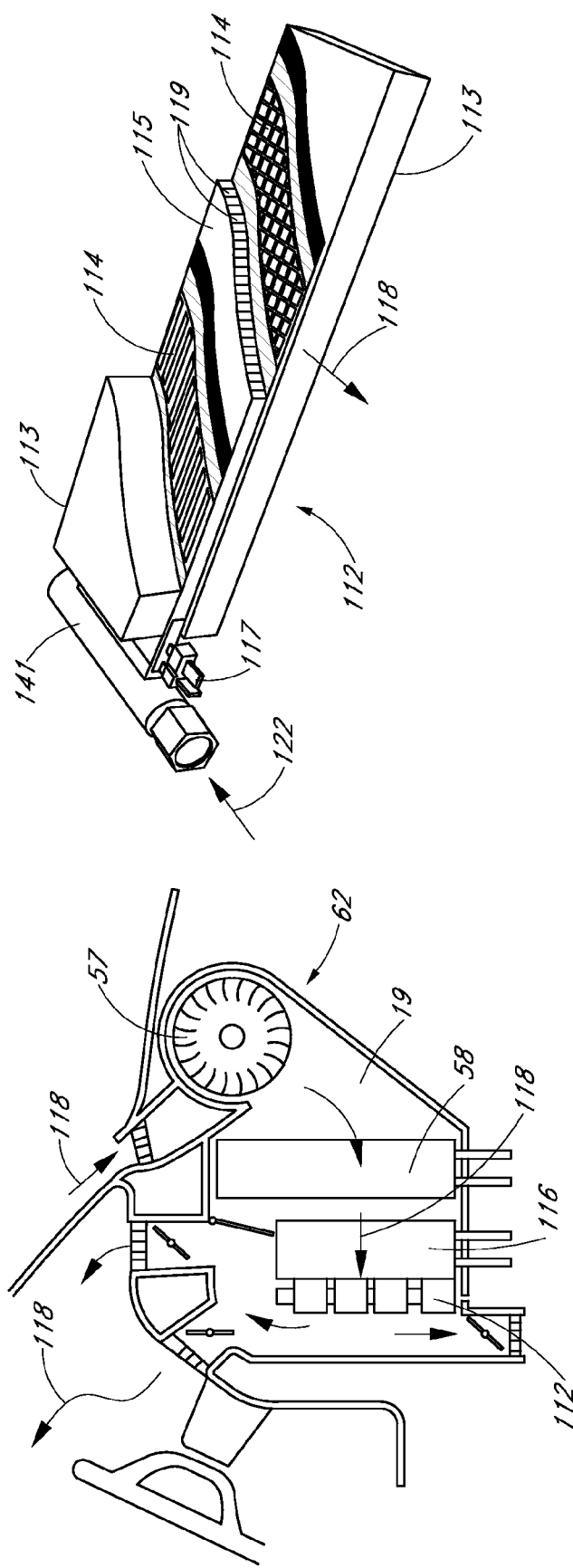
FIG. 28A illustrates an example embodiment of an HVAC system in a vehicle.
FIG. 28B illustrates an example embodiment of a liquid to air thermoelectric device.

FIG. 28A illustrates an example embodiment of an HVAC system 62. The HVAC system 62 comprises a passenger air channel 19, an air fan 57, an evaporator 58, a heat exchanger 116, and a TED 112. The air fan 57 draws the airflow 118 through the passenger air channel 19 as indicated by the airflow arrows 118. In an embodiment, the airflow 118 passes through the evaporator 58, then through the heat exchanger 116, and finally through the TED 112 to reach a passenger compartment through windscreen, upper, and/or lower vents. The passenger air channel 19, the evaporator 58, the heat exchanger 116, and the TED 112 can function as described with respect to the embodiments shown in FIGS. 2-31C and other embodiments described herein.

FIG. 28B illustrates an example embodiment a thermoelectric device 112 that can be used in any of the embodiments described above with a liquid to air TED 112. The above described embodiment of FIG. 28A has four liquid to air TED units 112 that can transfer thermal energy between a working fluid 122 and comfort air 118 separately or in combination. FIG. 28B is a perspective view of a partial cut away showing some functional elements of an example TED unit 112. In some embodiments, a system controller supplies electric power in a first polarity to the TED 112 via electrical connections 117. Liquid coolant 122 enters the TED 112 via a coolant circuit interface 141. The TED 112 includes capillaries or tubes 119 for carrying liquid coolant 122 that are in substantial thermal communication with thermoelectric elements 114 that are disposed between the capillaries or tubes 119 and one or more air-side heat exchangers 113. Depending on whether the TED 112 is heating or cooling the airflow 118, the thermoelectric elements 114 either withdraw thermal energy from the coolant or deposit energy into the coolant.

In some heating mode configurations, the thermoelectric elements 114 pump thermal energy from the liquid coolant supplied via the coolant circuit interface 141 into comfort air 118. The TED 112 receives electric current in a first polarity via the electrical connections 117, which results in a direction of thermal energy transfer in the thermoelectric elements 114 that facilitates comfort air 118 heating. Thermally conductive material 115 can carry thermal energy between the liquid coolant flowing through the capillaries or tubes 119 and the thermoelectric elements 114. The thermoelectric elements 114 can be located on one or both sides of the conductive material 115. The thermoelectric elements 114 pump the thermal energy between the conductive material 115 and the air-side heat exchanger 113, which can also be on one or both sides of the conductive material 115. The air-side heat exchanger 113 can include fins or other suitable structures for transferring thermal energy to the comfort air 118 that flows around and/or through the heat exchanger 113.

In some cooling mode configurations, the thermoelectric elements 114 pump thermal energy from comfort air 118 into the liquid coolant 122. The TED 112 receives electric energy with a second polarity opposite the first polarity used in the heating modes via the electrical connections 117, which results in a direction of thermal energy transfer in the thermoelectric elements 114 that facilitates comfort air 118 cooling. The air-side heat exchanger 113 places the comfort air 118 in substantial thermal communication with a first surface of the thermoelectric elements 114. The thermoelectric elements 114 pump thermal energy into the conductive material 115. The conductive material 115 places the liquid coolant 122 in substantial thermal communication with a second surface of the thermoelectric elements 114, permitting thermal energy to readily enter the liquid coolant 122. The heated liquid coolant can be carried away from the TED 112 via the coolant circuit interface 141

Figure 29:
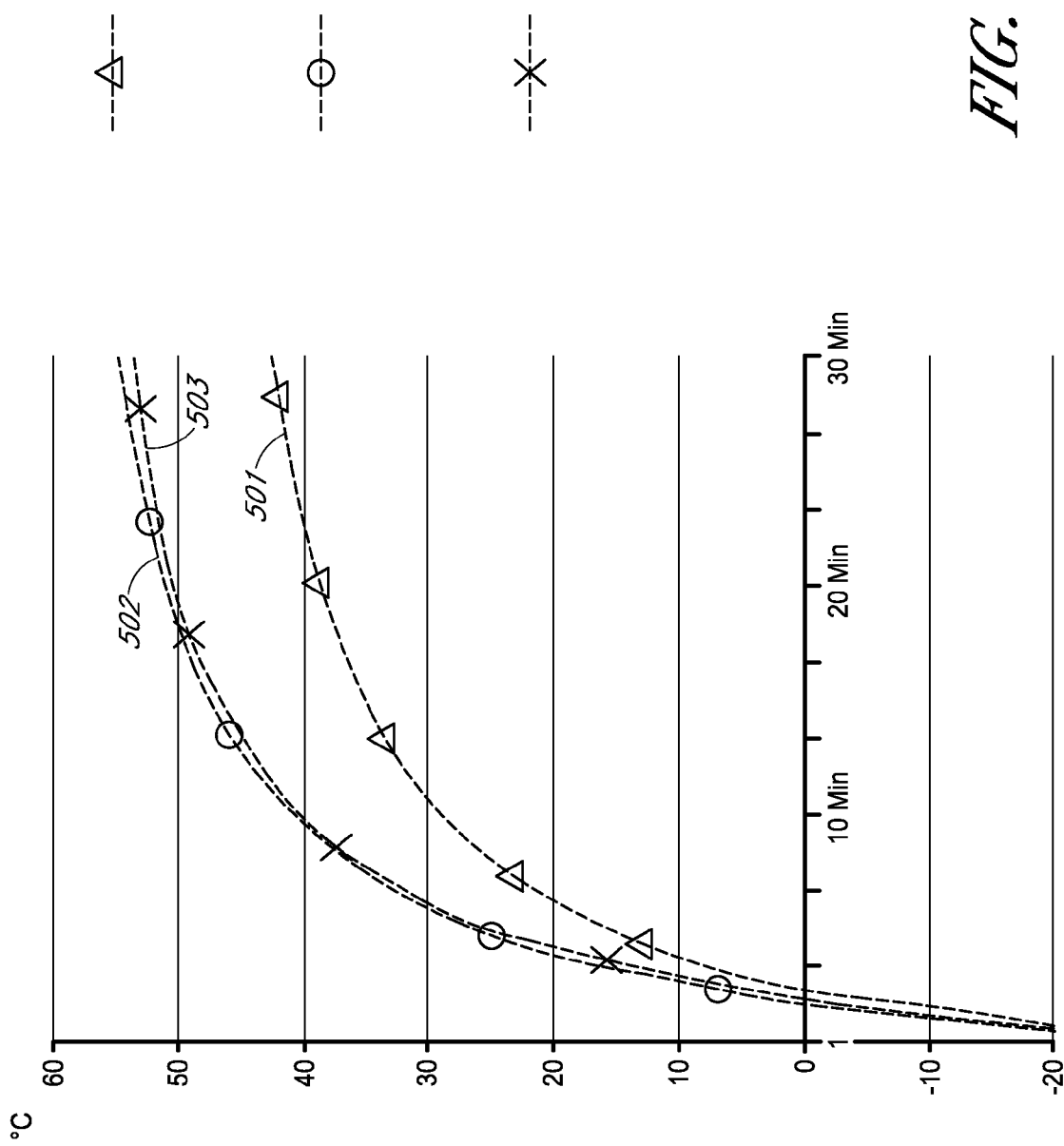
FIG. 29 illustrates a graph of possible cabin heater output temperatures over a time period for certain HVAC system embodiments.

FIG. 29 is a graph illustrating possible cabin heater output temperatures over a time period for certain temperature control system embodiments that can be used in a vehicle having a diesel engine. The graph shows a baseline air temperature profile 501 over a 30-minute period, an electric positive temperature coefficient (PTC) heater air temperature profile 502 over a 30-minute period, and a TED air temperature profile 503 over a 30 minute period. The baseline 501 illustrates a possible air temperature trend curve when an engine is the only heat source via a coolant circuit. For the baseline profile 501, the cabin air is heated while passing through the heat exchanger connected to the engine through the coolant circuit. The PTC profile 502 illustrates a possible air temperature trend curve when the cabin air is heated by a coolant circuit heat exchanger as well as a 1 KW PTC heater. The TED profile 503 illustrates a possible air temperature trend curve when the cabin air is heated by a coolant circuit heat exchanger as well as a liquid to air TED that has a 650 W electric power supply. The heat provided by the TED can partially come from the transformation of electric power into thermal energy and partially from the coolant circuit.

As the graph of FIG. 29 illustrates, the baseline 501 air cabin temperature not only never reaches the same air cabin temperature but also has a shallower uptrend in temperature over time. The shallower uptrend means that the interior cabin temperature rises at a slower rate. The PTC curve 502 with the electric resistance heater has a steeper uptrend in temperature as well as reaches a higher final temperature when compared to the baseline 501. This is desirable to quickly achieve a comfortable passenger vehicle environment. The graph also shows that the TED curve 503 has almost an equivalent steepness in uptrend for the temperature as well as almost the same final temperature when compared to the PTC curve 502. However, utilizing a TED can result in less power consumption when compared to electric resistance heaters. Thus, substantially the same rate of increase in cabin air temperature as well as final temperature can be achieved by utilizing a TED versus an electric resistance heater as part of a vehicle HVAC system while demanding less electric power.

FIGS. 30A-C and 31A-C illustrate schematics showing operation of an embodiment of a temperature control system in heating, cooling, and demisting modes during startup of an engine and start/stop of an engine at various thermal states of the engine over time. Given a state of the engine and a heating, cooling, or demisting mode, the temperature control system can considered to operating at different modes as discussed herein (e.g., startup heating mode and stop cold heating mode). The schematics are approximate illustrations that do not show exact engagement and disengagement time periods of HVAC components during operation. The horizontal operation lines represent either an on or off state of the HVAC component being discussed or operation of the component in general (i.e., the component transferring thermal energy to or absorbing thermal energy from the airflow or airstream). A step up in the operation line can indicate a switch in operation of the component as discussed herein (e.g., the component is turned on, is engaged, and/or has stored thermal energy). A step down in the operation line can also indicate a switch in operation of the component as discussed herein (e.g., the component is turned off, is disengaged, and/or has expended thermal energy). A flat or straight horizontal operation can represented a generally constant operation of the component. The operations discussed herein can be applied to a conventional vehicle, a micro-hybrid vehicle, a hybrid vehicle, and/or plug-in vehicle. For example, for a hybrid and plug-in hybrid vehicles without electric compressor, the start stop engine operations discussed herein would apply during the start stop operations typical for hybrid and plug-in hybrid vehicles (as well as conventional and micro-hybrid vehicles).

Figure 30A:
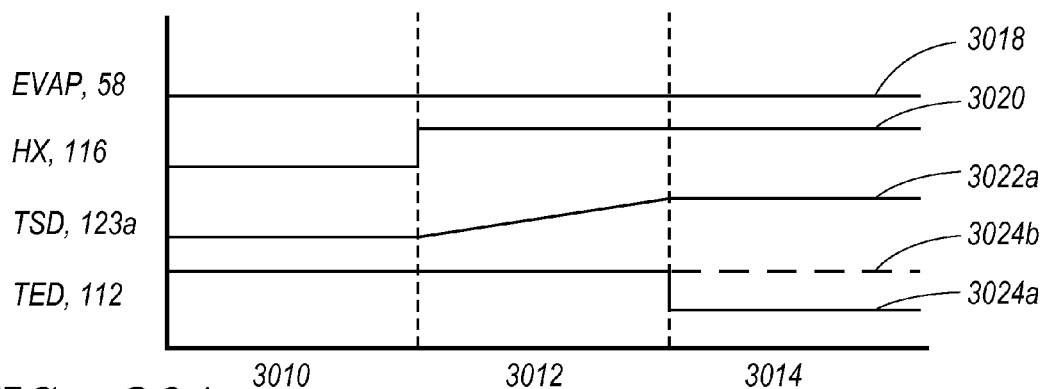
FIGS. 30A-C illustrate a schematic of an example embodiment for operating a temperature control system during a startup mode.

FIG. 30A illustrates a temperature control system operation in a heating mode during startup of an engine (e.g., the vehicle has not been driven and the engine is started in a cold state). During heating mode of FIG. 30A, the evaporator 58 is not operating and/or may be bypassed as shown by operation line 3018 indicating that evaporator 58 is not engaged during heating (e.g., the evaporator is not absorbing thermal energy from the airflow). In the heating of FIG. 30A, mode while the engine is warming up and is still cold, cold engine state 3010, the heat exchanger 116 is thermally disconnected from the engine, for example, described herein and particularly, in reference to FIG. 21 and shown by operation line 3020. When the engine is first started, it does not generate enough heat to sufficiently increase the temperature within the passenger compartment. A vehicle engine can take several minutes or more to warm up to the necessary temperature to provide comfort air to the passenger compartment. A TED 112 can receive electrical energy (electric current) to generate a thermal gradient and transfer heat from the heating end of the TED 112 to the airflow. As illustrated in FIG. 30A by operation line 3024a, the TED 112 can be the sole source of thermal energy for the airflow entering a passenger compartment during state 3010. If the temperature control system is equipped with a heating thermoelectric storage (TSD) 123a (e.g., a TSD thermally connected or part of the heat exchanger 116) capable of storing thermal energy to heat the airflow, the TSD 123a is initially cold and is not storing or storing minimal thermal energy (since the engine is cold) as indicated by operation line 3022a.

While the engine is still warming up, but is not cold, warm up engine state 3012, thermal energy from the engine can be used to heat the coolant in the working fluid circuits as discussed herein and in particular, in reference to FIG. 21. In state 3012 during heating mode of FIG. 30A, the engine has reached a warm up temperature that can provide some heat to the airflow, but is insufficiently warm to be the sole source of thermal energy for the system. However, the airflow entering the passenger compartment, after initial startup, can be receiving thermal energy from both the engine and the TED 112. As indicated by a step change in operation line 3020, the engine is put into thermal communication with heat exchanger 116 to heat the airflow as discussed herein and particularly, in reference to FIG. 22. Concurrently, more thermal energy can be transferred to the airflow using the TED 112 to supplement the thermal energy imparted from the engine via the heat exchanger 116. Thus, the TED 112 can remain engaged as illustrated by operation line 3024a in state 3012. Further, the TSD 123a starts storing thermal energy as the engine warms up, as illustrated by the upwardly slopping operation line 3022a in state 3012.

When the engine has warmed up, warm engine state 3014, thermal energy from the engine can be used to heat the coolant in the working fluid circuits during heating mode of FIG. 30A. In state 3014, the engine has reached a sufficient temperature and can the sole source of thermal energy for the system as discussed herein and in particular, in reference to FIG. 23. As indicated by operational line 3020, the heat exchanger 116 can become the sole heat source for the airflow in the air channel. The TED 112 can be disengaged to no longer heat the airflow as indicated in by a step down in operation line 3024a. In some embodiments, the TED 112 can remain engaged and provide supplemental heating as indicated by a dashed operation line 3024b. With the engine warmed-up, the TSD 123a can store thermal energy at or nearly at its capacity to be used in other heating modes as discussed herein and illustrated by operation line 3022a leveling out in state 3014.

Figure 30B:
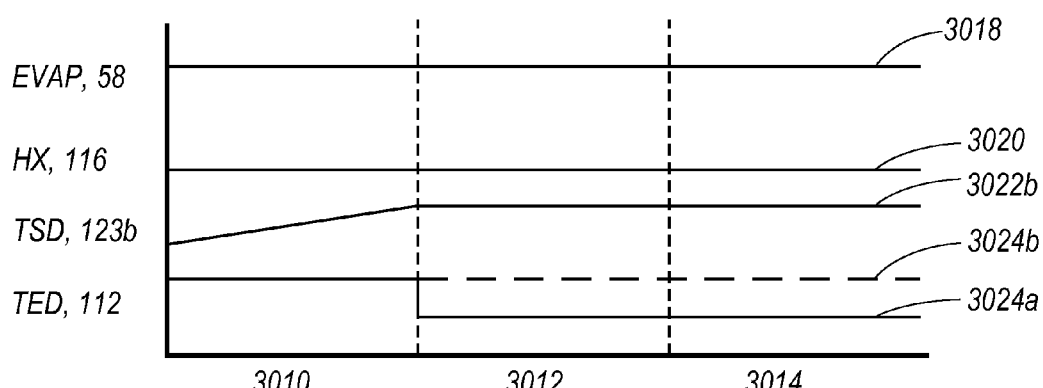

FIG. 30B illustrates a temperature control system operation in a cooling mode during startup of the engine. During cooling mode, the evaporator 58 is operating and engaged as shown by operation line 3018 (e.g., the evaporator 58 is absorbing thermal energy from the airflow). In the cooling mode of FIG. 30B, the heat exchanger 116 can be thermally disconnected from the engine as, for example, described herein and particularly, in reference to FIG. 24 (e.g., the heat exchanger 116 is bypassed in the cooling mode) and as shown by operation line 3020. Initially while, for example, the passenger cabin is hot (e.g., on a hot day) when the engine is just started in state 3010, supplemental cooling may be needed. A TED 112 can receive electrical energy (electric current) to generate a thermal gradient and transfer heat from the airflow of the TED 112 to the cooling end of the TED 112 as shown by operation line 3024a. If the temperature control system is equipped with a cooling thermoelectric storage (TSD) 123b (e.g., a TSD connected or part of the evaporator 58) capable of storing thermal energy to cool the airflow, the TSD 123b is initially at ambient, but begins storing thermal energy at engine startup with the evaporator 58 operating and providing cooling capacity nearly immediately upon startup. At cold engine state 3010, the TSD 123b can begin to store cooling capacity as indicated by the upwardly sloping operation line 3022b.

While the engine is still warming up, but is not cold, warm up engine state 3012, the heat exchanger 116 remains disengaged to not heat the airflow during the cooling mode of FIG. 30B as illustrated by operation line 3020. In warm up engine state 3012, the airflow entering the passenger compartment, after initial startup, can be cooled by just the evaporator 58; operation line 3018 showing that evaporator 58 remains engaged in state 3012. As indicated by a step down in operation line 3024a, power to the TED 112 can be disengaged and the TED 112 stops cooling the airflow. However, supplemental cooling may be needed and the TED 112 may continue to receive electrical energy (electric current) to provide cooling to the airflow as discussed herein, and in particular in reference to FIG. 24 and as illustrated by operation line 3024b. Further, the TSD 123b can store cooling capacity at or nearly at its capacity to be used in other cooling modes as discussed herein and illustrated by operation line 3022b leveling out in state 3012.

When the engine has warmed up, warm engine state 3014, the heat exchanger 116 remains disengaged to not heat the airflow during the cooling mode of FIG. 30B as illustrated by operation line 3020. In state 3014, the airflow entering the passenger compartment can be cooled by just the evaporator 58; operation line 3018 shows that evaporator 58 remains engaged in state 3014. As indicated by operation line 3024a, power to the TED 112 can remain disengaged and the TED 112 does not cool the airflow. However, supplemental cooling may be needed and the TED 112 may continue to receive electrical energy (electric current) to provide cooling to the airflow as discussed herein, and in particular in reference to FIG. 24 and as indicated by operation line 3024b. Further, the TSD 123b can store cooling capacity at or nearly at its capacity to be used in other cooling modes as discussed herein and illustrated by operation line 3022b leveling out in state 3012.

Figure 30C:
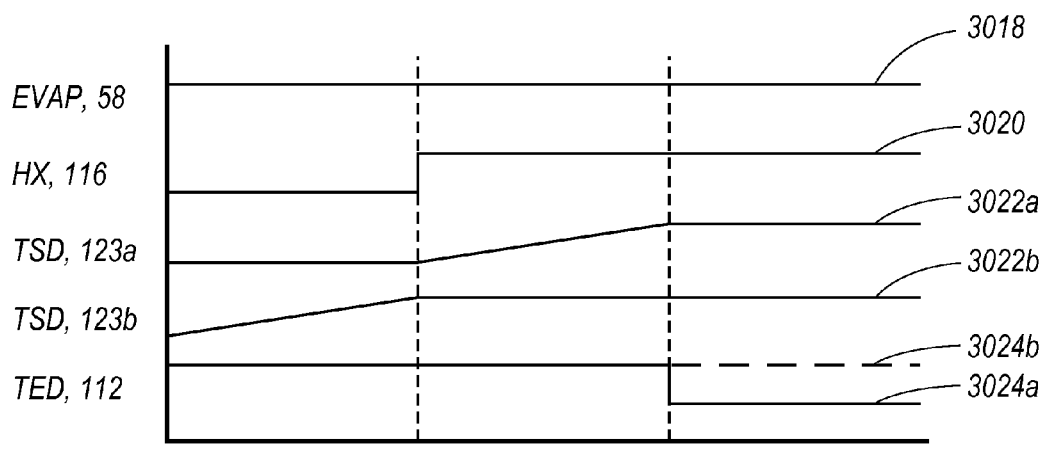

FIG. 30C illustrates a temperature control system operation in a demisting mode during startup of the engine. During demising mode of FIG. 30C, the evaporator 58 is operating and engaged as shown by operation line 3018 (e.g., the evaporator 58 is absorbing thermal energy from the airflow). While the engine is warming up and is still cold, cold engine state 3010, the heat exchanger 116 is thermally disconnected from the engine as, for example, described herein and particularly, in reference to FIG. 21 and shown by operation line 3020. When the engine is first started, it does not generate enough heat to sufficiently increase the temperature of the airflow. A TED 112 can receive electrical energy (electric current) to generate a thermal gradient and transfer heat from the heating end of the TED 112 to the airflow. As illustrated in FIG. 30C by operation line 3024a for the demisting mode, the TED 112 can be the sole source of heat for the airflow entering a passenger compartment in state 3010. If the temperature control system is equipped with a heating thermoelectric storage (TSD) 123a (e.g., a TSD thermally connected to or part of the heat exchanger 116) capable of storing thermal energy to heat the airflow, the TSD 123a is initially cold and is not storing or storing minimal thermal energy (since the engine is cold) as indicated by operational line 3022a. If the temperature control system is equipped with a cooling thermoelectric storage (TSD) 123b (e.g., a TSD connected to or part of the evaporator 58) capable of storing thermal energy to cool the airflow, the TSD 123b is initially at ambient, but begins storing cooling capacity at engine startup with the evaporator 58 operating and providing cooling capacity nearly immediately upon startup. At cold engine state 3010, the TSD 123b can begin to store cooling capacity as indicated by the upwardly sloping operation line 3022b.

While the engine is still warming up, but is not cold, warm up engine state 3012, thermal energy from the engine can be used to heat the coolant in the working fluid circuits. In state 3012, the engine has reached a warm up temperature that can provide some heat to the airflow, but is insufficiently warm to be the sole source of thermal energy for the system. However, the airflow entering the passenger compartment, after initial startup, can be receiving thermal energy from both the engine and the TED 112. As indicated by a step change in operation line 3020, the engine is put into thermal communication with heat exchanger 116 to heat the airflow as discussed herein and particularly, in reference to FIG. 22. Concurrently, more thermal energy can be transferred to the airflow using the TED 112 to supplement the thermal energy transferred to the airflow from the engine via the heat exchanger 116 as the air is heated after being cooled by the evaporator 58 in demisting mode of FIG. 30C. Thus, the TED 112 can remain engaged as illustrated by operation line 3024a. The heating TSD 123a starts storing thermal energy as the engine warms up, as illustrated by the upwardly slopping operation line 3022a in state 3012. The cooling TSD 123b can store cooling capacity at or nearly at its capacity to be used in other cooling modes as discussed herein and illustrated by operation line 3022b leveling out in state 3012.

When the engine has warmed up, warm engine mode 3014, thermal energy from the engine can be used to heat the coolant in the working fluid circuits in demisting mode of FIG. 30C. In state 3014, the engine has reached a sufficient temperature to be the sole source of thermal energy for the system as discussed herein and in particular, in reference to FIG. 23. As indicated by operational line 3020, the heat exchanger 116 can become the sole heat source for the airflow in the air channel. The TED 112 can be disengaged to no longer heat the airflow as indicated by a step down in operation line 3024a. In some embodiments, the TED 112 can remain engaged and provide supplemental heating as indicated by a dashed operation line 3034b. With the engine warm, the heating TSD 123a can store thermal energy at or nearly at its capacity to be used in other heating modes as discussed herein and illustrated by operation line 3022a leveling out in state 3014. The cooling TSD 123b can store cooling capacity at or nearly at its capacity to be used in other cooling modes as discussed herein and illustrated by operation line 3022b leveling out in state 3014. In some embodiments, the demisting process (including states 3010, 3012, 3014) described in reference to FIG. 30C can be referred to as "startup demisting mode."

Figure 31A:
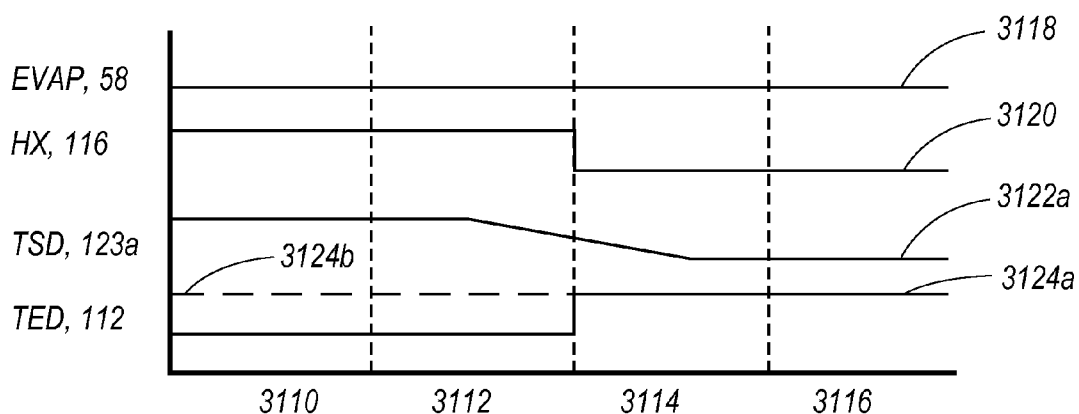
FIGS. 31A-C illustrate a schematic of an example embodiment for operating a temperature control system during a start/stop mode.

FIG. 31A illustrates a temperature control system operation in a heating mode during a stop of an engine for a start/stop system (e.g., the engine has been operating and is warm, but is stopped as discussed herein in, for example, a micro-hybrid system). During heating mode of FIG. 31A, the evaporator 58 is not operating and/or may be bypassed as shown by operation line 3118 indicating that evaporator 58 is not engaged during heating (e.g., the evaporator is not absorbing thermal energy from the airflow). With the engine warm, warm engine (or stop warm) mode 3110, thermal energy from the engine can be used to heat the coolant in the working fluid circuits. In state 3110, even though the engine is stopped, the engine and coolant has sufficient residual heat to continue to be the sole source of thermal energy for the system as discussed herein and in particular, in reference to FIG. 23. As indicated by operational line 3120, the heat exchanger 116 can be the sole heat source for the airflow in the air channel. TED 112 is not receiving electrical energy (electric current) and is not heating the airflow as indicated by operation line 3124a. If supplemental heating is needed, a TED 112 can receive electrical energy (electric current) to generate a thermal gradient and transfer heat from the heating end of the TED 112 to the airflow as indicated by operation line 3124b. If a heating TSD 123a is provided, with the heat exchanger 116 still transferring residual thermal energy from the engine and coolant to the airflow, the TSD 123a substantially retains its stored thermal energy from the time period when the engine was operating and was warm as indicated by operation line 3122a.

When the engine has cooled, but is warm (warmed up), cooled engine (or stop cooled) state 3112, thermal energy from the engine can still be used to heat the coolant in the working fluid circuits as discussed herein and in particular, in reference to FIG. 21, but the engine may be insufficiently warm to be the sole source of thermal energy for the system. In heating mode of FIG. 31A, a heating TSD 123a in state 3112 can be used to transfer stored thermal energy to the airflow. The TSD 123a transferring stored thermal energy can occur gradually over time or at a certain point in time during state 3112 as indicated by operation line 3122a having a decline slope mid-state 3112. With a cooled engine (and coolant) transferring some residual heat and the TSD 123a transferring stored thermal energy, the airflow can be sufficiently heated without the use of a TED 112. Thus, with a TSD 123a, supplying electrical energy (electric current) to the TED 112 can be delayed and electrical energy (electric current) conserved while the engine is stopped. However, if supplemental heating is needed, the TED 112 can receive electrical energy (electric current) to transfer thermal energy to the airflow as indicated by operation line 3124b.

When the engine has cooled and is now cold, cold engine (or stop cold) state 3114, the heat exchanger 116 thermally connected to the engine is bypassed as, for example, described herein and particularly, in reference to FIG. 21 and shown by operation line 3120. The airflow entering the passenger compartment can be still receiving some thermal energy from TSD 123a; however, the TSD 123a does not have sufficient energy to the sole heat source for the airflow as indicated by operation line 3122a leveling out after declining in state 3114. A TED 112 can receive electrical energy (electric current) to generate a thermal gradient and transfer heat from the heating end of the TED 112 to the airflow. As illustrated in FIG. 31A by operation line 3124a, the TED 112 can become the sole source of thermal energy for the airflow entering a passenger compartment over the time period during state 3114 (e.g., residual heat from the engine (and coolant) and stored heat from the TSD 123a have dissipated). After mode 3114, the engine is cold as the system transitions to cold engine state 3116 mode. In mode 3116, the cold engine is again started. The temperature control system can similarly operate as discussed herein for when a cold engine is started and heating is desired, and in particular, in reference to FIG. 30A.

Figure 31B:
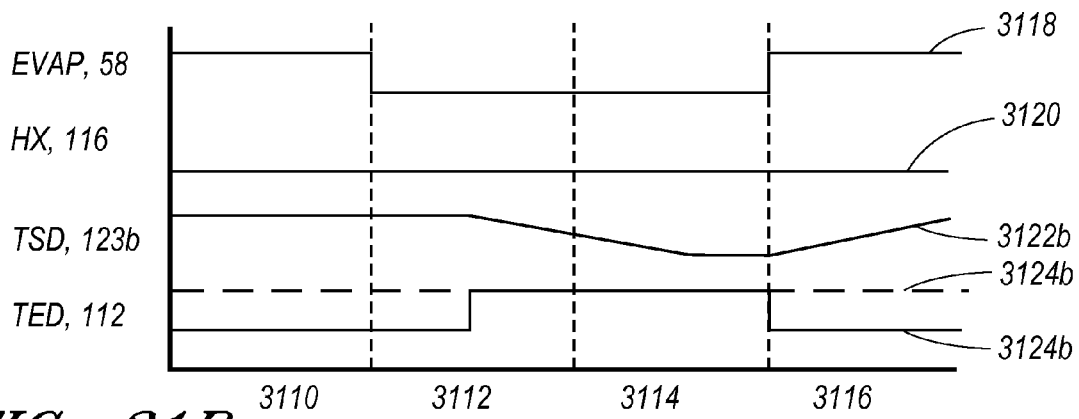

FIG. 31B illustrates a temperature control system operation in a cooling mode during a stop of an engine for a start/stop system (e.g., the engine has been operating and is warm, but is stopped as discussed herein in, for example, a micro-hybrid system). During cooling mode of FIG. 31B in state 3110, the evaporator 58 is operating and engaged as shown by operation line 3118 (e.g., the evaporator 58 is absorbing thermal energy from the airflow). Even though engine is off in warm engine (or stop warm) mode 3110, the evaporator 58 and coolant may have some residual cooling capacity from when the engine was operating and running, for example, a compressor-based refrigeration system. The heat exchanger 116 can be thermally disconnected from the engine as, for example, described herein and particularly, in reference to FIG. 24 (e.g., the heat exchanger 116 is bypassed in the cooling mode) and as shown by operation line 3120. As indicated by operation line 3124a, power to the TED 112 can be disengaged and the TED 112 does not cool the airflow when the evaporator 58 is providing sufficient cooling. However, supplemental cooling may be needed and the TED 112 can receive electrical energy (electric current) to provide cooling to the airflow as discussed herein, and in particular in reference to FIG. 24 and as illustrated by operation line 3124b. If a cooling TSD 123b is provided, with the evaporator 58 still cooling the airflow with residual cooling capacity, the TSD 123b substantially retains stored thermal energy from when the evaporator 58 was being operated as indicated by operation line 3122b.

When the engine has cooled, but is still warm (warmed up), cooled engine (or stop cooled) state 3112, the heat exchanger 116 remains disengaged to not heat the airflow during the cooling mode of FIG. 31B as illustrated by operation line 3120. The evaporator 58 and coolant have expended its residual cooling capacity and is disengaged or bypassed as indicated by a step down in operation line 3118 as discussed herein. A cooling TSD 123b in state 3112 can be used to transfer stored cooling capacity to the airflow. The TSD 123b transferring stored thermal energy can occur gradually over time or at a certain point in time during state 3112 as indicated by operation line 3122b having a decline slope mid-state 3112. Initially, the TSD 123b may have sufficient stored cooling capacity to cool the airflow without the use of a TED 112. Thus, with a cooling TSD 123*a*, supplying electrical energy (electric current) to the TED 112 can be delayed and electrical energy (electric current) conserved while the engine is stopped. As stored cooling capacity of the TSD 123*b* is expended, the TED 112 can be engaged to provide the needed level of cooling. The TED 112 can receive electrical energy (electric current) to transfer thermal energy to the airflow as indicated by operation line 3124*a*. Powering the TED 112 can occur any time in mode 3112 as indicated by operation line 3124*a* having a step change mid-mode 3112.

When the engine has cooled and is now cold, cold engine (or stop cold) state 3114, heat exchanger 116 can remain disengaged during the cooling mode of FIG. 31B as illustrated by operation line 3120. With the evaporator 58 and the TSD 123*b* no longer providing cooling (from stored cooling capacity or otherwise), the TED 112 can receive electrical energy (electric current) to provide cooling to the airflow as discussed herein, and in particular in reference to FIG. 24 and as indicated by operation line 3124*a*. In some embodiments, the TED 112 can become the sole source of cooling for the airflow in mode 3114. In mode 3116, the cold engine is again started. The temperature control system can similarly operate as discussed herein for when a cold engine is started and cooling is desired, and in particular, in reference to FIG. 30B.

Figure 31C:
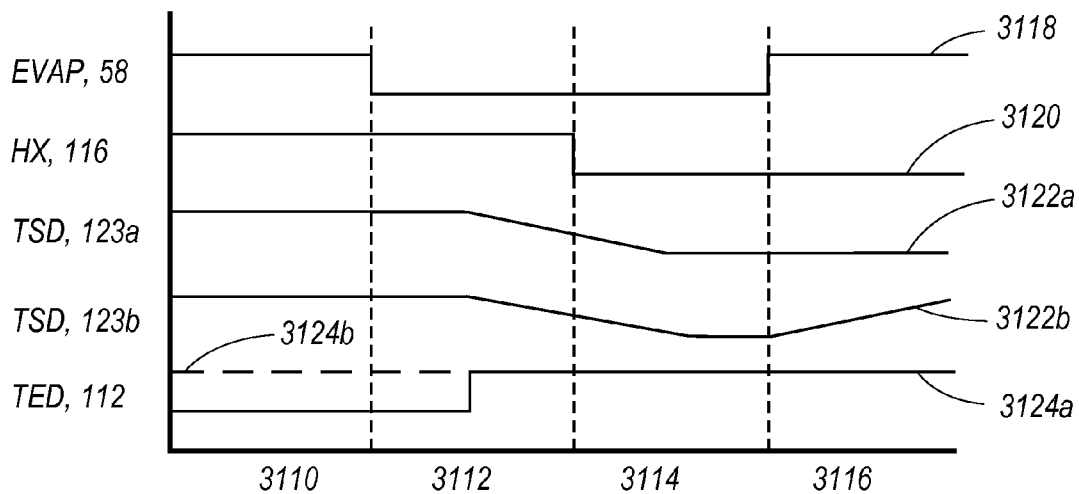

FIG. 31C illustrates a temperature control system operation in a demisting mode during a stop of an engine for a start/stop system (e.g., the engine has been operating and is warm, but is stopped as discussed herein in, for example, a micro-hybrid system). During demisting mode of FIG. 31C in state 3110, the evaporator 58 is operating and engaged as shown by operation line 3118 (e.g., the evaporator 58 is absorbing thermal energy from the airflow). Even though engine is off in warm engine (or stop warm) mode 3110, the evaporator 58 and coolant may have some residual cooling capacity from when the engine was operating and running, for example, a compressor-based refrigeration system. With the engine warm in mode 3110, thermal energy from the engine can be used to heat the coolant in the working fluid circuits. In state 3110, even though the engine is stopped, the engine and coolant have sufficient residual heat to continue to be the sole source of thermal energy for the system as discussed herein and in particular, in reference to FIG. 23. As indicated by operational line 3120, the heat exchanger 116 can be the sole heat source for the airflow in the air channel. If supplemental heating is needed to provide the necessary level of demisting, a TED 112 can receive electrical energy (electric current) to generate a thermal gradient and transfer heat from the heating end of the TED 112 to the airflow as indicated by operation line 3124*b*. If a heating TSD 123*a* is provided, with the heat exchanger 116 still transferring residual thermal energy from the engine and coolant to the airflow, the TSD 123*a* substantially retains stored thermal energy from when the engine was operating and was warm as indicated by operation line 3122*a*. If a cooling TSD 123*b* is provided, with the evaporator 58 and coolant still cooling the airflow with residual cooling capacity, the TSD 123*b* substantially retains stored thermal energy from when the evaporator 58 was being operated as indicated by operation line 3122*b*.

When the engine has cooled, but is still warm (warmed up), cooled engine (or stop cooled) state 3112, the evaporator 58 and coolant have expended its residual cooling capacity and is disengaged or bypassed as indicated by a step down in operation line 3118 as discussed herein. A cooling TSD 123*b* in state 3112 can be used to transfer stored cooling capacity to the airflow. The TSD 123*b* transferring stored thermal energy can occur gradually over time or at a certain point in time during state 3112 as indicated by operation line 3122*b* having a decline slope mid-state 3112. Initially, the TSD 123*b* has sufficient stored cooling capacity to cool the airflow without the use of a TED 112 to provide demisting. Thermal energy from the engine can still be used to heat the coolant in the working fluid circuits as discussed herein and in particular, in reference to FIG. 21, but the engine is insufficiently warm to be the sole source of thermal energy for the system during demisting in mode 3112. A heating TSD 123*a* in state 3112 can be used to transfer stored thermal energy to the airflow. The TSD 123*a* transferring stored thermal energy can occur gradually over time or at a certain point in time during state 3112 as indicated by operation line 3122*a* having a decline slope mid-state 3112. With a cooled engine (and coolant) transferring some residual heat and the TSD 123*a* transferring stored thermal energy, the airflow can be sufficiently heated without the use of a TED 112. Thus, with a TSD 123*a*, supplying electrical energy (electric current) to the TED 112 can be delayed and electrical energy (electric current) conserved while the engine is stopped. However, if supplemental heating is needed, the TED 112 can receive electrical energy (electric current) to transfer thermal energy to the airflow as indicated by operation line 3124*b*. As stored cooling capacity of the TSD 123*b* and stored heating capacity of the TSD 123*a* is expended, the TED 112 can be engaged to provide either the needed level of cooling or heating. In some embodiments, the TED 112 can receive electrical energy (electric current) to transfer thermal energy to the airflow as discussed herein and in particular, in reference to FIG. 21. In some embodiments, the TED 112 can receive electrical energy (electric current) in an opposite polarity to absorb thermal energy from the airflow as discussed herein, and in particular in, reference to FIG. 24. Whether the TED 112 cools or heats the air can be determined by a controller of the temperature control system depending on what the system needs at the specific operating point to achieve demisting as well as the location of the TED 112 in the air channel during demisting mode of FIG. 30C. For example, either the cooling TSD 123*b* or heating TSD 123*a* may have more stored thermal capacity during state 3112 and the TED 112 can be powered to compensate for the any lack of or more fully expended stored thermal capacity. Powering the TED 112 can occur any time in state 3112 as illustrated by a step up in operation line 3124*a* mid-state 3112.

When the engine has cooled and is now cold, cold engine (or stop cold) state 3114, the temperature control system can continue for some time operation as discussed herein during state 3112, with the TSDs 123*a,b* expending their remaining thermal capacities. In some embodiments, two TEDs may be provided at different locations within the air channels as discussed herein to provide demisting when the TSDs have expended their stored thermal capacities. For example, a first TED may cool (dry) the airflow as the airflow enters the air channel. A second TED may heat the airflow as the airflow passes through the air channel to achieve demisting. In mode 3116, the cold engine is again started. The temperature control system can similarly operate as discussed herein for when a cold engine is started and demisting is desired, and in particular, in reference to FIG. 30C.

Reference throughout this specification to "some embodiments," "certain embodiments," or "an embodiment" means that a particular feature, structure or characteristic described in connection with the embodiment is included in at least some embodiments. Thus, appearances of the phrases "in some embodiments" or "in an embodiment" in various places throughout this specification are not necessarily all referring to the same embodiment and may refer to one or more of the same or different embodiments. Furthermore, the particular features, structures or characteristics may be combined in any suitable manner, as would be apparent to one of ordinary skill in the art from this disclosure, in one or more embodiments.

For purposes of illustration, some embodiments have been described in the context of providing comfort air the passenger compartment of a vehicle, an aircraft, a train, a bus, a truck, a hybrid vehicle, an electric vehicle, a ship, or any other carrier of persons or things. It is understood that the embodiments disclosed herein are not limited to the particular context or setting in which they have been described and that at least some embodiments can be used to provide comfort air to homes, offices, industrial spaces, and other buildings or spaces. It is also understood that at least some embodiments can be used in other contexts where temperature-controlled fluids can be used advantageously, such as in managing the temperature of equipment.

As used in this application, the terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Similarly, it should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Rather, inventive aspects lie in a combination of fewer than all features of any single foregoing disclosed embodiment.

Although the invention presented herein has been disclosed in the context of certain preferred embodiments and examples, it will be understood by those skilled in the art that the invention extends beyond the specifically disclosed embodiments to other alternative embodiments and/or uses of the invention and obvious modifications and equivalents thereof. Thus, it is intended that the scope of the invention herein disclosed should not be limited by the particular embodiments described above.

What is claimed is:

1. A temperature control system for heating, cooling, and/or demisting an occupant compartment of a vehicle during a stop of an internal combustion engine of the vehicle, the system comprising:
    an engine coolant circuit comprising an engine block coolant conduit and configured to convey a coolant in the engine coolant circuit, wherein the engine block coolant conduit is in thermal communication with the internal combustion engine of the vehicle;
    a heater core disposed in a comfort air channel of the vehicle and in fluid communication with the engine block coolant conduit;
    a thermoelectric device having a waste surface and a main surface;
    a supplemental heat exchanger disposed in the comfort air channel and in thermal communication with the main surface of the thermoelectric device;
    a waste heat exchanger connected to the waste surface of the thermoelectric device, wherein the waste heat exchanger is connected to a fluid circuit containing the coolant, and wherein the coolant is in fluid communication with a thermal energy source or a heat sink; and
    a controller configured to operate the temperature control system in a plurality of modes of operation, and wherein the plurality of modes of operation comprises:
        a stop heating mode wherein residual heat of the internal combustion engine is configured to heat a comfort airflow in the comfort air channel while electric current is not supplied to the thermoelectric device and while the internal combustion engine is stopped; and
        a stop cold heating mode wherein the thermoelectric device is configured to heat the comfort airflow by transferring thermal energy from the waste surface to the main surface while receiving electric current supplied in a first polarity and while the internal combustion engine is stopped,
    wherein the fluid circuit includes a first conduit configured to convey the coolant in the first conduit and a first bypass conduit configured to convey the coolant in the first bypass conduit, the first conduit in fluid communication with the waste heat exchanger, the first bypass conduit configured to bypass flow of the coolant around the first conduit, wherein the first conduit and the first bypass conduit include a common inlet connection and a common outlet connection, wherein the first conduit and the first bypass conduit are connected in parallel between said common inlet connection and said common outlet connection,
    wherein, in the stop heating mode, the controller is configured to operate at least one fluid control device to restrict flow of the coolant through the first conduit and to operate the at least one fluid control device to direct flow of the coolant through the first bypass conduit,
    wherein, in the stop cold heating mode, the controller is configured to operate the at least one fluid control device to direct flow of the coolant through the first conduit and to operate the at least one fluid control device to restrict flow of the coolant through the first bypass conduit,
    wherein, in the stop cold heating mode, the first conduit is in fluid communication with the waste heat exchanger, and
    wherein, in the stop cold heating mode, the thermoelectric device provides heat to the comfort airflow while the internal combustion engine is not able to heat the comfort airflow to a specified comfortable temperature without the heat provided by the thermoelectric device.

2. The system of claim 1, wherein the temperature control system, in the stop cold heating mode, is configured to allow for a longer stop time of the internal combustion engine than stopping the internal combustion engine in the stop heating mode while heating the occupant compartment of the vehicle to a certain cabin temperature.

3. The system of claim 1, wherein the stop cold heating mode includes the internal combustion engine configured to heat the comfort airflow while the thermoelectric device receives electric current supplied in the first polarity.

4. The system of claim 1, wherein the plurality of modes of operation further comprises a cooling mode wherein the thermoelectric device is configured to cool the comfort airflow by transferring thermal energy from the main surface to the waste surface while receiving electric current supplied in a second polarity.

5. The system of claim 1, further comprising a thermal storage device disposed in the comfort air channel, the thermal storage device configured to store thermal energy and at least one of transfer thermal energy to the comfort airflow or absorb thermal energy from the comfort airflow.

6. The system of claim 5, further comprising an evaporator core of a belt driven refrigeration system disposed in the comfort air channel, wherein the thermal storage device is connected to the evaporator core, and wherein the thermal storage device is configured to store cooling capacity during at least one of a cooling mode or a demisting mode while the internal combustion engine is in operation.

7. The system of claim 5, wherein the plurality of modes of operation further comprises a first stop demisting mode wherein the thermal storage device is configured to cool the comfort airflow by absorbing thermal energy from the comfort airflow using stored cooling capacity and the thermoelectric device is configured to heat the comfort airflow by transferring thermal energy from the waste surface to the main surface while receiving electric current supplied in the first polarity.

8. The system of claim 1, wherein the supplemental heat exchanger is downstream from the heater core with respect to a direction of the comfort airflow in the comfort air channel when the temperature control system is in operation.

9. The system of claim 1, wherein the waste surface of the thermoelectric device is in thermal communication with the engine block coolant conduit.

10. The system of claim 1, wherein the thermal energy source is at least one of a battery, an electronic device, a burner, or an exhaust of the vehicle.

11. The system of claim 1, wherein the fluid circuit includes a second conduit configured to convey the coolant in the second conduit and a second bypass conduit configured to convey the coolant in the second bypass conduit, the second bypass conduit configured to bypass flow of the coolant around the second conduit, and wherein the stop heating mode includes directing flow of the coolant through the second conduit and restricting flow of the coolant through the second bypass conduit.

12. The system of claim 11, wherein the second conduit is in fluid communication with the heater core, and wherein the stop cold heating mode includes restricting flow of the coolant through the second conduit and directing flow of the coolant through the second bypass conduit.

13. The system of claim 1, wherein the plurality of modes of operation further comprises a stop demisting mode wherein the thermoelectric device is configured to cool the comfort airflow by transferring thermal energy from the main surface to the waste surface while receiving electric current supplied in a second polarity and the internal combustion engine is configured to heat the comfort airflow while the internal combustion engine is able to heat the comfort airflow to a specified comfortable temperature, wherein the supplemental heat exchanger is upstream from the heater core with respect to a direction of the comfort airflow in the comfort air channel when the temperature control system is in operation.

14. The system of claim 1, wherein at least a portion of the thermoelectric device is disposed in the comfort air channel.

15. The system of claim 1, wherein, in the stop cold heating mode, the first conduit is in fluid communication with the engine block coolant conduit and the waste heat exchanger.

16. The system of claim 1, wherein the at least one fluid control device comprises a first fluid control device and a second fluid control device, wherein, in the stop heating mode, the controller is configured to operate the first fluid control device to restrict flow of the coolant through the first conduit and to operate the second fluid control device to direct flow of the coolant through the first bypass conduit, and wherein, in the stop cold heating mode, the controller is configured to operate the first fluid control device to direct flow of the coolant through the first conduit and to operate the second fluid control device to restrict flow of the coolant through the first bypass conduit.

17. The system of claim 16, wherein, in the stop cold heating mode, the engine block coolant conduit is in thermal communication with the waste heat exchanger.

18. The system of claim 1, wherein, in the stop cold heating mode, the engine block coolant conduit is in thermal communication with the heater core and the waste heat exchanger.

19. The system of claim 1, wherein at least a portion of the first conduit separate from the first bypass conduit directly contacts the waste heat exchanger.

20. The system of claim 1, wherein the first conduit directs flow of the coolant from the waste heat exchanger to the internal combustion engine of the vehicle.

21. A temperature control system for heating, cooling, and/or demisting an occupant compartment of a vehicle during a stop of an engine of the vehicle, the system comprising:

an engine coolant circuit in thermal communication with the engine of the vehicle; wherein the engine coolant circuit is configured to convey a coolant, a first heat exchanger disposed in a comfort air channel of the vehicle and in fluid communication with the engine coolant circuit;

a thermoelectric device having a waste surface and a main surface, wherein the waste surface is in thermal communication with a thermal energy source or a heat sink;

a second heat exchanger disposed in the comfort air channel and in thermal communication with the main surface of the thermoelectric device, wherein the second heat exchanger is downstream from the first heat exchanger with respect to a direction of a comfort airflow in the comfort air channel when the temperature control system is in operation;

a first conduit configured to convey the coolant in the first conduit, the first conduit in fluid communication with the waste surface of the thermoelectric device via a waste heat exchanger connected to the waste surface of the thermoelectric device;

a first bypass conduit configured to convey the coolant in the first bypass conduit, the first bypass conduit configured to bypass flow of the coolant around the first conduit, wherein the first conduit and the first bypass conduit include a common inlet connection and a common outlet connection, wherein the first conduit and the first bypass conduit are connected in parallel between said common inlet connection and said common outlet connection, at least one flow control device configured to restrict coolant flow through the first bypass conduit; and a controller configured to operate the temperature control system in a plurality of modes of operation to heat, cool, and/or demist the occupant compartment of the vehicle, wherein the plurality of modes of operation comprises a stop heating mode wherein residual heat of the engine is configured to heat the comfort airflow in the comfort air channel while electric current is not supplied to the thermoelectric device and while the engine is stopped, and wherein the first conduit directly connects to the waste heat exchanger.

22. The system of claim 21, wherein the plurality of modes further comprises a stop cold heating mode wherein the thermoelectric device is configured to heat the comfort airflow by transferring thermal energy from the waste surface to the main surface while receiving electric current and while the engine is stopped, and wherein, in the stop cold heating mode, the thermoelectric device provides heat to the comfort airflow while the engine is not able to heat the comfort airflow to a specified comfortable temperature without the heat provided by the thermoelectric device.

23. The system of claim 22, wherein, in the stop cold heating mode, the controller is configured to operate the at least one flow control device to direct flow of the coolant through the first conduit that is in thermal communication with the waste surface of the thermoelectric device and to operate the at least one flow control device to restrict flow of the coolant through the first bypass conduit.

24. The system of claim 21, wherein the plurality of modes of operation further comprises a cooling mode wherein the thermoelectric device is configured to cool the comfort airflow by transferring thermal energy from the main surface to the waste surface while receiving electric current.

25. The system of claim 21, wherein at least a portion of the thermoelectric device is disposed in the comfort air channel.

26. The system of claim 21, wherein the thermal energy source is at least one of a battery, an electronic device, a burner, or an exhaust of the vehicle.

27. The system of claim 21, wherein the waste heat exchanger is connected to a fluid circuit containing the coolant, and wherein the coolant is in fluid communication with the thermal energy source or the heat sink.

28. The system of claim 21, wherein the plurality of modes further comprise a stop cooled heating mode, wherein, in the stop cooled heating mode:
residual heat of the internal combustion engine is configured to heat the comfort airflow in the comfort air channel while the engine is stopped, and
the thermoelectric ice is configured to heat the comfort airflow by transferring thermal energy from the waste surface to the main surface while receiving electric current and while the engine is stopped.

\* \* \* \* \*